(12) United States Patent
Tsuchimura et al.

(10) Patent No.: US 8,741,542 B2
(45) Date of Patent: Jun. 3, 2014

(54) ACTINIC RAY-SENSITIVE OR RADIATION-SENSITIVE RESIN COMPOSITION, FILM FORMED USING THE COMPOSITION AND PATTERN FORMING METHOD USING THE SAME

(75) Inventors: Tomotaka Tsuchimura, Shizuoka (JP); Takayuki Ito, Shizuoka (JP); Toru Fujimori, Shizuoka (JP); Kana Fujii, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/512,633

(22) PCT Filed: Nov. 30, 2010

(86) PCT No.: PCT/JP2010/071782
§ 371 (c)(1),
(2), (4) Date: May 30, 2012

(87) PCT Pub. No.: WO2011/065594
PCT Pub. Date: Jun. 3, 2011

(65) Prior Publication Data
US 2012/0244472 A1    Sep. 27, 2012

(30) Foreign Application Priority Data

Nov. 30, 2009    (JP) ................................. 2009-272353

(51) Int. Cl.
*G03F 7/027*    (2006.01)
*G03F 7/039*    (2006.01)
*G03F 7/30*    (2006.01)

(52) U.S. Cl.
USPC ..................... 430/270.1; 430/326; 430/281.1; 430/170

(58) Field of Classification Search
None
See application file for complete search history.

(56) References Cited

U.S. PATENT DOCUMENTS

| | | | |
|---|---|---|---|
| 5,695,910 A | 12/1997 | Urano et al. | |
| 5,731,125 A * | 3/1998 | Yamachika et al. | ....... 430/270.1 |
| 5,780,206 A | 7/1998 | Urano et al. | |
| 5,976,770 A | 11/1999 | Sinta et al. | |
| 6,627,391 B1 | 9/2003 | Ito et al. | |
| 6,706,461 B1 | 3/2004 | Sinta et al. | |
| 6,887,648 B2 | 5/2005 | Pavelchek et al. | |
| 2001/0038971 A1 | 11/2001 | Ohsawa et al. | |
| 2003/0013049 A1 * | 1/2003 | Cameron et al. | .............. 430/326 |
| 2003/0129531 A1 | 7/2003 | Oberlander et al. | |
| 2003/0194634 A1 | 10/2003 | Nagai et al. | |
| 2004/0191670 A1 | 9/2004 | Ando et al. | |
| 2006/0078821 A1 | 4/2006 | Shimizu et al. | |
| 2006/0290429 A1 | 12/2006 | Kishioka et al. | |
| 2008/0206680 A1 | 8/2008 | Kishioka et al. | |
| 2012/0301831 A1 * | 11/2012 | Fujii et al. | .................. 430/286.1 |

FOREIGN PATENT DOCUMENTS

| | | |
|---|---|---|
| EP | 0 780 732 A2 | 6/1997 |
| EP | 0 875 787 A1 | 11/1998 |
| JP | 06-083058 A | 3/1994 |
| JP | 07-084364 A | 3/1995 |
| JP | 07-319155 A | 12/1995 |
| JP | 10-120628 A | 5/1998 |
| JP | 10-121029 A | 5/1998 |
| JP | 11-265061 A | 9/1999 |
| JP | 2000-35664 A | 2/2000 |
| JP | 2003-327560 A | 11/2003 |
| JP | 2004-310121 A | 11/2004 |
| JP | 2004-334165 A | 11/2004 |
| JP | 2005-517972 A | 6/2005 |
| JP | 2006-145853 A | 6/2006 |
| JP | 2006-343704 A | 12/2006 |
| JP | 2007-114359 A | 5/2007 |
| TW | 200413856 A | 8/2004 |

OTHER PUBLICATIONS

International Search Report (PCT/ISA/210) issued Nov. 1, 2011, in corresponding PCT Application No. PCT/JP2010-071782.
Written Opinion (PCT/ISA/237) issued Nov. 1, 2011, in corresponding PCT Application No. PCT/JP2010-071782.
Office Action, dated Dec. 20, 2013, issued by the Korean Intellectual Property Office, in counterpart Korean Application No. 10-2012-7013828.
Extended European Search Report, dated Feb. 5, 2014, issued by the European Patent Office, in counterpart European Application No. 10833435.
Office Action dated Dec. 23, 2013 issued by the Taiwan Intellectual Property Office in counterpart Taiwanese Patent Application No. 099141254.

* cited by examiner

*Primary Examiner* — Cynthia Hamilton
(74) *Attorney, Agent, or Firm* — Sughrue Mion, PLLC

(57) ABSTRACT

Provided is an actinic ray-sensitive or radiation-sensitive resin composition comprising (A) a specific compound represented by a general formula, (B) a resin which is alkali-insoluble or sparingly alkali-soluble and becomes easily alkali-soluble in the presence of an acid, and (C) a compound capable of generating an acid upon irradiation with an actinic ray or radiation; a film formed using the composition; and a pattern forming method using the same.

11 Claims, No Drawings

ACTINIC RAY-SENSITIVE OR RADIATION-SENSITIVE RESIN COMPOSITION, FILM FORMED USING THE COMPOSITION AND PATTERN FORMING METHOD USING THE SAME

TECHNICAL FIELD

The present invention relates to an actinic ray-sensitive or radiation-sensitive resin composition and a pattern forming method using the composition. More specifically, the present invention relates to an actinic ray-sensitive or radiation-sensitive resin composition suitably usable, for example, in the production of a semiconductor integrated circuit device, a mask for integrated circuit production, a printed wiring board and a liquid crystal panel or in the process of preparing an imprint mold structure, and a pattern forming method using the composition.

BACKGROUND ART

A chemical amplification resist composition is a pattern forming material of forming a pattern on a substrate by producing an acid in the exposed area upon irradiation with radiation such as far ultraviolet light and through a reaction using the acid as a catalyst, changing the developer solubility of the area irradiated with an actinic ray or radiation and that of the non-irradiated area.

In JP-A-2003-327560, JP-A-2004-310121, JP-A-2006-343704, JP-A-10-120628 (the term "JP-A" as used herein means an "unexamined published Japanese patent application"), studies are made to apply a compound having an anthracene structure to the resist so as to improve the performance of the chemical amplification resist composition. The application of a compound having an anthracene structure is studied from the aspect of: reducing the change in the line width of a pattern in JP-A-2003-327560; enabling use of a substrate with high reflectance and enhancing the storage stability (good sensitivity even after aging) in JP-A-2004-310121; suppressing the change in the line width of a resist pattern due to thickness variation of a resist film on a highly reflective substrate and enhancing the latitude in the depth of focus in JP-A-2006-343704; and enabling suppression of standing wave and halation in using a highly reflective substrate in JP-A-10-120628.

In JP-A-2004-334165, it is disclosed to add a compound having specific light absorption so as to suppress standing wave when a highly reflective substrate is applied.

However, conventional chemical amplification resist compositions cannot succeed in improving the line edge roughness and development defect while at the same time, improving the sensitivity, dissolution contrast (γ) and pattern profile and reducing the standing wave.

SUMMARY OF INVENTION

An object of the present invention is to provide an actinic ray-sensitive or radiation sensitive composition which is useful as a chemical amplification resist sensitive to an actinic ray or radiation, for example, a far ultraviolet ray such as KrF excimer laser and ArF excimer laser, an electron beam or a high energy ray such as X-ray and is excellent in the sensitivity, dissolution contrast (γ) and pattern profile while at the same time, can reduce the line edge roughness and development defect and suppress the standing wave; a film formed using the composition; and a pattern forming method using the same.

The present inventors have made intensive investigations, as a result, the object of the invention can be achieved by the following configurations.

(1) An actinic ray-sensitive or radiation-sensitive resin composition comprising:

(A) a compound represented by the following formula (I), (B) a resin which is alkali-insoluble or sparingly alkali-soluble and becomes easily alkali-soluble in the presence of an acid, and (C) a compound capable of generating an acid upon irradiation with an actinic ray or radiation:

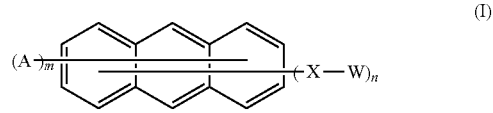

(I)

wherein A represents a monovalent substituent,

X represents a single bond or a divalent linking group,

W represents a lactone ring-containing group or a group represented by any one of formulae (V1) to (V4), m represents an integer of 0 or more, n represents an integer of 1 or more, and when a plurality of A's, X's or W's are present, each A, X or W may be the same as or different from every other A, X or W, provided that a plurality of compounds represented by formula (I) may be combined through at least any one of a single bond, A and W:

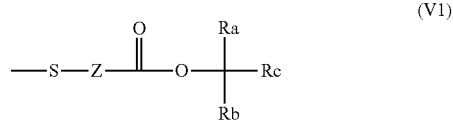

(V1)

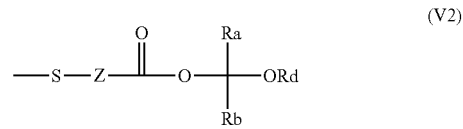

(V2)

(V3)

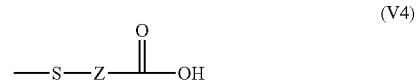

(V4)

wherein Z represents a single bond or a divalent linking group, each of Ra, Rb and Rc independently represents a hydrogen atom, an alkyl group, a cycloalkyl group or an alkenyl group, Rd represents an alkyl group, a cycloalkyl group or an alkenyl group, and two groups out of Ra, Rb and Rc or two groups out of Ra, Rb and Rd may combine to form a ring structure comprising a carbon atom or may form a ring structure comprising a carbon atom and further containing a heteroatom.

(2) The actinic ray-sensitive or radiation-sensitive resin composition according to the above (1), wherein the acid generated from the compound as the component (C) is a sulfonic acid.

(3) The actinic ray-sensitive or radiation-sensitive resin composition according to the above (1) or (2), wherein the compound as the component (C) is a diazodisulfone compound or a sulfonium salt.

(4) The actinic ray-sensitive or radiation-sensitive resin composition according to any one of the above (1) to (3), wherein the resin as the component (B) contains a repeating unit represented by the following formula (IA):

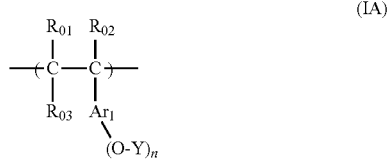

wherein each of $R_{01}$ and $R_{02}$ independently represents a hydrogen atom, an alkyl group, a cycloalkyl group, a halogen atom, a cyano group or an alkoxycarbonyl group, $R_{03}$ represents a hydrogen atom, an alkyl group, a cycloalkyl group, a halogen atom, a cyano group or an alkoxycarbonyl group or combines with $At_1$ to form a ring structure, $Ar_1$ represents an aromatic ring group, each of n Ys independently represents a group capable of leaving by the action of an acid, provided that at least one Y represents a group capable of leaving by the action of an acid, and n represents an integer of 1 to 4.

(5) The actinic ray-sensitive or radiation-sensitive resin composition according to any one of the above (1) to (3), wherein the resin as the component (B) contains a repeating unit represented by formula (IB):

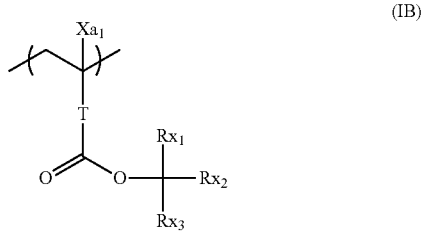

wherein $Xa_1$ represents a hydrogen atom, a methyl group, a trifluoromethyl group or a hydroxymethyl group, T represents a single bond or a divalent linking group, each of $Rx_1$ to $Rx_3$ independently represents a linear or branched alkyl group or a monocyclic or polycyclic cycloalkyl group, and at least two members of $Rx_1$ to $Rx_3$ may combine each other to form a monocyclic or polycyclic cycloalkyl group.

(6) The actinic ray-sensitive or radiation-sensitive resin composition according to the above (4) or (5), wherein the resin as the component (B) further contains a repeating unit represented by the following formula (IIIA):

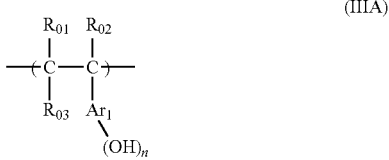

wherein each of $R_{01}$ and $R_{02}$ independently represents a hydrogen atom, an alkyl group, a cycloalkyl group, a halogen atom, a cyano group or an alkoxycarbonyl group, $R_{03}$ represents a hydrogen atom, an alkyl group, a cycloalkyl group, a halogen atom, a cyano group or an alkoxycarbonyl group or combines with $Ar_1$ to form a ring structure, $Ar_1$ represents an aromatic ring group, and n represents an integer of 1 to 4.

(7) The actinic ray-sensitive or radiation-sensitive resin composition according to the above (6), wherein the resin as the component (B) contains a hydroxystyrene-derived repeating unit as the repeating unit represented by formula (IIIA).

(8) A film formed using the actinic ray-sensitive or radiation-sensitive resin composition according to any one of the above (1) to (7).

(9) A pattern forming method comprising:

forming a film by using the actinic ray-sensitive or radiation-sensitive resin composition according to any one of claims 1 to 7, and exposing and developing said film.

According to the present invention, there can be provided an actinic ray-sensitive or radiation sensitive composition having high sensitivity, high dissolution contrast, good pattern profile and good line edge roughness performance and at the same time, being capable of reducing the standing wave and free from generation of a development defect; a film formed using the composition; and a pattern forming method using the same.

The actinic ray-sensitive or radiation sensitive composition of the present invention is suitable as a positive resist composition.

DESCRIPTION OF EMBODIMENTS

The present invention is described in detail below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

[1] (A) Compound Represented by Formula (I)

The actinic ray-sensitive or radiation-sensitive resin composition of the present invention contains a compound represented by the following formula (I) (hereinafter sometimes referred to as a "compound (A)".

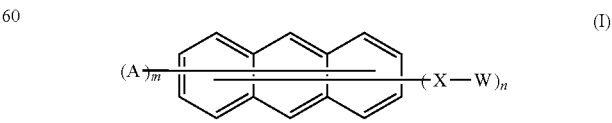

In formula (I), A represents a monovalent substituent.

X represents a single bond or a divalent linking group.

W represents a lactone ring-containing group or a group represented by any one of formulae (V1) to (V4).

m represents an integer of 0 or more.

n represents an integer of 1 or more.

When a plurality of A's, X's or W's are present, each A, X or W may be the same as or different from every other A, X or W, Incidentally, a plurality of compounds represented by formula (I) may be combined through at least any one of a single bond, A and W, that is, a plurality of compounds represented by formula (I) may be combined in the form of sharing the group represented by A or W.

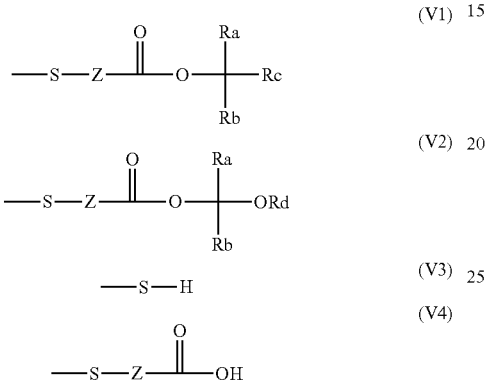

In formulae (V1) to (V4), Z represents a single bond or a divalent linking group, and the divalent linking group of Z has the same meaning as X in formula (I). Z is preferably a single bond or an alkylene group. Each of Ra, Rb and Rc independently represents a hydrogen atom, an alkyl group, a cycloalkyl group or an alkenyl group.

Rd represents an alkyl group, a cycloalkyl group or an alkenyl group.

Two groups out of Ra, Rb and Rc or two groups out of Ra, Rb and Rd may combine to form a ring structure comprising 3 to 8 carbon atoms or may form a ring structure comprising these carbon atoms and further containing a heteroatom.

In formula (I), A represents a monovalent substituent. Examples of the monovalent substituent of A include a halogen atom such as fluorine atom, chlorine atom, bromine atom and iodine atom; an alkoxy group such as methoxy group, ethoxy group and tert-butoxy group; an acyloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkylamino group such as methylamino group and cyclohexylamino group; a dialkylamino group such as dimethylamino group, diethylamino group, a morpholino group and piperidino group; an arylamino group such as phenylamino group and p-tolylamino group; an alkyl group such as methyl group, ethyl group, tert-butyl group and dodecyl group; a cycloalkyl group such as cyclopentyl group and cyclohexyl group; an aryl group such as phenyl group, p-tolyl group, xylyl group, cumenyl group, naphthyl group, anthryl group and phenanthryl group; an alkynyl group such as ethynyl group and propargyl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenacylphosphoniumyl group.

X is preferably a single bond, an alkylene group, an arylene group, a carbonyl group, a sulfide group, —O—, a sulfonyl group, —C(=O)O—, —CONH—, —SO$_2$NH—, —SS—, —COCO—, —OCOO—, —SO$_2$O—, or a divalent linking group formed by combining these groups, more preferably a single bond, an alkylene group, an arylene group, a carbonyl group, a sulfonyl group, —COO—, —CONH—, —SO$_2$NH—, a sulfide group or —O—.

Preferred examples of the combination include a combination of an alkylene group and a carbonyl group, a sulfonyl group, —COO—, —CONH—, —SO$_2$NH—, a sulfide group or —O—.

The number of atoms in the linking group as X is preferably from 1 to 10.

Specific examples of X are illustrated below, but the present invention is not limited thereto.

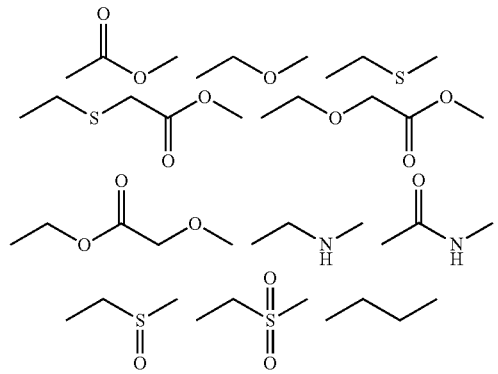

W represents a lactone ring-containing group or a group represented by any one of formulae (V1) to (V4).

When W is a lactone ring-containing group, the compound is hydrolyzed at the development to produce a carboxyl group (alkali-soluble group) and therefore, the compound contributes to reduction particularly in the development defect.

In the case of a group represented by formula (V1) where Ra, Rb and Rc each represents an alkyl group, a cycloalkyl group or an alkenyl group or in the case of a group represented by formula (V2), W is a group having an acid-decomposable group and since a deprotection reaction proceeds by the action of an acid generated from an acid generator upon exposure and an alkali-soluble group is produced, the compound contributes to reduction particularly in the development defect.

The group represented by formula (V3) or (V4) is a group having an acid group such as thiol group or carboxyl group and is an alkali-soluble group and therefore, the compound contributes to enhancement particularly of the performance of reducing the development defect.

The group represented by —X—W is preferably bonded to the benzene ring in the center of the anthracene ring.

m represents an integer of 0 or more and is preferably an integer of 0 to 3, more preferably 0.

n represents an integer of 1 or more and is preferably an integer of 1 to 3, more preferably 1.

The compound where W is a lactone ring-containing group is described below.

The lactone ring in the lactone ring-containing group as W is preferably a 4- to 8-membered ring, more preferably a 5- to 7-membered ring. The lactone ring may contain a double bond therein.

Examples of the substituent which the lactone ring may have include an alkyl group, an alkoxy group, an acyl group, an oxy group (>C=O), a hydroxyl group and those described for the substituent as A, and the substituent may be a group substituted with another substituent.

Specific examples of the lactone ring include, but are not limited to, structures of the following formulae (LC1-1) to (LC1-17).

LC1-1

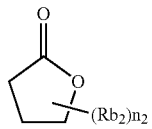

LC1-2

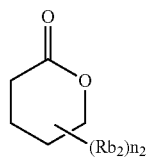

LC1-3

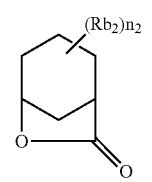

LC1-4

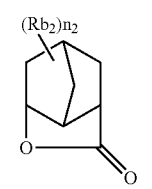

LC1-5

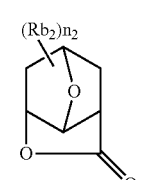

LC1-6

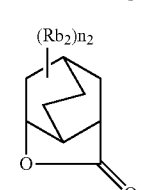

LC1-7

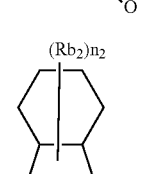

-continued

LC1-8

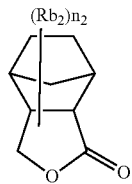

LC1-9

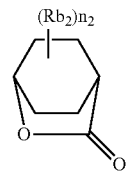

LC1-10

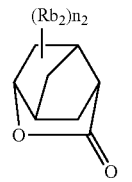

LC1-11

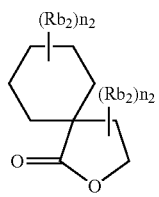

LC1-12

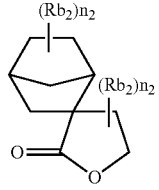

LC1-13

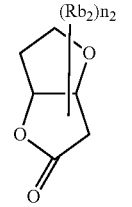

LC1-14

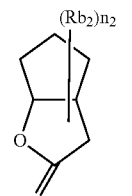

LC1-15

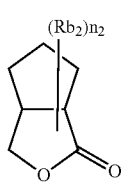

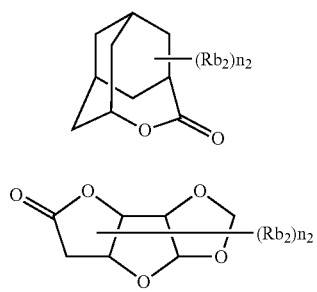

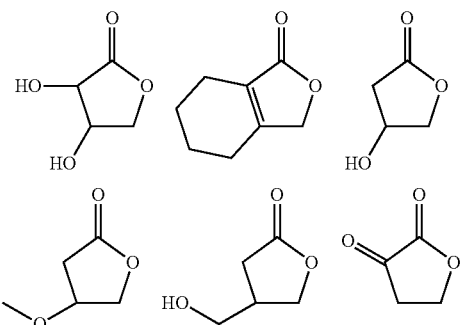

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group.

$n_2$ represents an integer of 0 to 4. When $n_2$ is an integer of 2 or more, each substituent ($Rb_2$) may be the same as or different from every other substituent ($Rb_2$) and also, the plurality of substituents ($Rb_2$) may combine with each other to form a ring.

More specific examples include the following lactone structures.

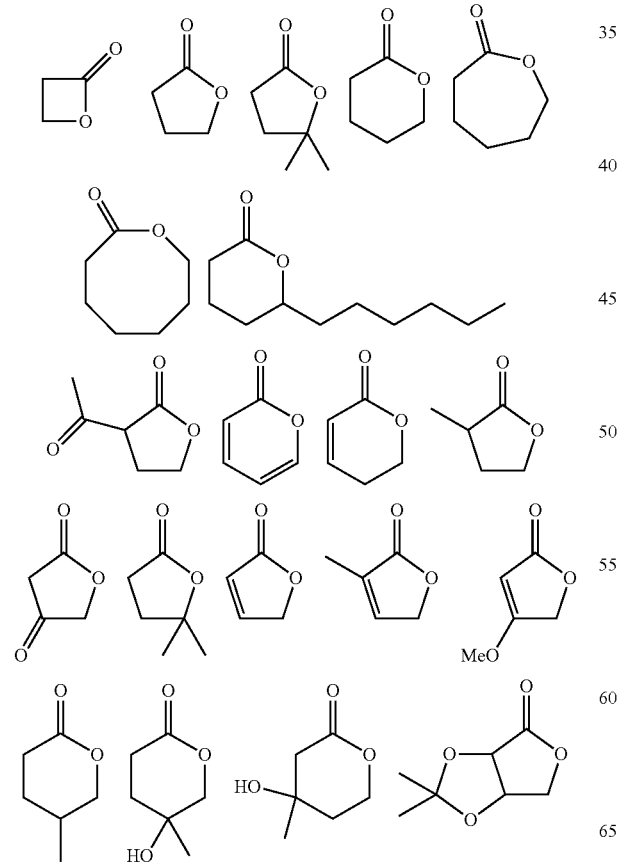

Examples of the compound represented by formula (I) where W is a lactone ring-containing a group include, but are not limited to, the following compounds.

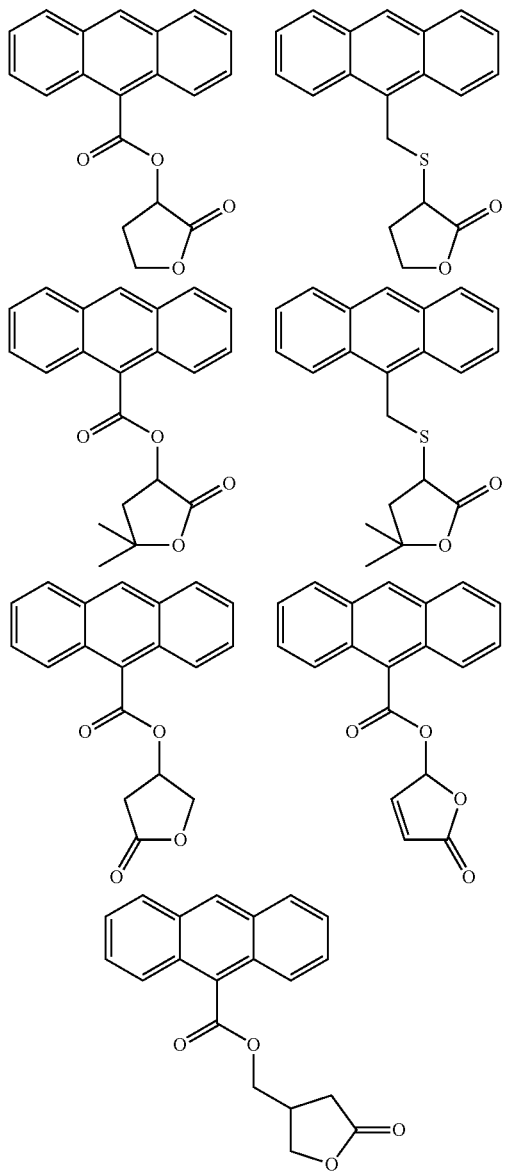

11
-continued
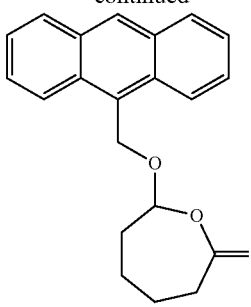
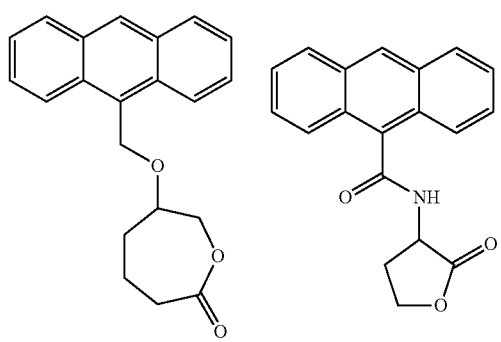
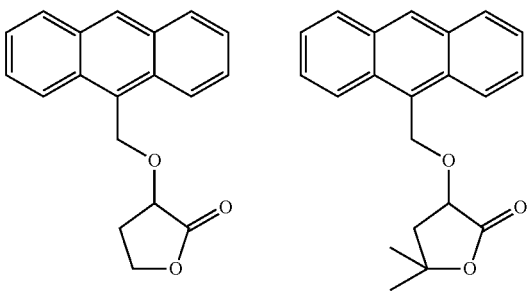
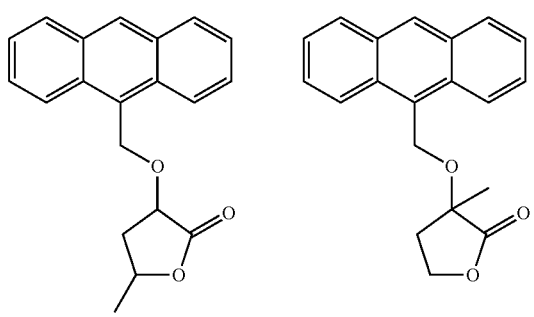
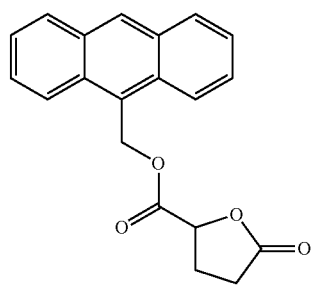
12
-continued
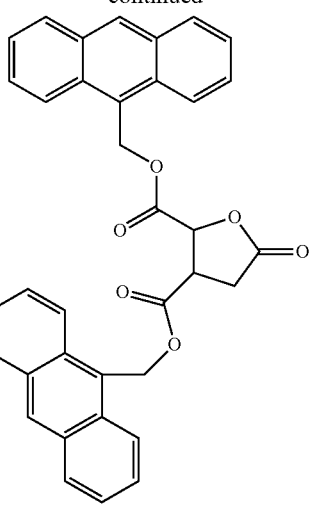
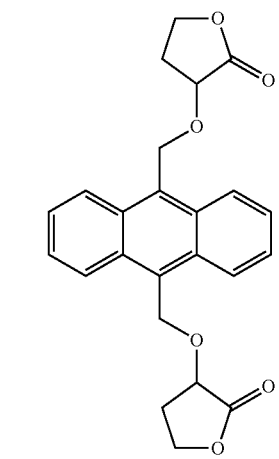
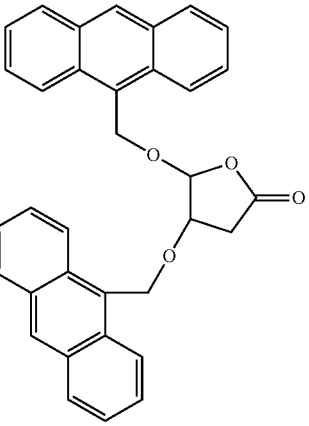
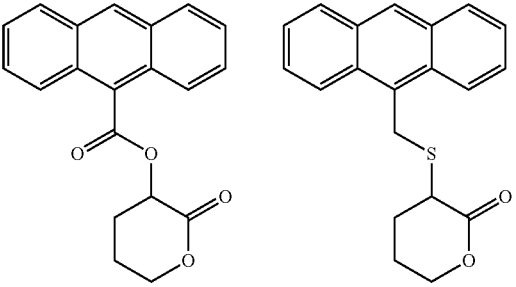

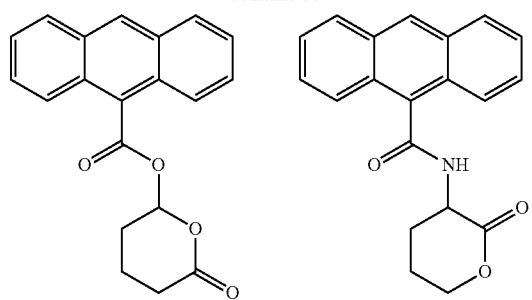
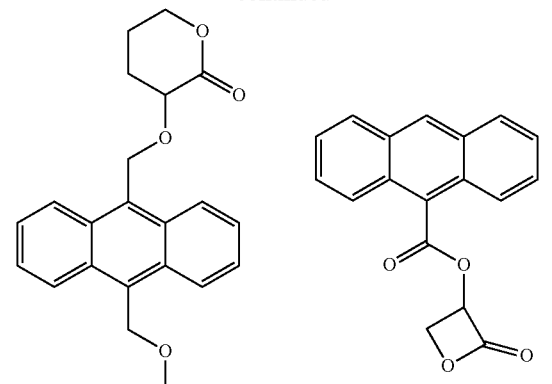
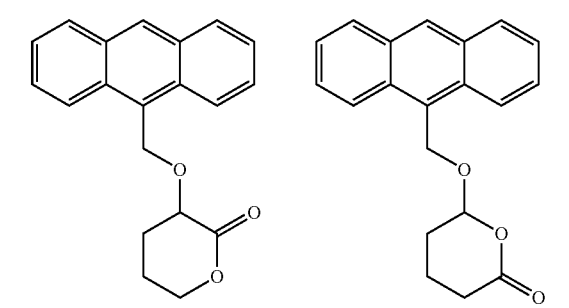
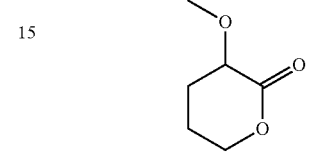
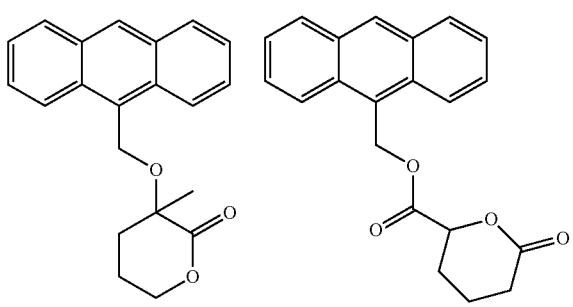
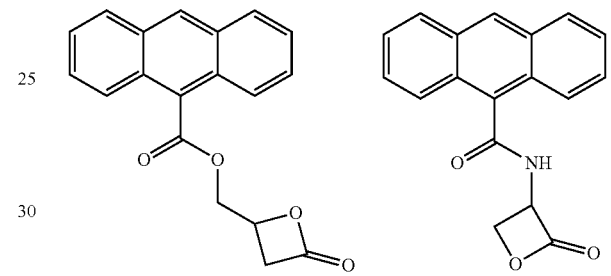
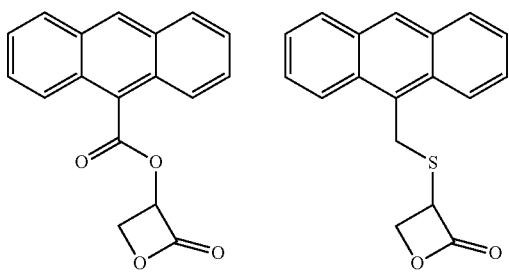
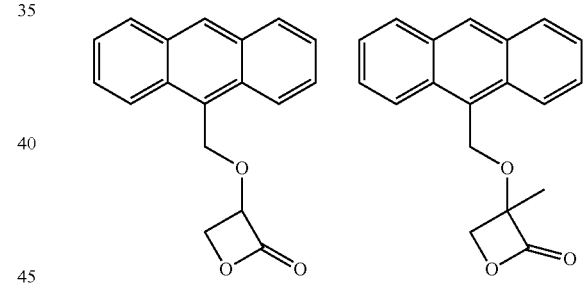
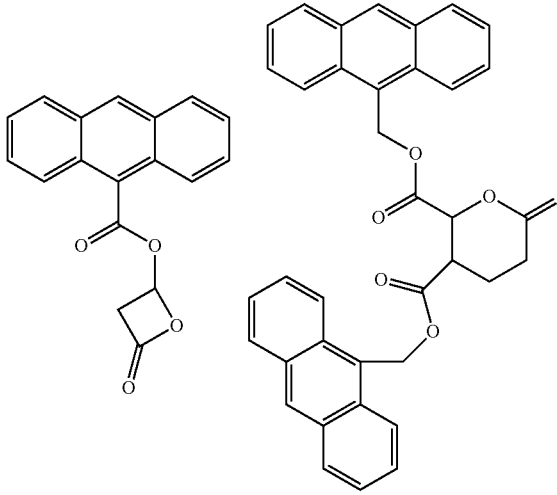
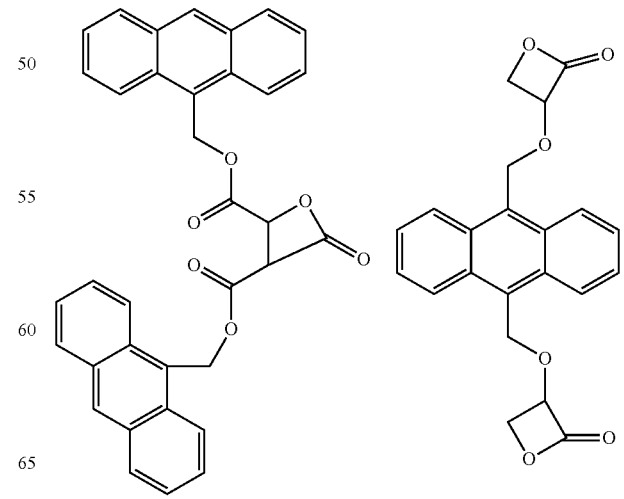

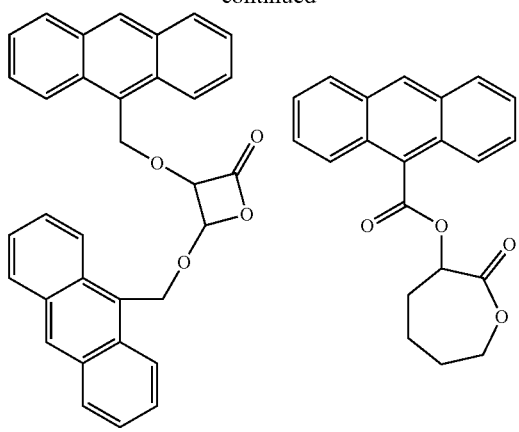
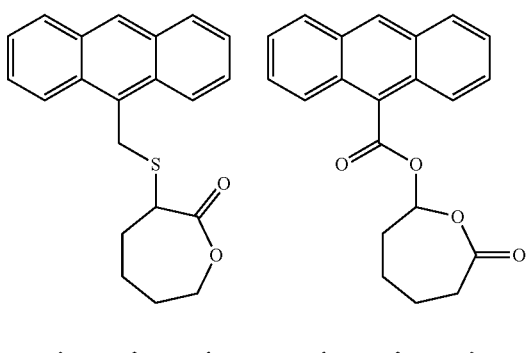
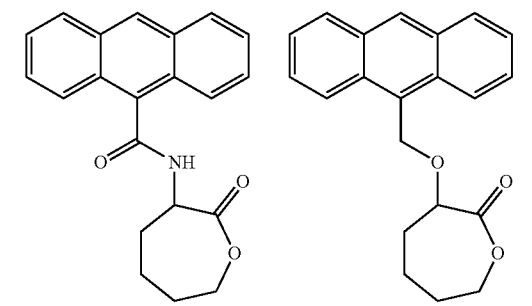
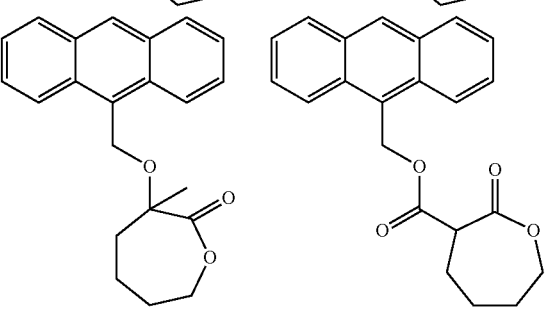
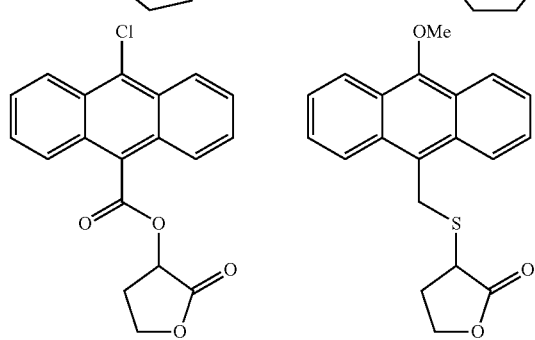
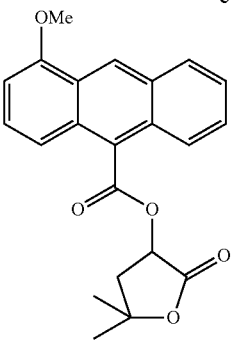
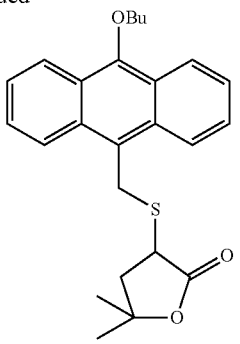
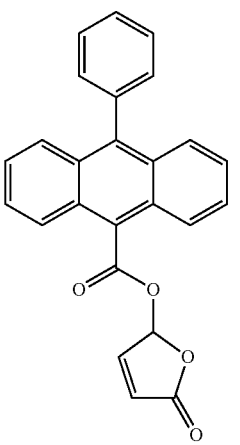
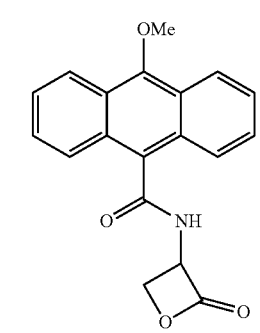
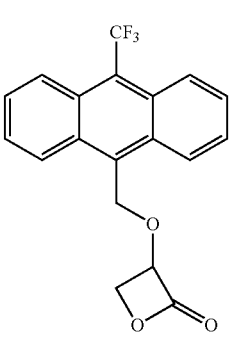
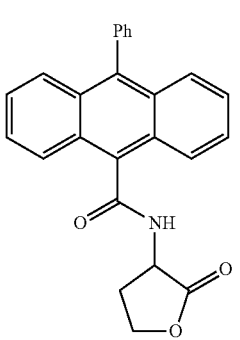

-continued
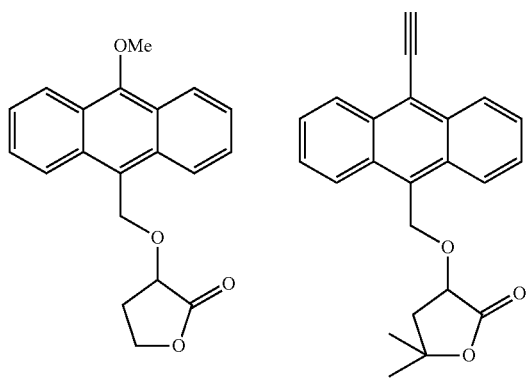
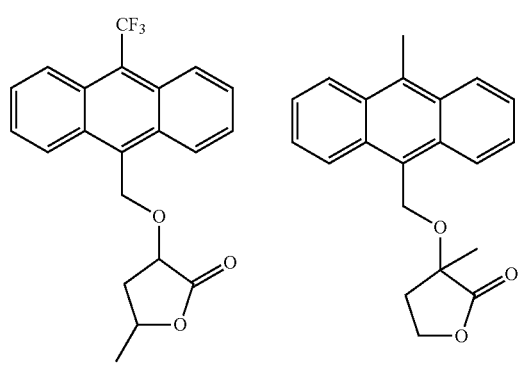
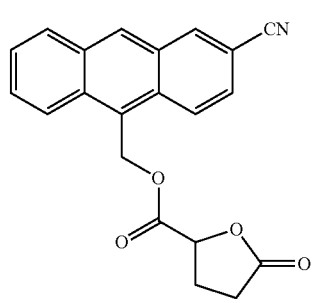
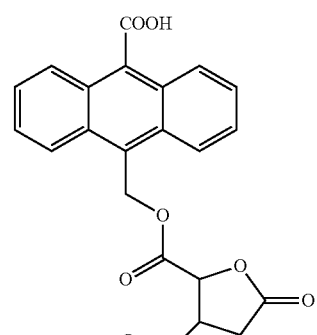
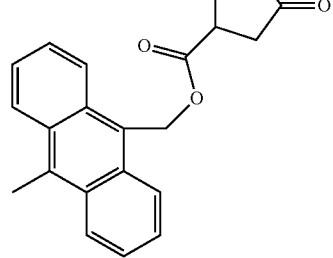
-continued
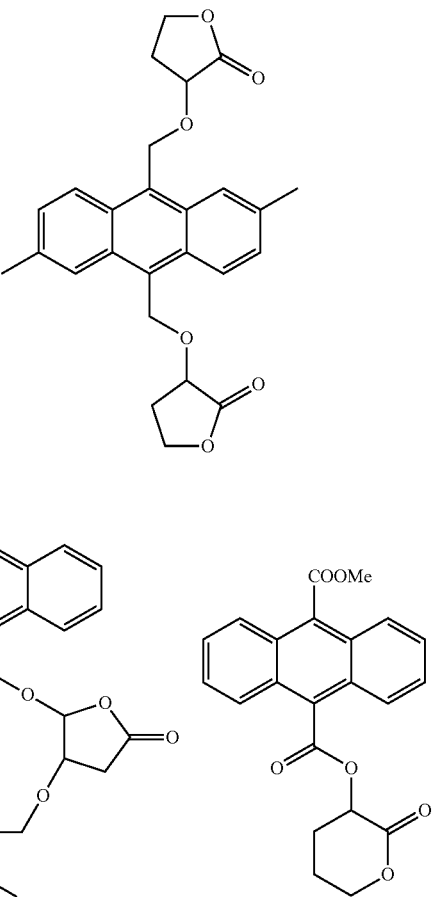
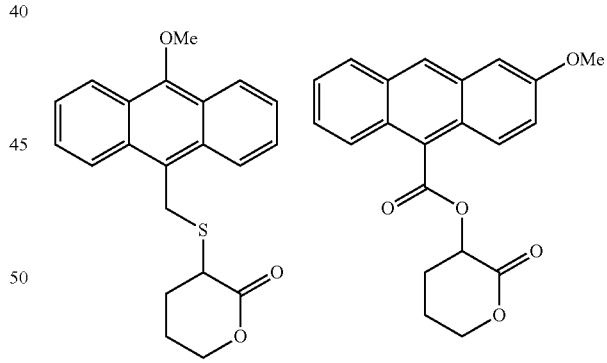
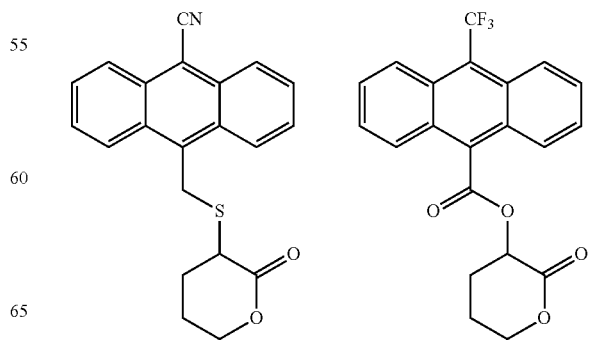

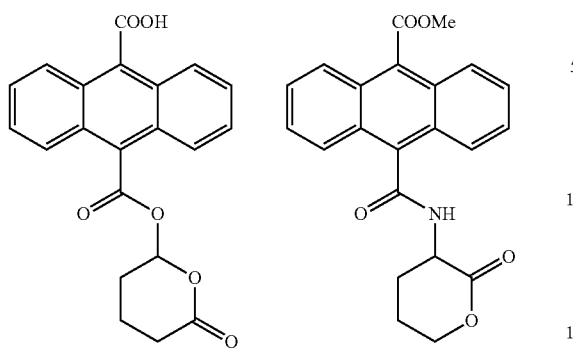
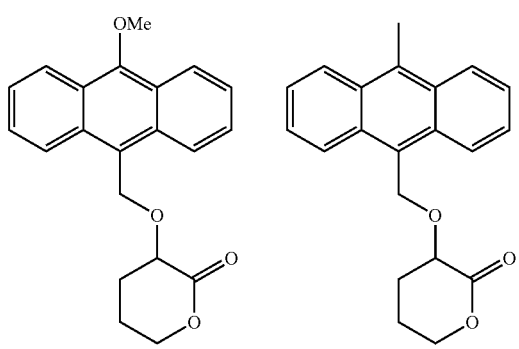
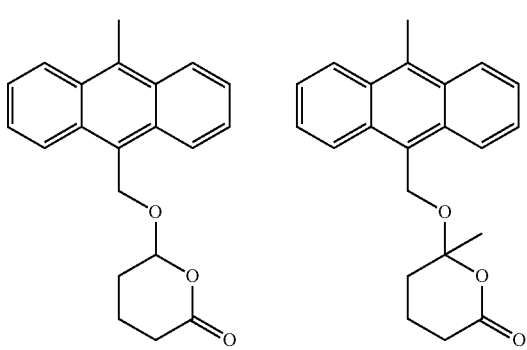
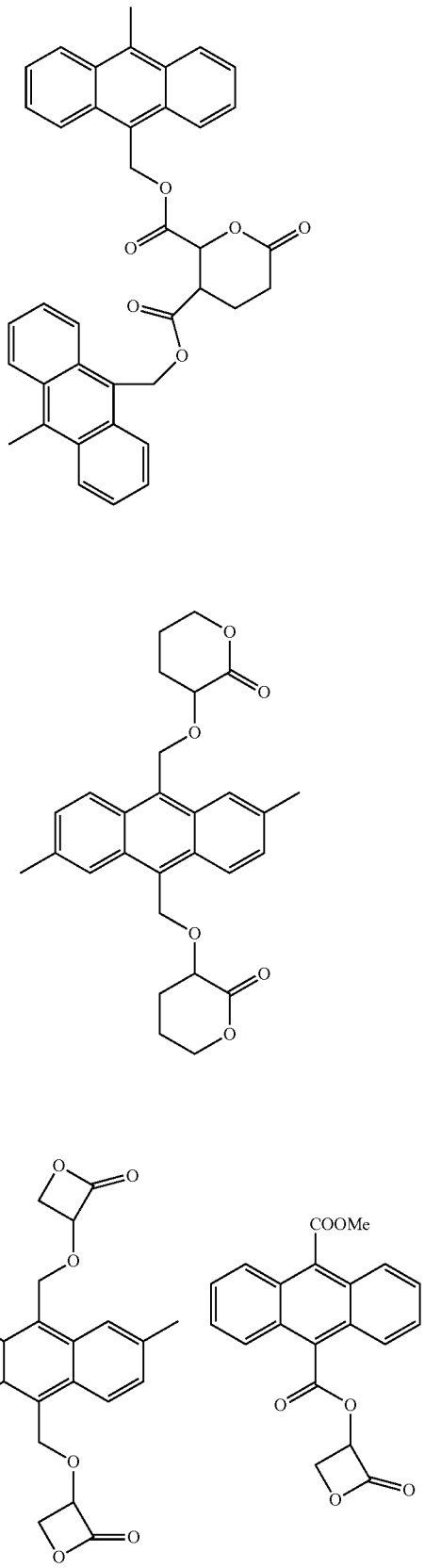

-continued
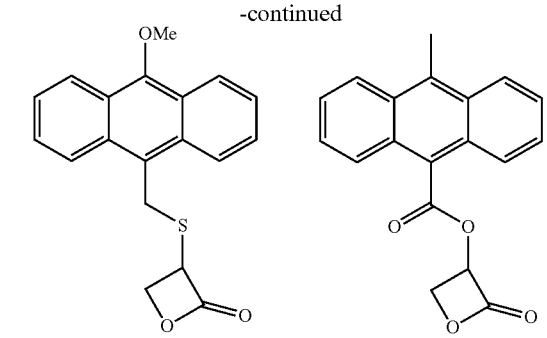
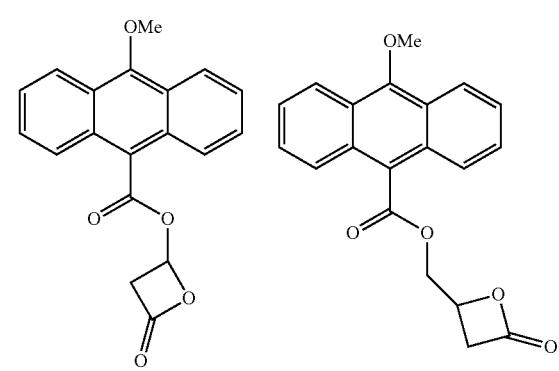
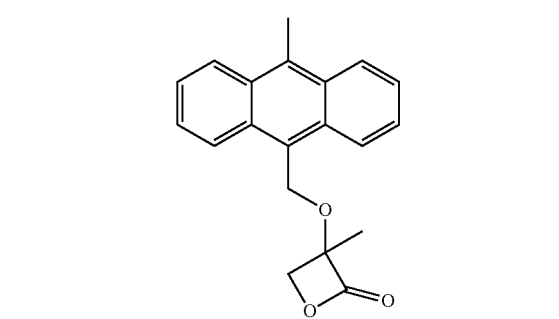
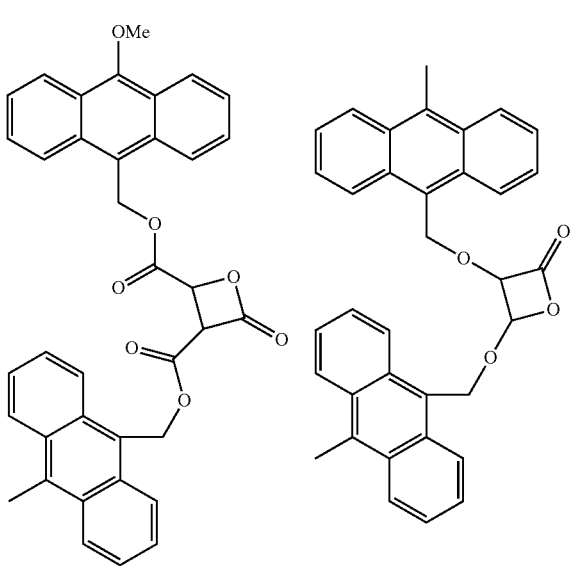
-continued
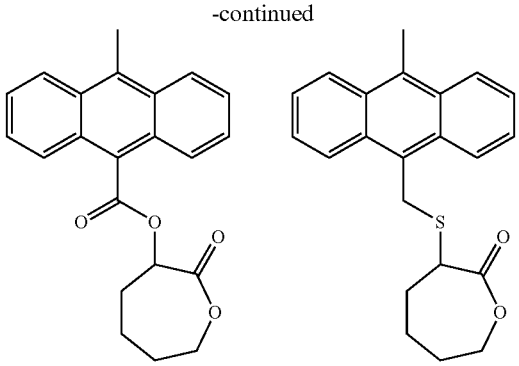
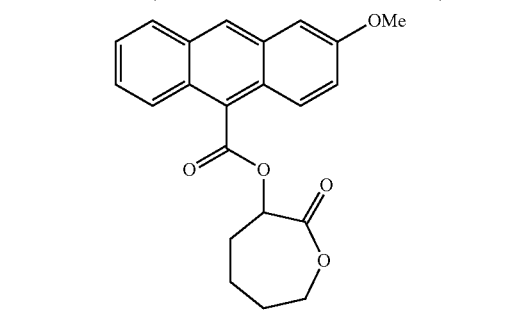
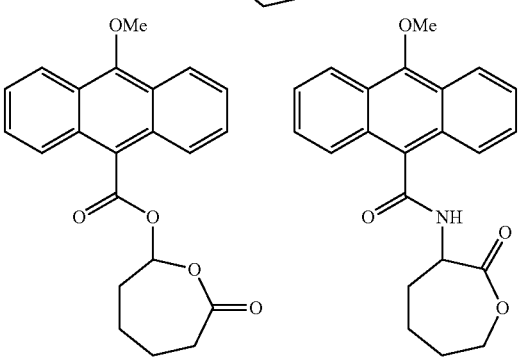
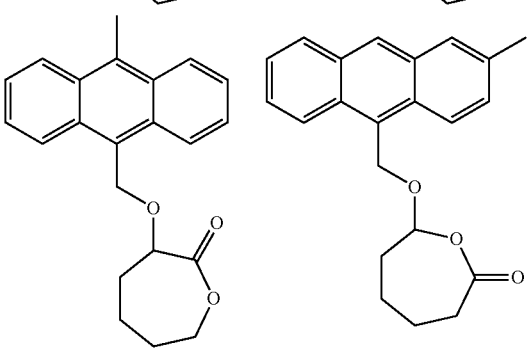
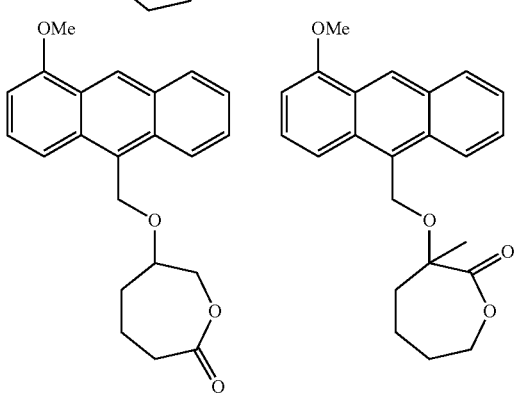

23
-continued
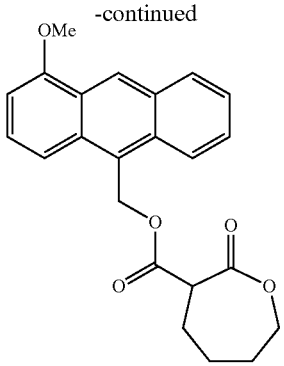
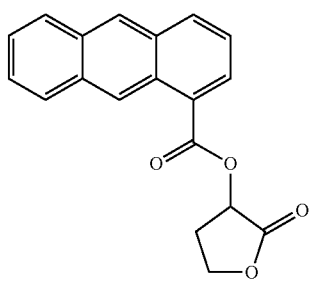
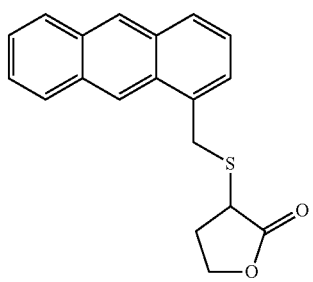
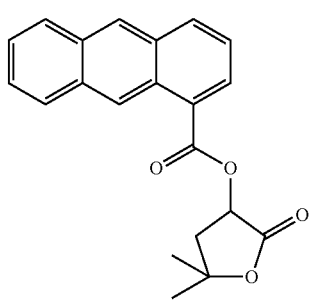
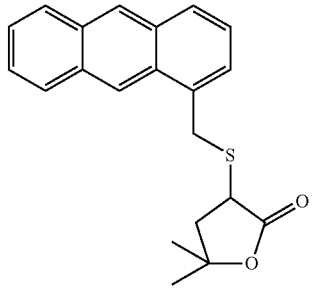
24
-continued
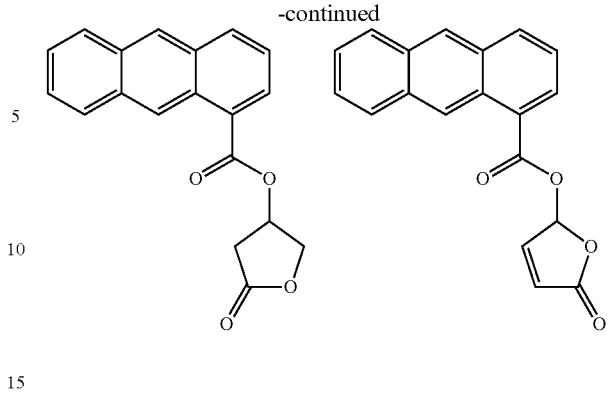
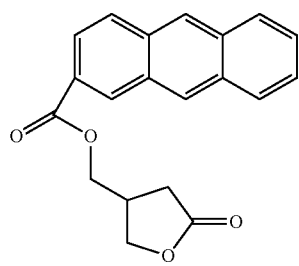
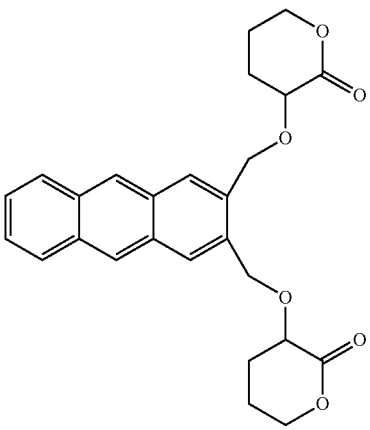
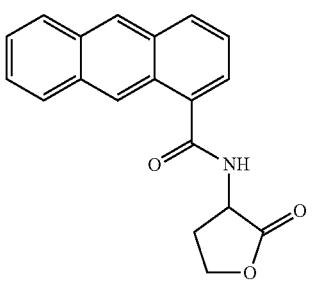
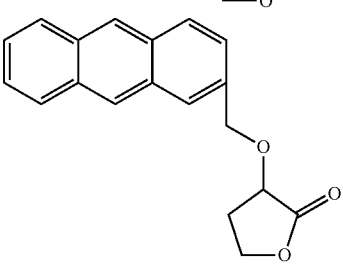

25
-continued
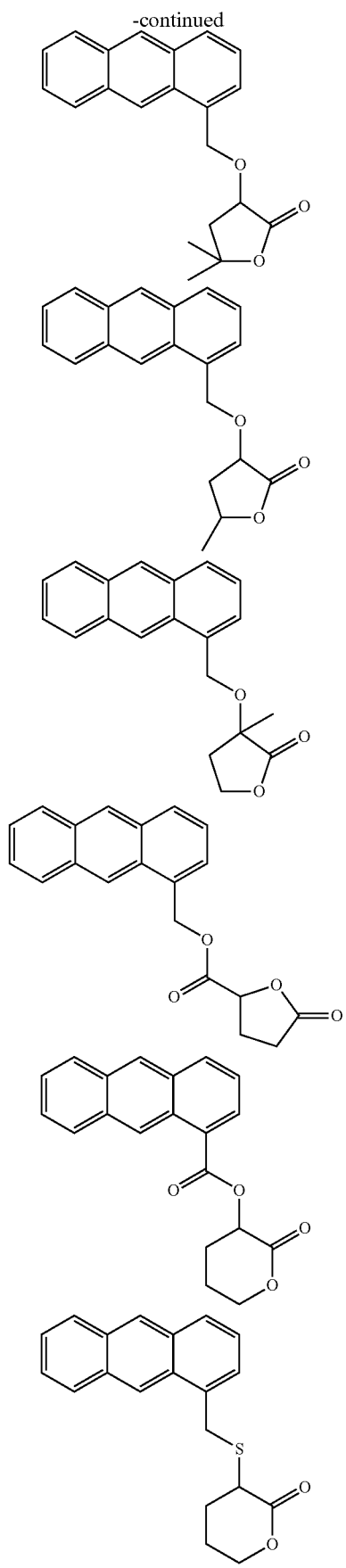
26
-continued
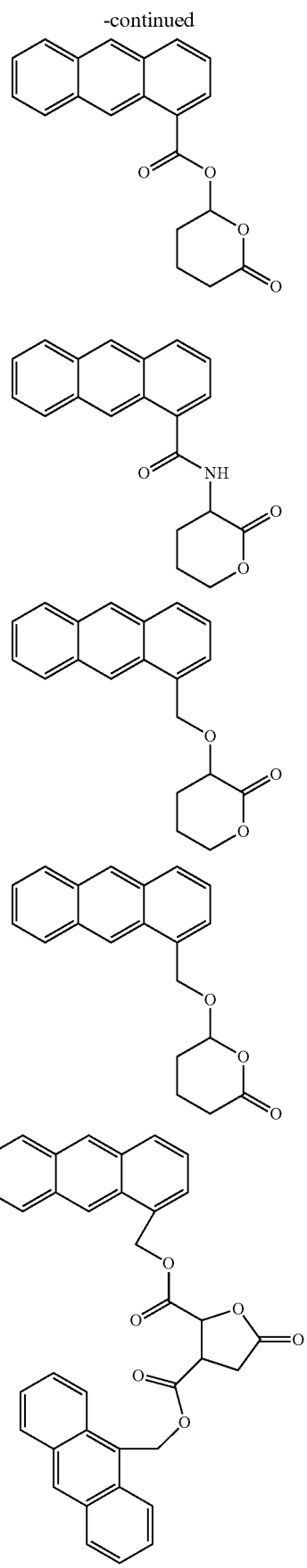

27
-continued
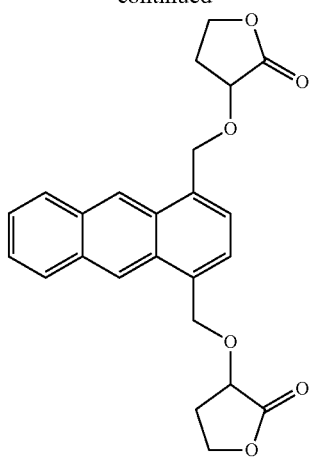
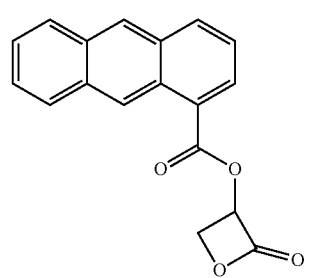
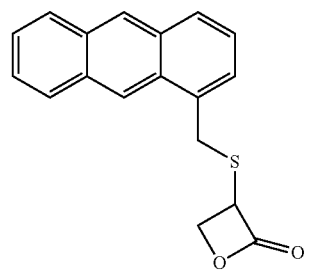
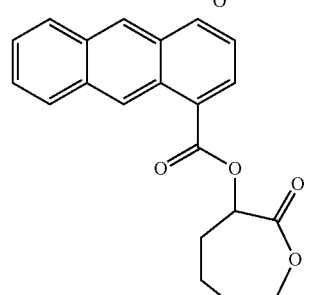
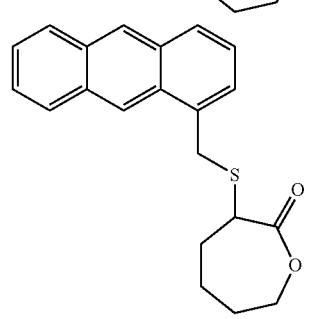
28
-continued
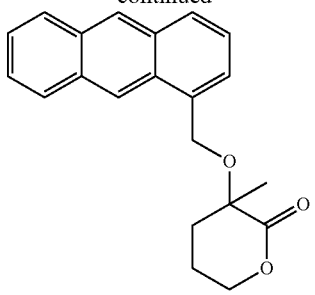
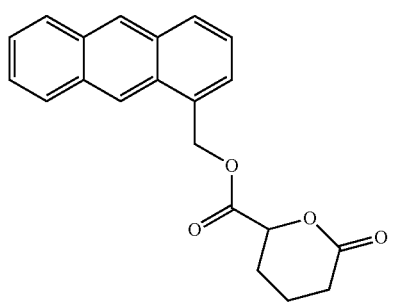
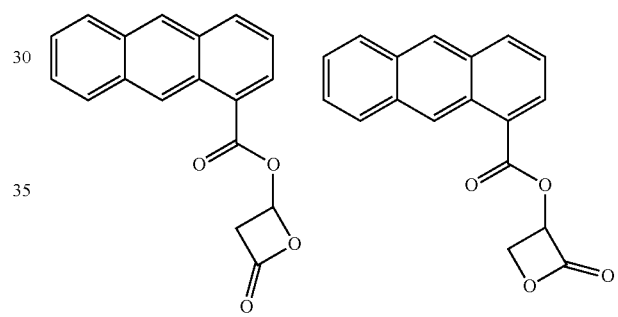
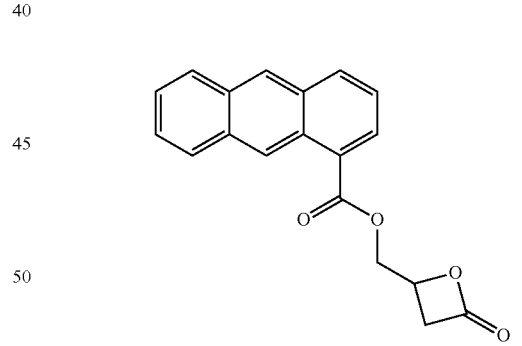
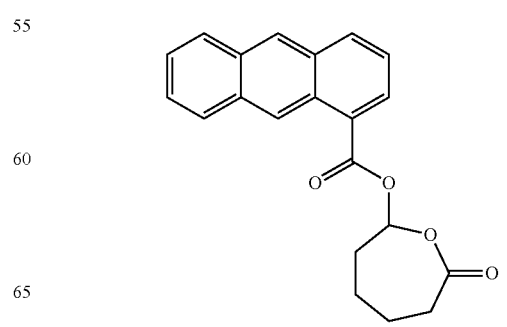

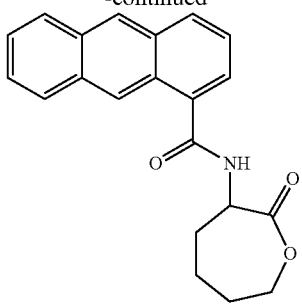
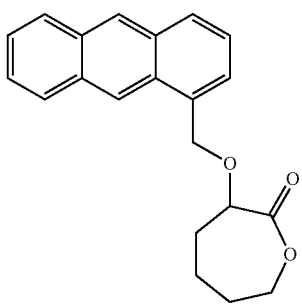
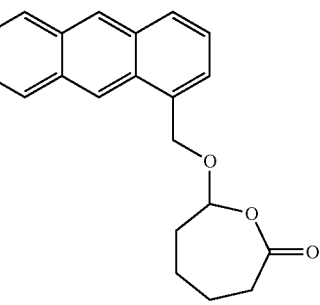
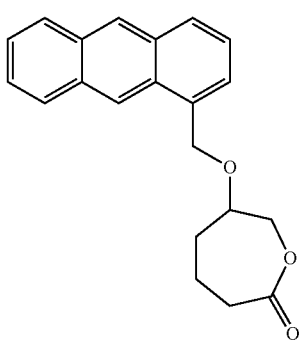
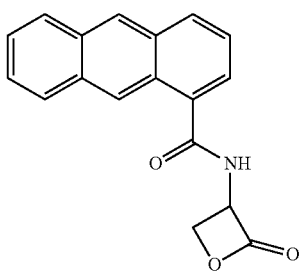
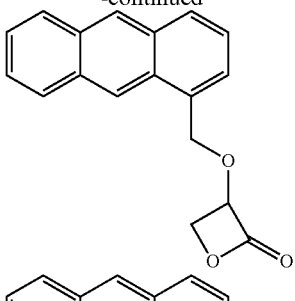
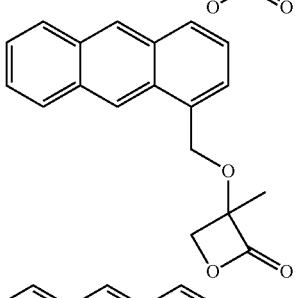
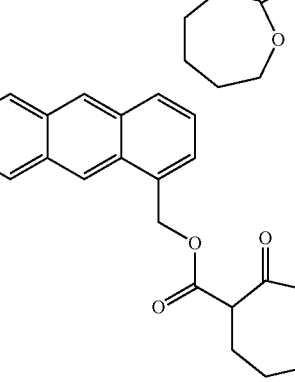
The compound where W is a group represented by any one of formulae (V1) to (V4) is described below.
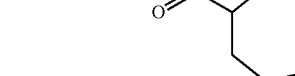 (V1)
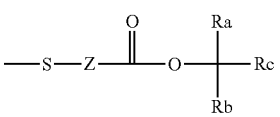 (V2)
 (V3)
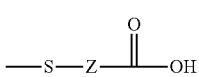 (V4)
In formulae (V1) to (V4), Z represents a single bond or a divalent linking group, and the divalent linking group of Z has the same meaning as X in formula (I). Z is preferably a single bond or an alkylene group (for example, a methylene group, an ethylene group, a propylene group, a butylene group, a hexylene group). In formulae (V1) and (V2), Z is preferably a single bond or a methylene group, and in formula (V4), Z is preferably a methylene group.

Each of Ra, Rb and Rc independently represents a hydrogen atom, an alkyl group, a cycloalkyl group or an alkenyl group.

Rd represents an alkyl group, a cycloalkyl group or an alkenyl group.

Incidentally, with respect to the group represented by formula (V1), each of Ra, Rb and Rc preferably represents an alkyl group, a cycloalkyl group or an alkenyl group, that is, the group preferably has an acid-decomposable group allowing the group represented by —C(Ra)(Rb)(Rc) to leave by the action of an acid.

Two groups out of Ra, Rb and Rc or two groups out of Ra, Rb and Rd may combine to form a ring structure comprising a carbon atom or may form a ring structure comprising a carbon atom and further containing a heteroatom.

The ring structure formed preferably has a carbon number of 3 to 15, more preferably a carbon number of 3 to 8, and examples thereof include a cyclopropyl group, a cyclopentyl group, a cyclohexyl group, a cycloheptyl group, a 1-cyclohexenyl group, an adamantyl group, a 2-tetrahydrofuranyl group and a 2-tetrahydropyranyl group.

The alkyl group of Ra to Rd is preferably an alkyl group having a carbon number of 1 to 8, which may have a substituent, such as methyl group, ethyl group, propyl group, n-butyl group, sec-butyl group, hexyl group, 2-ethylhexyl group and octyl group.

The cycloalkyl group is preferably a cycloalkyl group having a carbon number of 3 to 8, which may have a substituent, such as cyclopropyl group, cyclopentyl group and cyclohexyl group.

The alkenyl group is preferably an alkenyl group having a carbon number of 2 to 6, which may have a substituent, such as vinyl group, propenyl group, allyl group, butenyl group, pentenyl group, hexenyl group and cyclohexenyl group.

Preferred examples of the substituent on each of the groups described above include a hydroxyl group, a halogen atom (e.g., fluorine, chlorine, bromine, iodine), a nitro group, a cyano group, an amido group, a sulfonamido group, the alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

Specific examples of the compound represented by formula (I) where W is a group represented by any one of formulae (V1) to (V4) are illustrated below, but the present invention is not limited thereto.

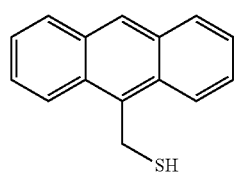

-continued

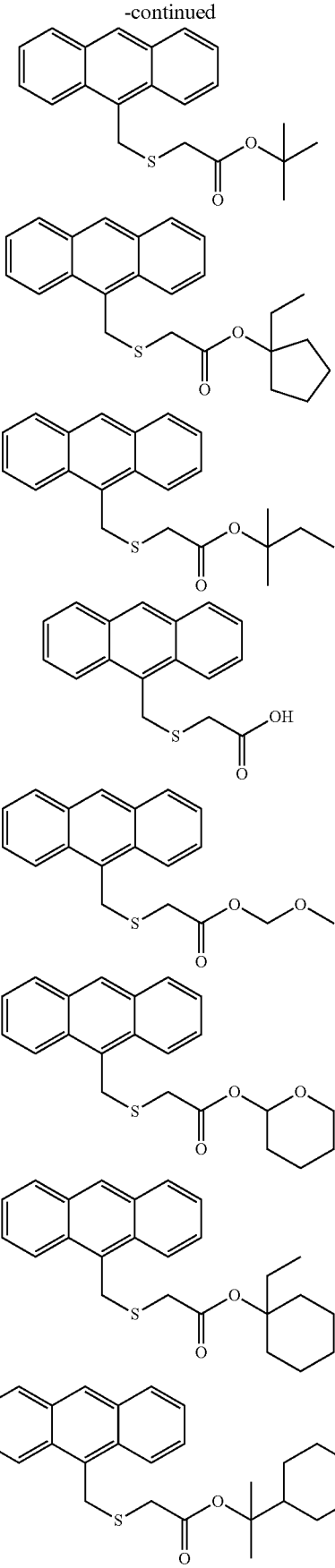

33
-continued
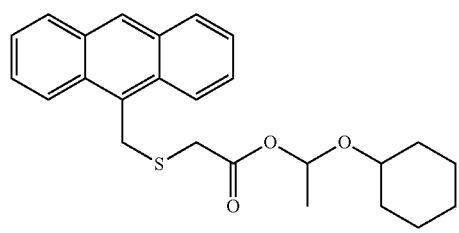
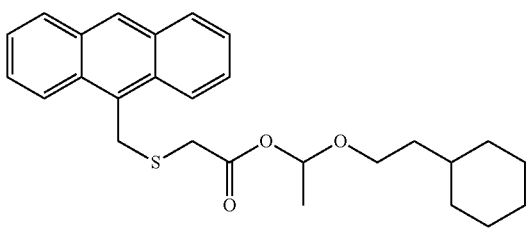
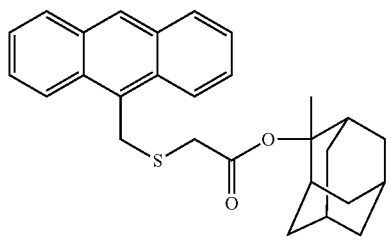
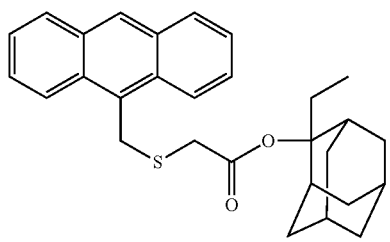
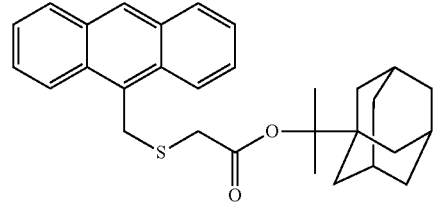
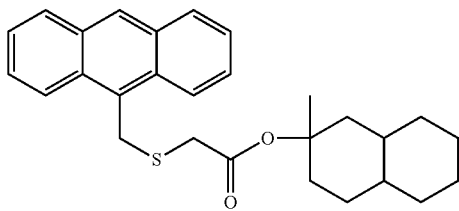
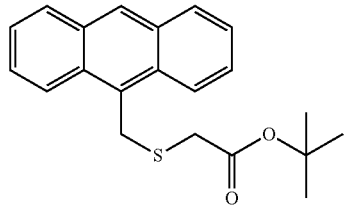
34
-continued
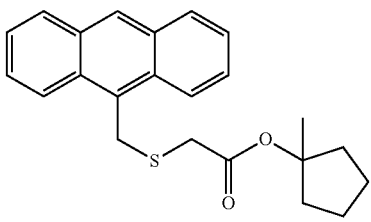
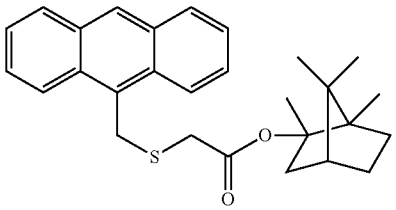
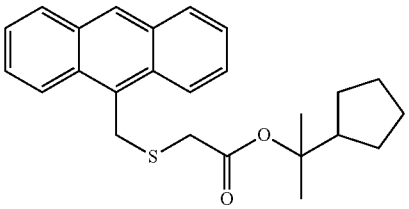
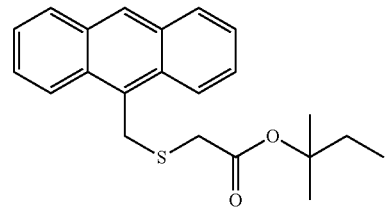
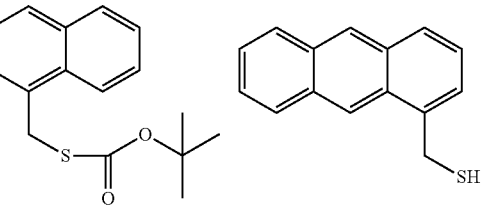
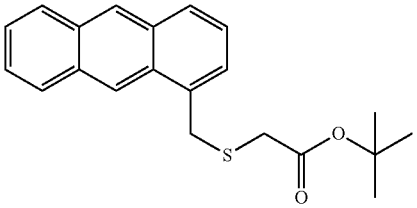
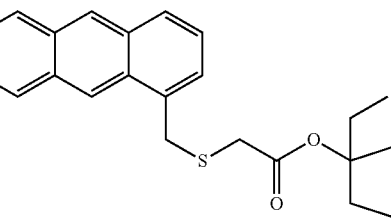
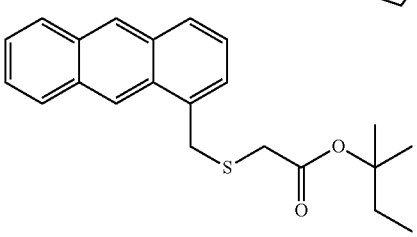

35
-continued
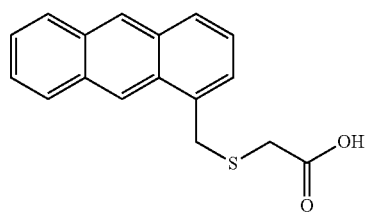
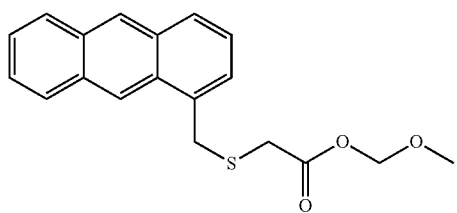
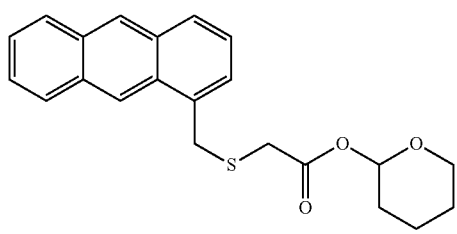
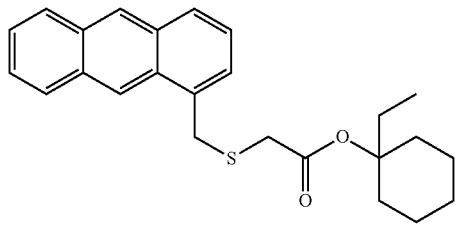
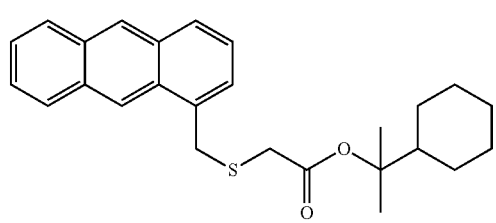
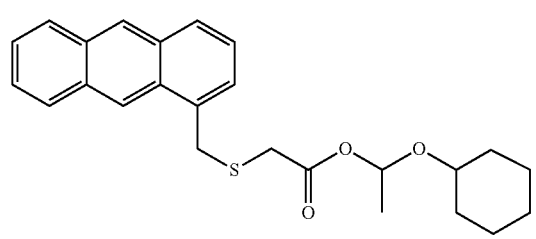
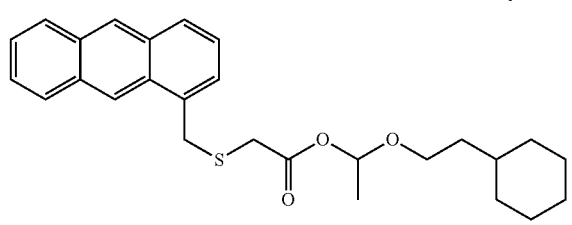
36
-continued
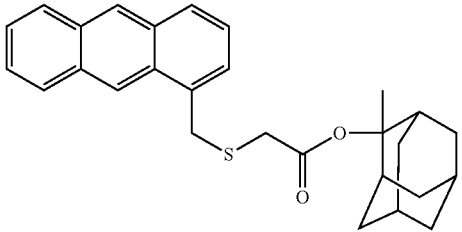
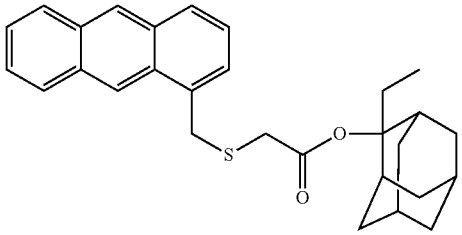
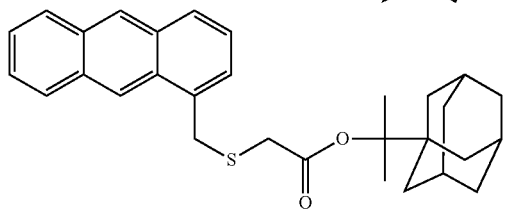
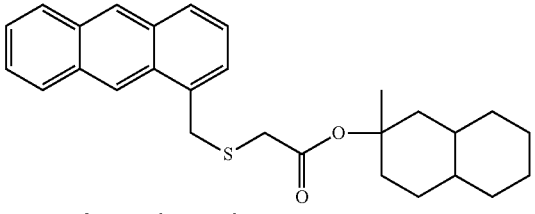
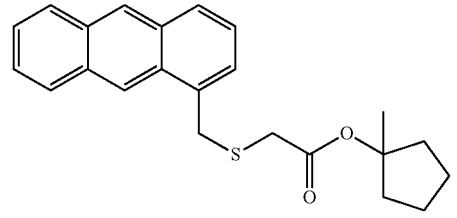
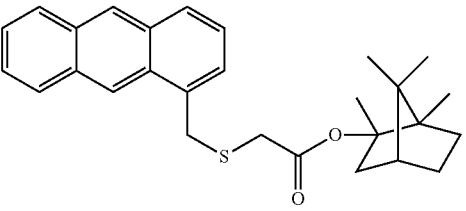
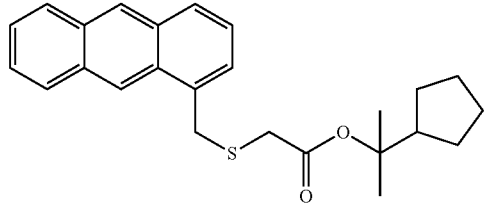
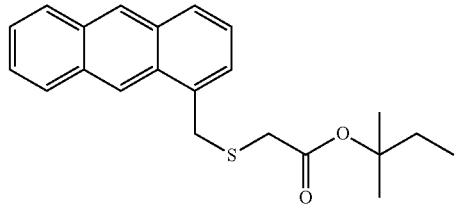

37
-continued
38
-continued
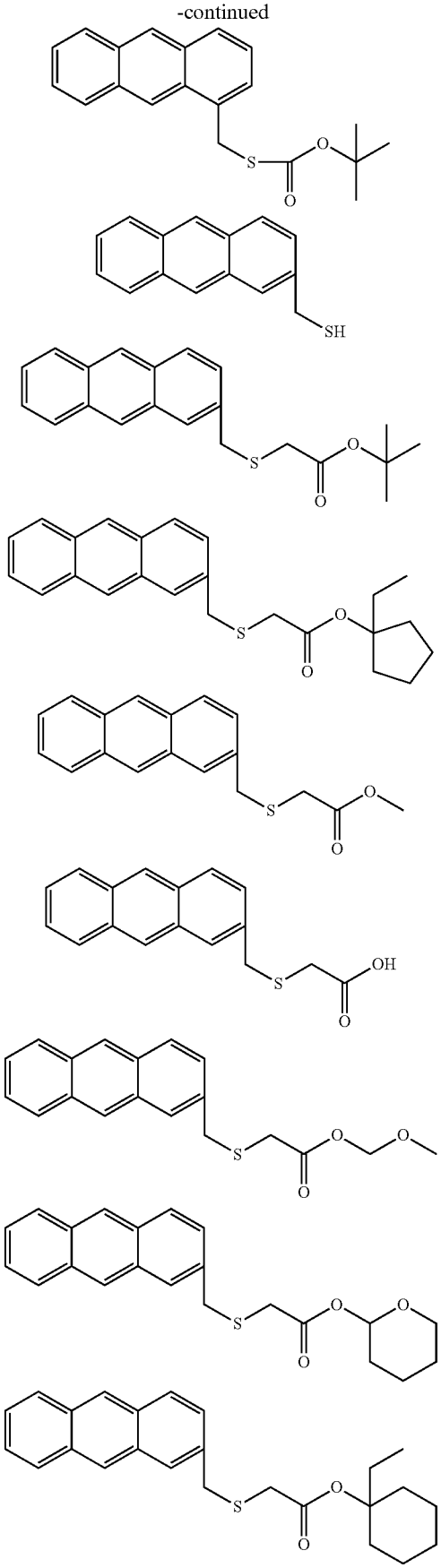
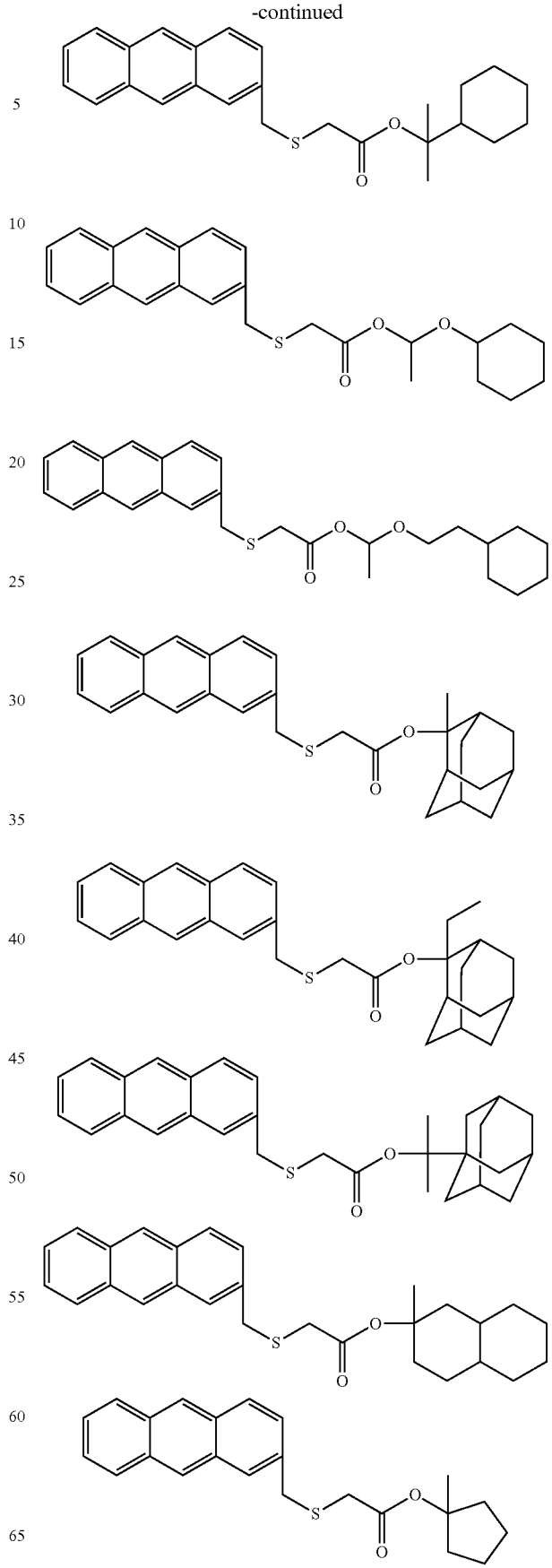

-continued

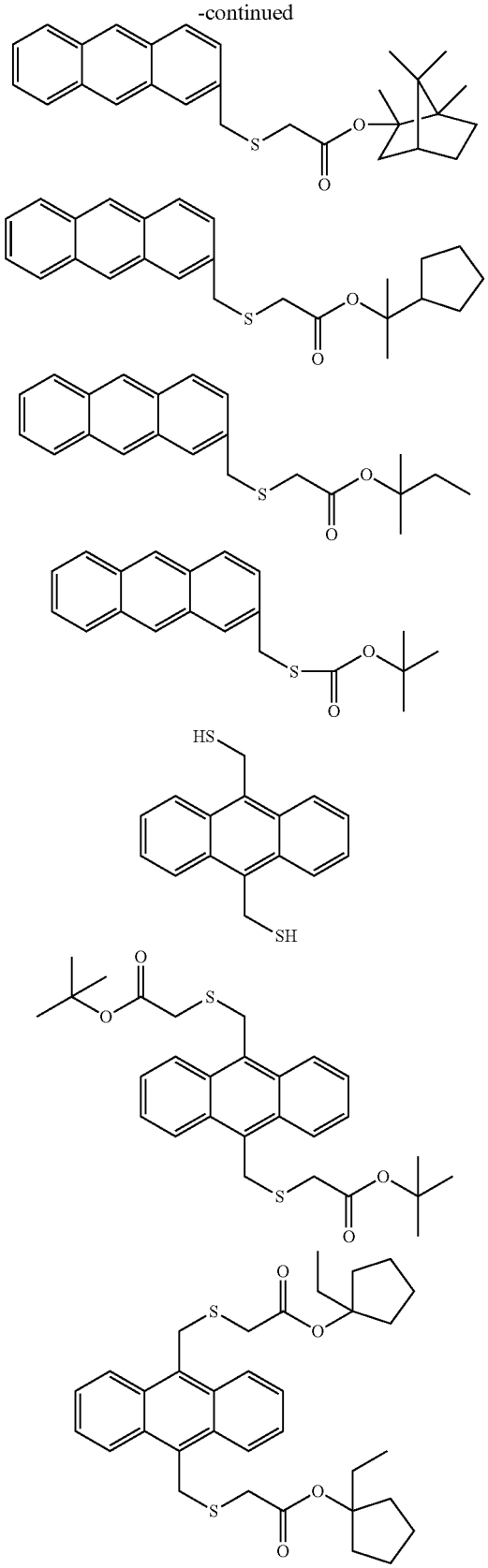

The molecular weight of the compound (A) is generally from 100 to 1,000, preferably from 200 to 500.

The compound (A) may be synthesized by a known method, or a commercially available product may be used. For example, the compound can be synthesized as follows. In the following, X has the same meaning as that in formula (I).

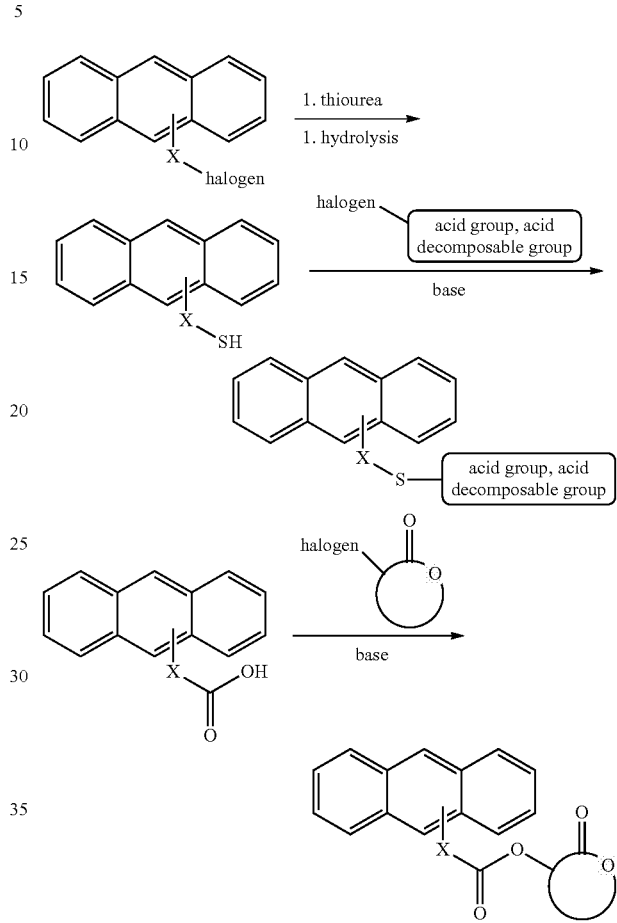

The amount of the compound (A) added is preferably from 0.1 to 30 mass %, more preferably from 1 to 20 mass %, based on the entire solid content of the actinic ray-sensitive or radiation-sensitive resin composition.

[2] (B) Resin Which is Alkali-Insoluble or Sparingly Alkali-Soluble and becomes Easily Alkali-Soluble in the Presence of an Acid The actinic ray-sensitive or radiation-sensitive resin composition of the present invention contains a resin which is alkali-insoluble or sparingly alkali-soluble and becomes easily alkali-soluble in the presence of an acid (hereinafter, sometimes referred to as an "acid-decomposable resin"). The acid-decomposable resin is a resin capable of decomposing by the action of an acid to increase the solubility rate in an alkali developer.

The acid-decomposable resin typically has a group capable of decomposing by the action of an acid to produce an alkali-soluble group (hereinafter, sometimes referred to as an "acid-decomposable group"). This resin may have an acid-decomposable group in either one or both of the main and side chains. The resin preferably has an acid-decomposable group in the side chain.

The acid-decomposable resin can be obtained, as disclosed in European Patent 254853, JP-A-2-25850, JP-A-3-223860, JP-A-4-251259 and the like, by reacting the resin with a precursor of a group capable of leaving by the action of an acid or by copolymerizing various monomers with an alkali-soluble resin monomer having bonded thereto a group capable of leaving by the action of an acid.

The acid-decomposable group is preferably a group where a hydrogen atom of an alkali-soluble group such as —COOH group and —OH group is replaced by a group capable of leaving by the action of an acid.

Examples of the group capable of leaving by the action of an acid include —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar$_{01}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring. Each of $R_{01}$ and $R_{02}$ independently represents a hydrogen atom, an alkyl group, a cycloalkyl group, an aryl group, an aralkyl group or an alkenyl group. Ar$_{01}$ represents an aryl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted with a heteroatom such as oxygen atom.

Examples of the aryl group of $R_{36}$ to $R_{39}$, $R_{01}$, $R_{02}$ and Ar$_{01}$ include a phenyl group, a naphthyl group and an anthryl group, and the aryl group is preferably an aryl group having a carbon number of 6 to 10.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be either monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the ring structure may be substituted with a heteroatom such as oxygen atom.

Each of the groups above may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

The acid-decomposable group-containing repeating unit contained in the acid-decomposable resin for use in the present invention may be a styrene-based repeating unit or an acryl-based repeating unit.

As for the repeating unit having an acid-decomposable group, the below-described repeating unit represented by formula (IA) (styrene-based repeating unit) and repeating unit represented by formula (IB) (acryl-based repeating unit) are preferred.

(a) The acid-decomposable resin preferably contains a repeating unit represented by the following formula (IA):

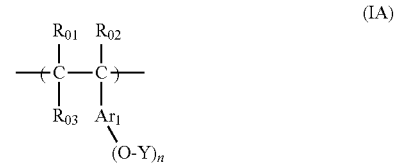

(IA)

In formula (IA), each of $R_{01}$ and $R_{02}$ independently represents a hydrogen atom, an alkyl group, a cycloalkyl group, a halogen atom, a cyano group or an alkoxycarbonyl group.

$R_{03}$ represents a hydrogen atom, an alkyl group, a cycloalkyl group, a halogen atom, a cyano group or an alkoxycarbonyl group or combines with Ar$_1$ to form a ring structure.

Ar$_1$ represents an aromatic ring group.

Each of n Ys independently represents a group capable of leaving by the action of an acid, provided that at least one Y represents a group capable of leaving by the action of an acid.

n represents an integer of 1 to 4 and is preferably 1 or 2, more preferably 1.

The alkyl group of $R_{01}$ to $R_{03}$ is, for example, an alkyl group having a carbon number of 20 or less, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less. These alkyl groups may have a substituent.

Examples of the alkyl group contained in the alkoxycarbonyl group of $R_{01}$ to $R_{03}$ include those described above as examples of the alkyl group of $R_{01}$ to $R_{03}$.

The cycloalkyl group as $R_{01}$ to $R_{03}$ may be either monocyclic or polycyclic. This cycloalkyl group is preferably a monocyclic cycloalkyl group having a carbon number of 3 to 8, such as cyclopropyl group, cyclopentyl group and cyclohexyl group. These cycloalkyl groups may have a substituent.

Examples of the halogen atom include a fluorine atom, a chlorine atom, a bromine atom and an iodine atom. Among these, a fluorine atom is preferred.

Examples of the ring structure which may be formed by combining $R_{03}$ and Ar$_1$ include a 5- or 6-membered ring structure.

The aromatic ring group as Ar$_1$ is preferably an aromatic ring group having a carbon number of 6 to 14, and specific examples thereof include a benzene ring group and a naphthalene ring group.

As described above, at least one of n Ys represents a group capable of leaving by the action of and acid. Examples of the group capable of leaving by the action of an acid include the above-described groups.

The group capable of leaving by the action of an acid is more preferably a structure represented by the following formula (IIA):

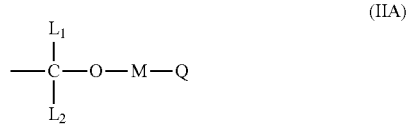

In formula (IIA), each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group, an alicyclic group, an aromatic ring group, an amino group, an ammonium group, a mercapto group, a cyano group or an aldehyde group. The alicyclic group and the aromatic ring group may contain a heteroatom.

At least two members of Q, M and $L_1$ may combine with each other to form a 5- or 6-membered ring.

The alkyl group as $L_1$ and $L_2$ is, for example, an alkyl group having a carbon number of 1 to 8, and specific examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific examples thereof include a cyclopentyl group, a cyclohexyl group, a norbornyl group and an adamantyl group.

The aryl group as $L_1$ and $L_2$ is, for example, an aryl group having a carbon number of 6 to 15, and specific examples thereof include a phenyl group, a tolyl group, a naphthyl group and an anthryl group.

The aralkyl group as $L_1$ and $L_2$ is, for example, an aralkyl group having a carbon number of 6 to 20, and specific examples thereof include a benzyl group and a phenethyl group.

Examples of the divalent linking group as M include an alkylene group (preferably a methylene group, an ethylene group, a propylene group, a butylene group, a hexylene group or an octylene group), a cycloalkylene group (preferably a cyclopentylene group or a cyclohexylene group), an alkenylene group (preferably an ethylene group, a propenylene group or a butenylene group), an arylene group (preferably a phenylene group, a tolylene group or a naphthylene group), —S—, —O—, —CO—, —SO$_2$—, —N(R$_0$)—, and a combination of two or more thereof. Here, $R_0$ is a hydrogen atom or an alkyl group. The alkyl group as $R_0$ is, for example, an alkyl group having a carbon number of 1 to 8, and specific examples thereof include a methyl group, an ethyl group, a propyl group, an n-butyl group, a sec-butyl group, a hexyl group and an octyl group.

Examples of the alkyl group and cycloalkyl group represented by Q are the same as those described above for the alkyl group and cycloalkyl group of $L_1$ and $L_2$.

Examples of the alicyclic group and aromatic ring group represented by Q include the above-described cycloalkyl group and aryl group as $L_1$ and $L_2$. The cycloalkyl group and aryl group are preferably a group having a carbon number of 3 to 15.

Examples of the heteroatom-containing alicyclic or aromatic ring group represented by Q include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a heteroatom.

Examples of the ring structure which may be formed by combining at least two members out of Q, M and $L_1$ include a 5- or 6-membered ring obtained by forming a propylene group or a butylene group by these members.

Each of the groups represented by $Ar_1$ in formula (IA) and the groups represented by $L_1$, $L_2$, M and Q in formula (IIA) may have a substituent, and examples of the substituent include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group. The carbon number of the substituent is preferably 8 or less.

The group represented by -M-Q is preferably a group having a carbon number of 1 to 30, more preferably a group having a carbon number of 5 to 20.

Specific examples of the repeating unit represented by formula (IA) are illustrated below, but the present invention is not limited thereto.

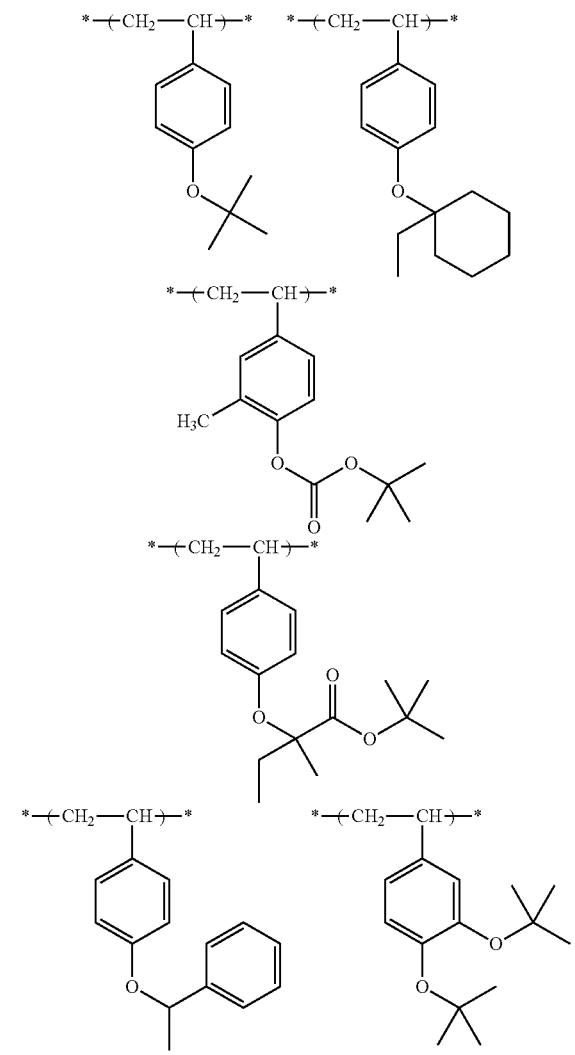

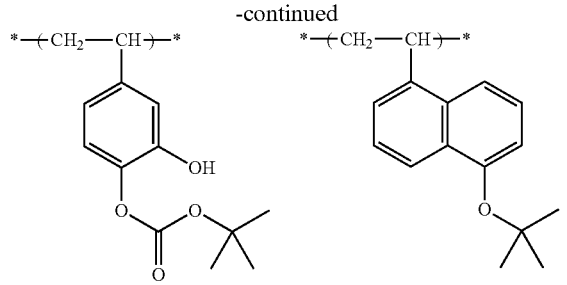
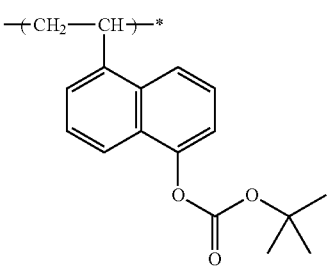
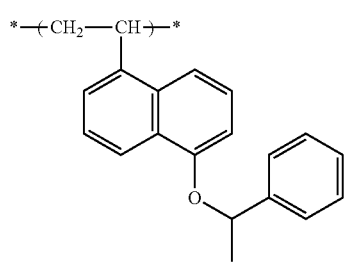
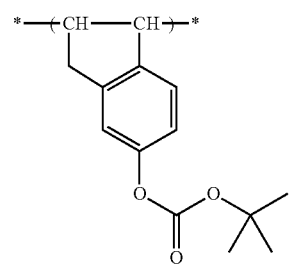
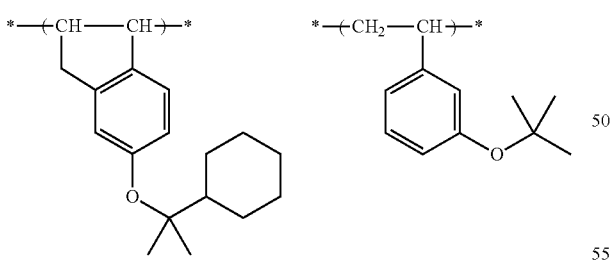
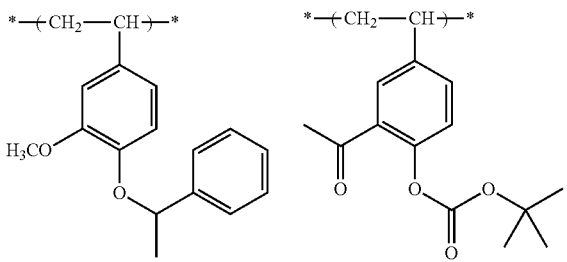
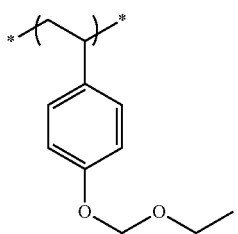
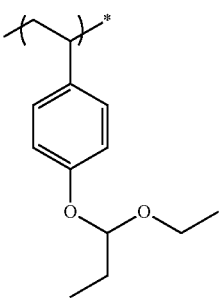
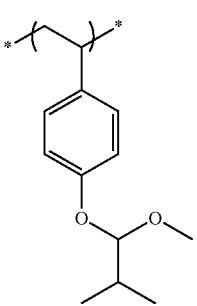
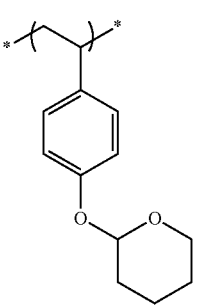
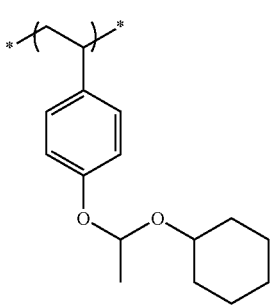
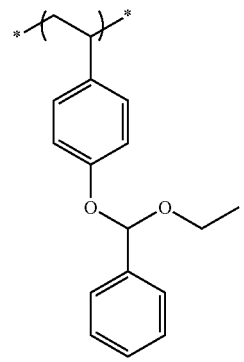
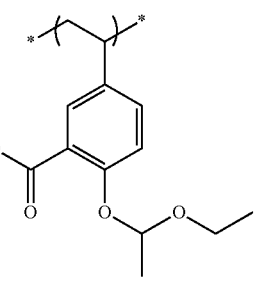
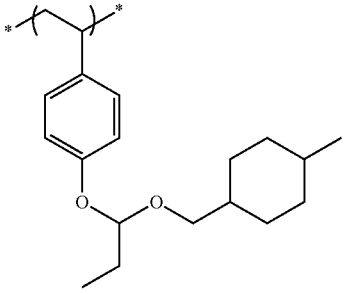

47
-continued
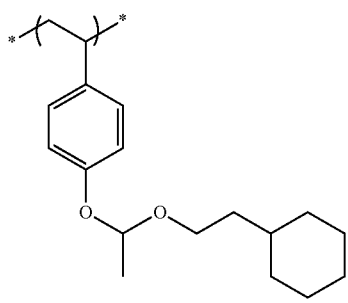
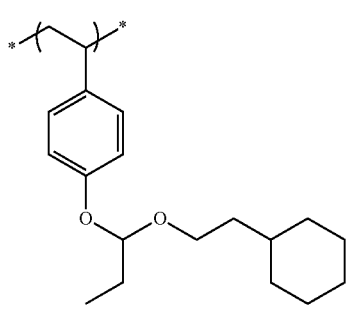
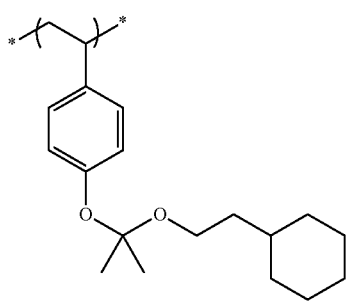
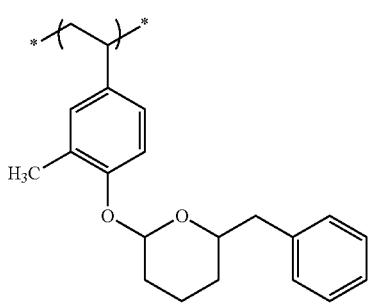
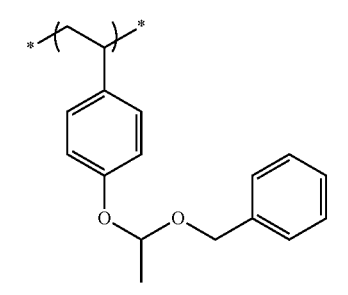
48
-continued
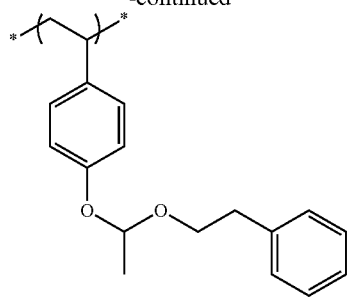
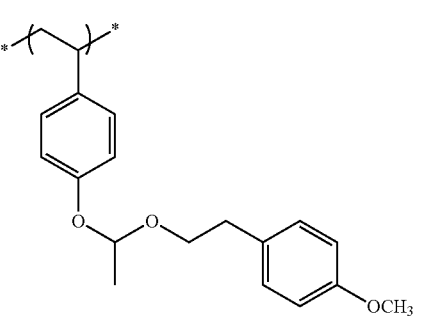
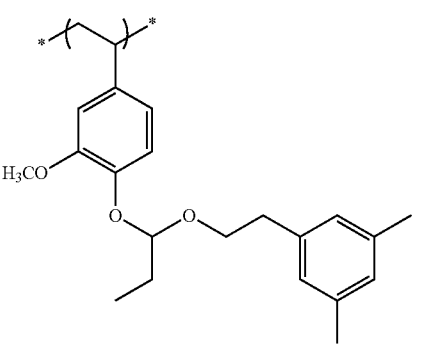
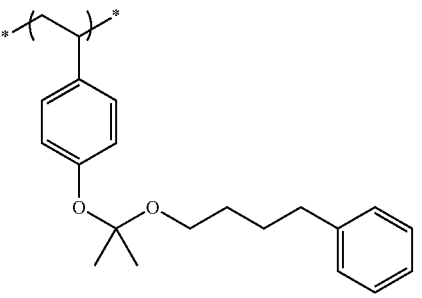
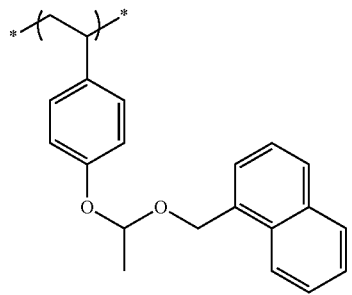

49
-continued
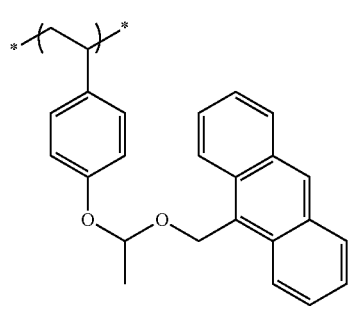
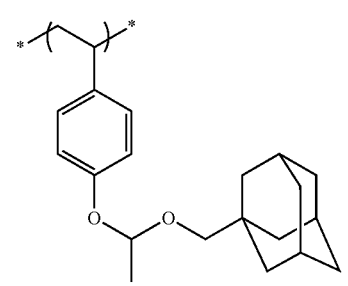
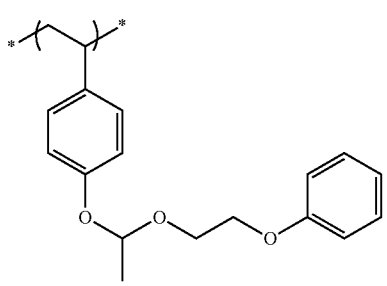
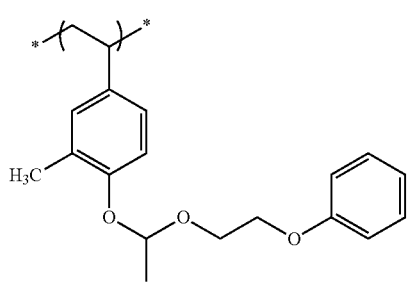
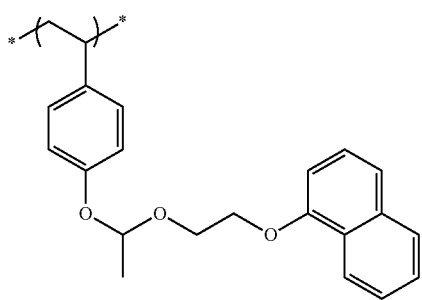
50
-continued
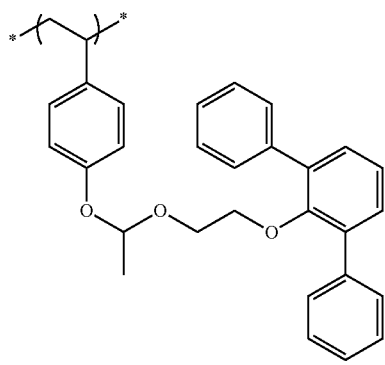
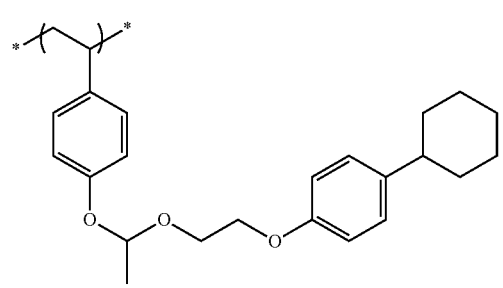
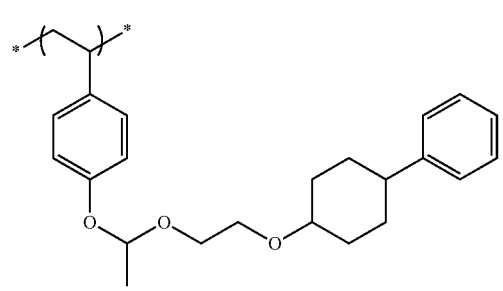
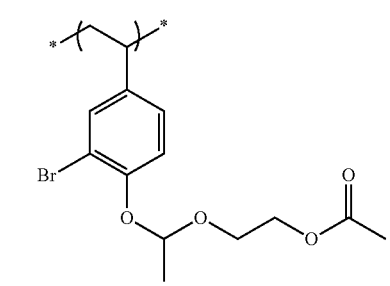
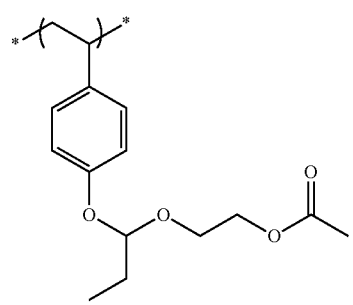

51
-continued
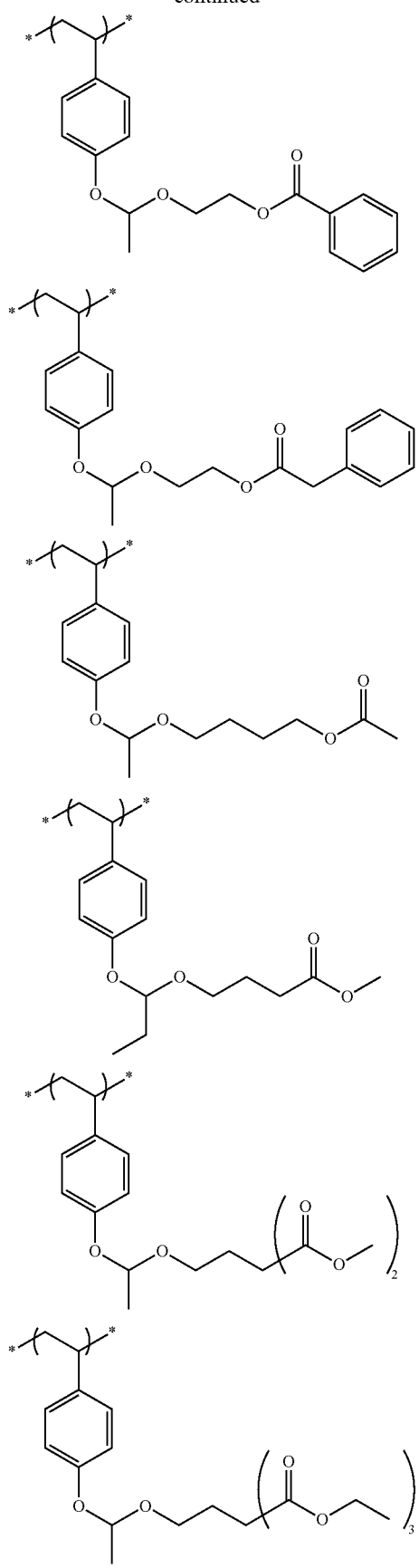
52
-continued
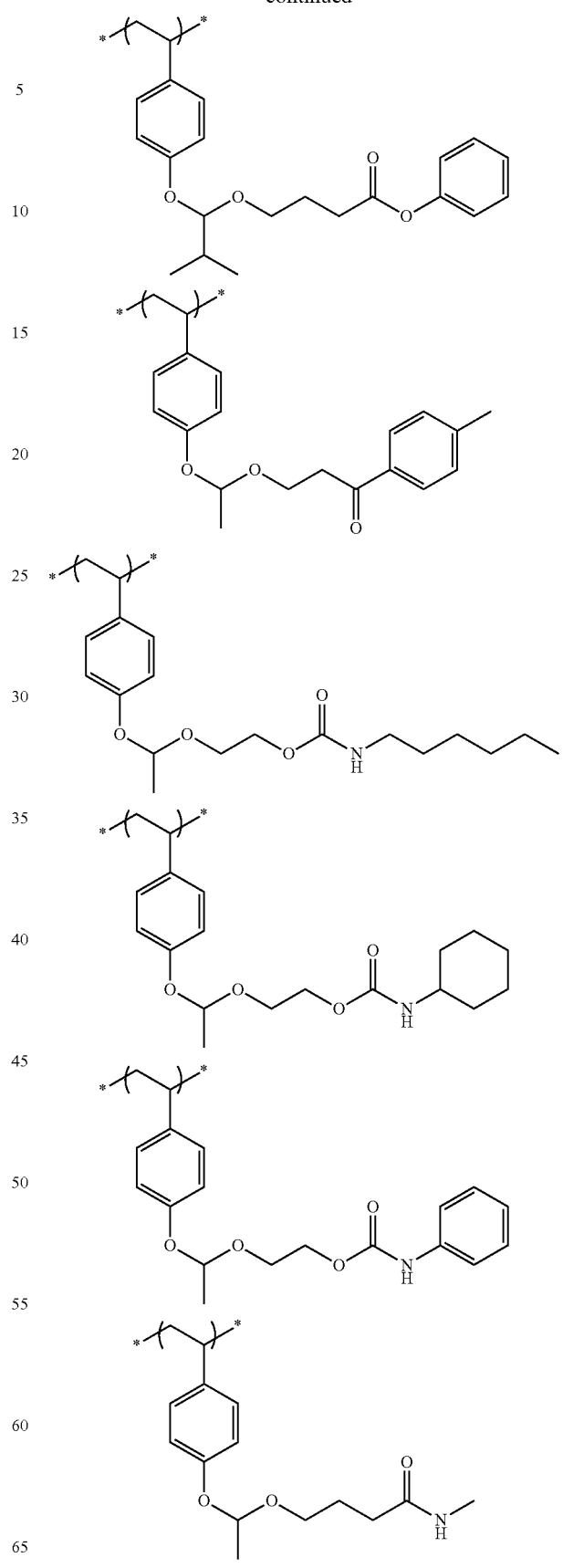

53
-continued
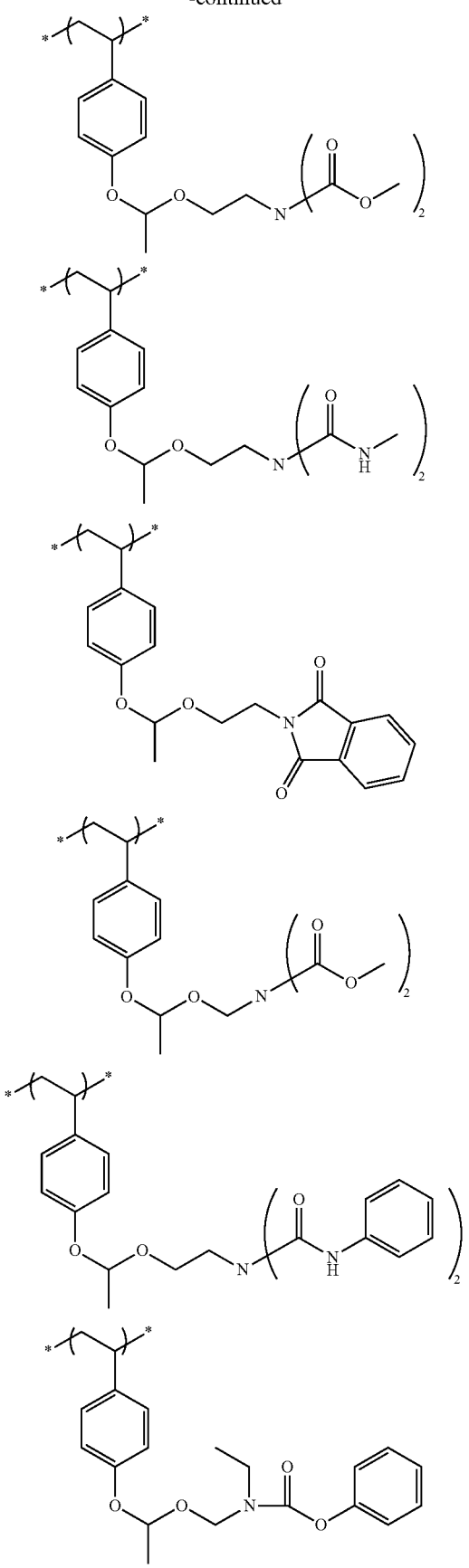
54
-continued
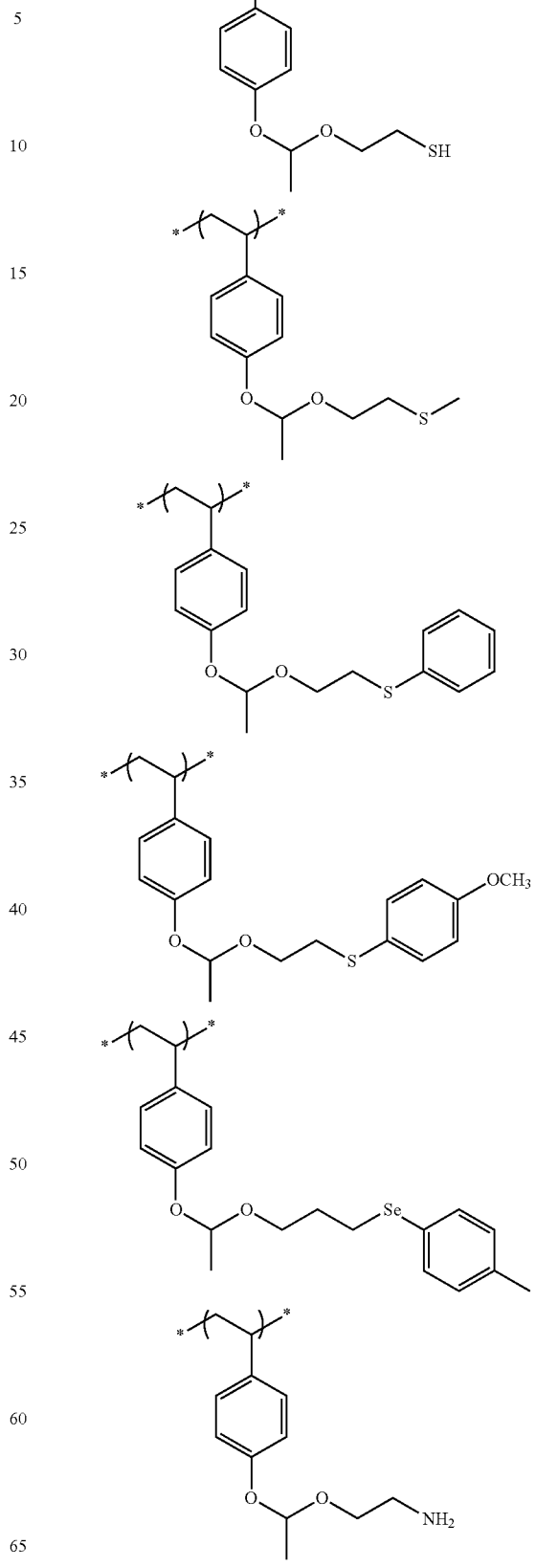

55
-continued
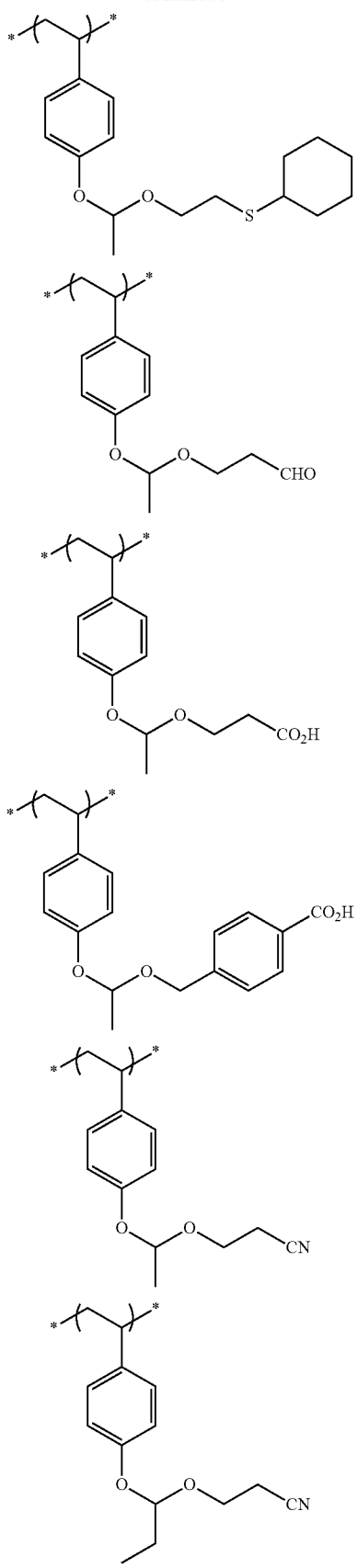
56
-continued
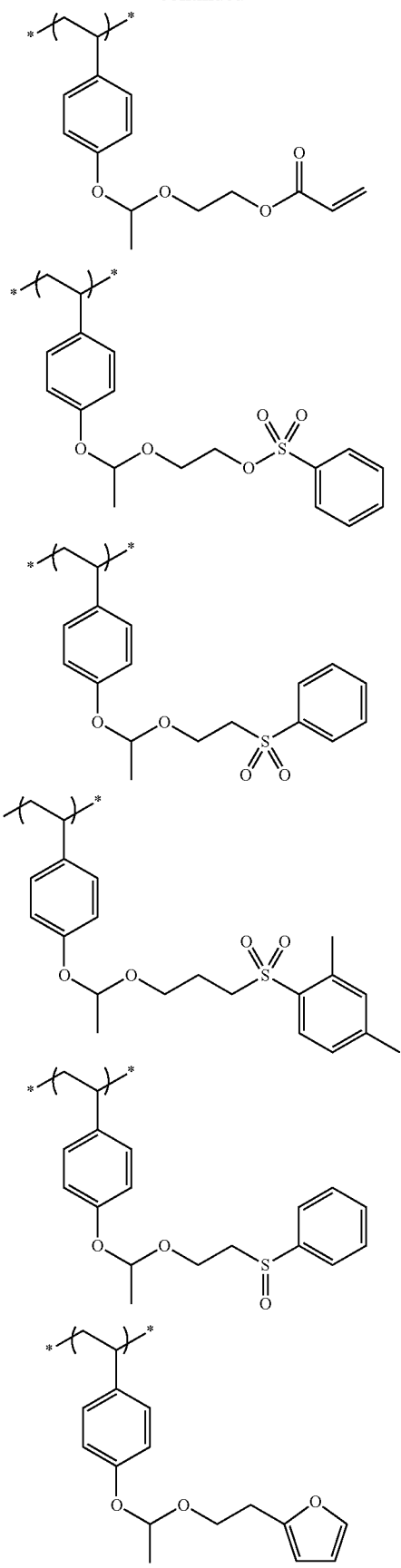

57
-continued
58
-continued
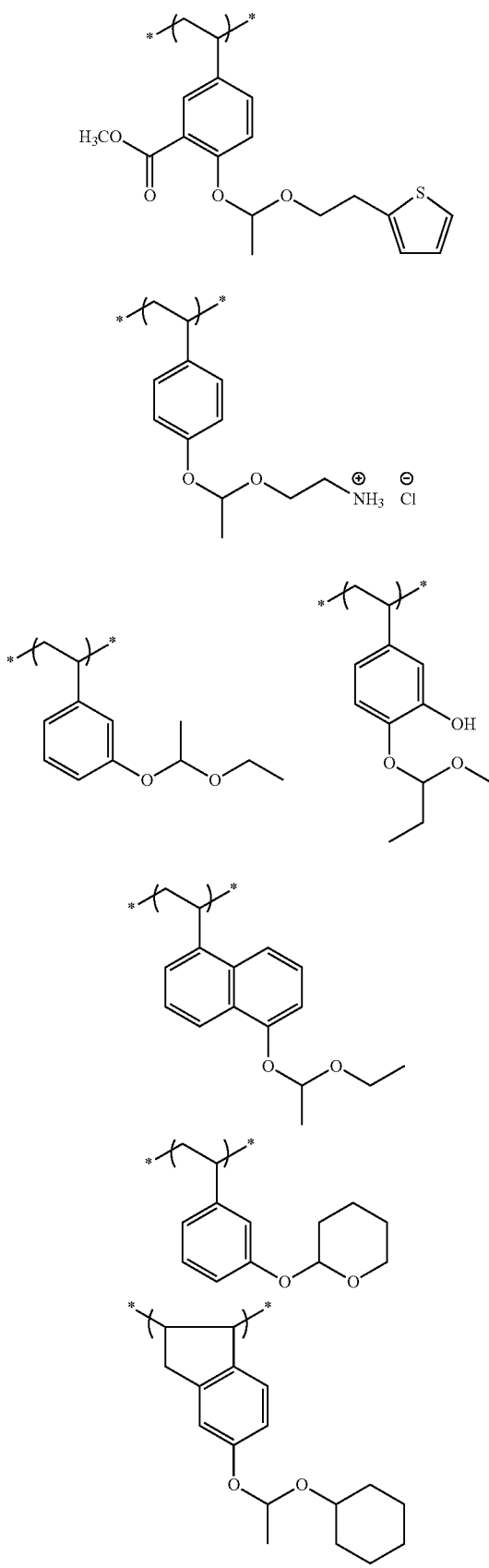
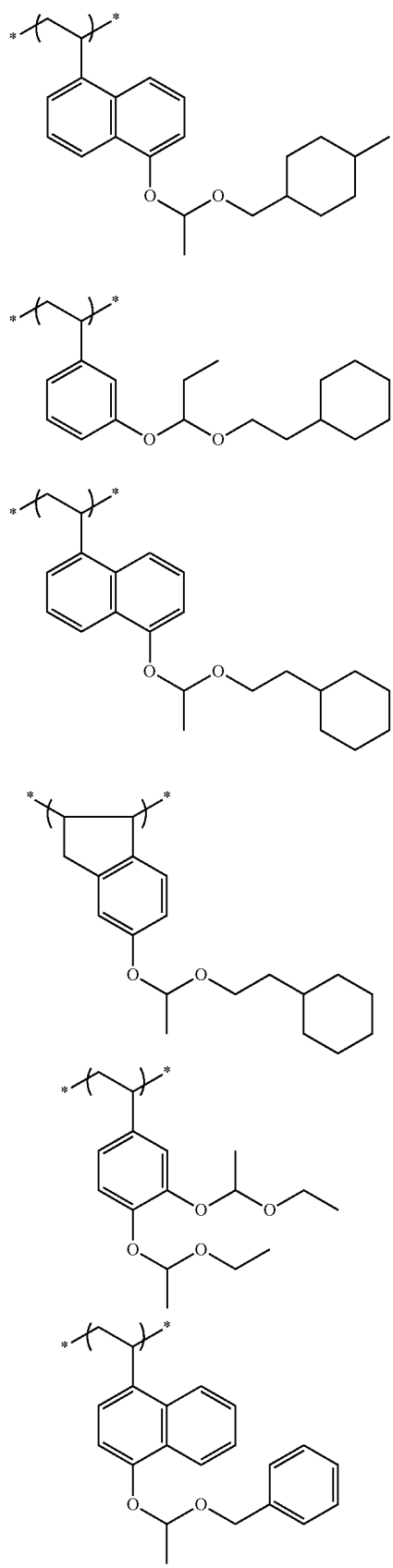

59
-continued
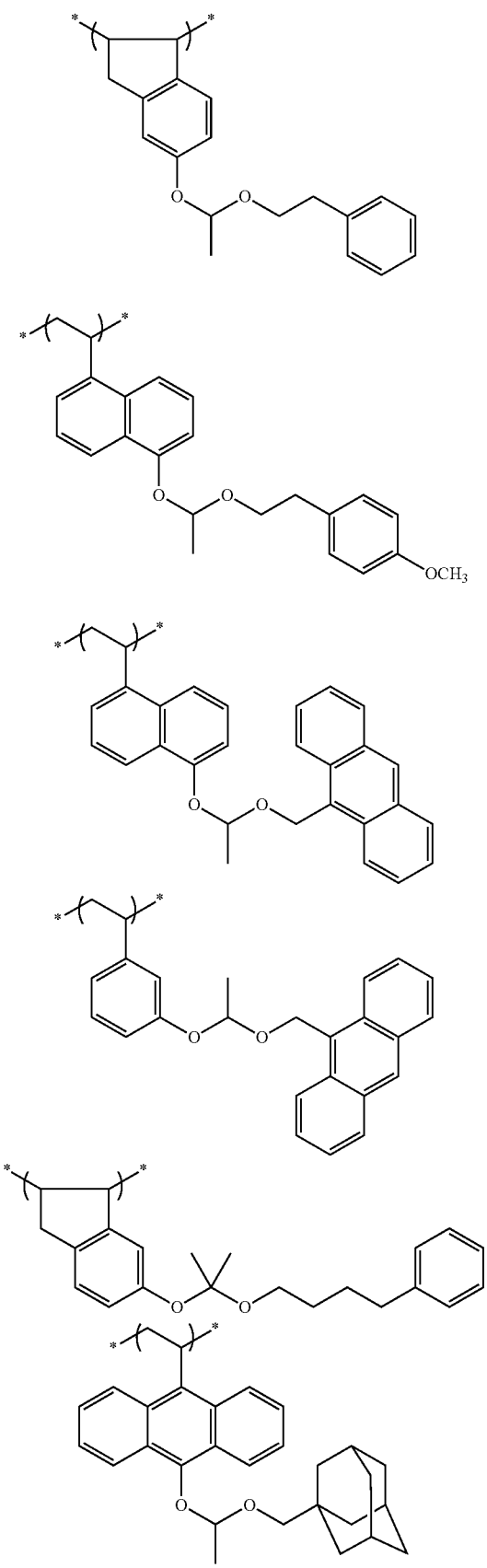
60
-continued
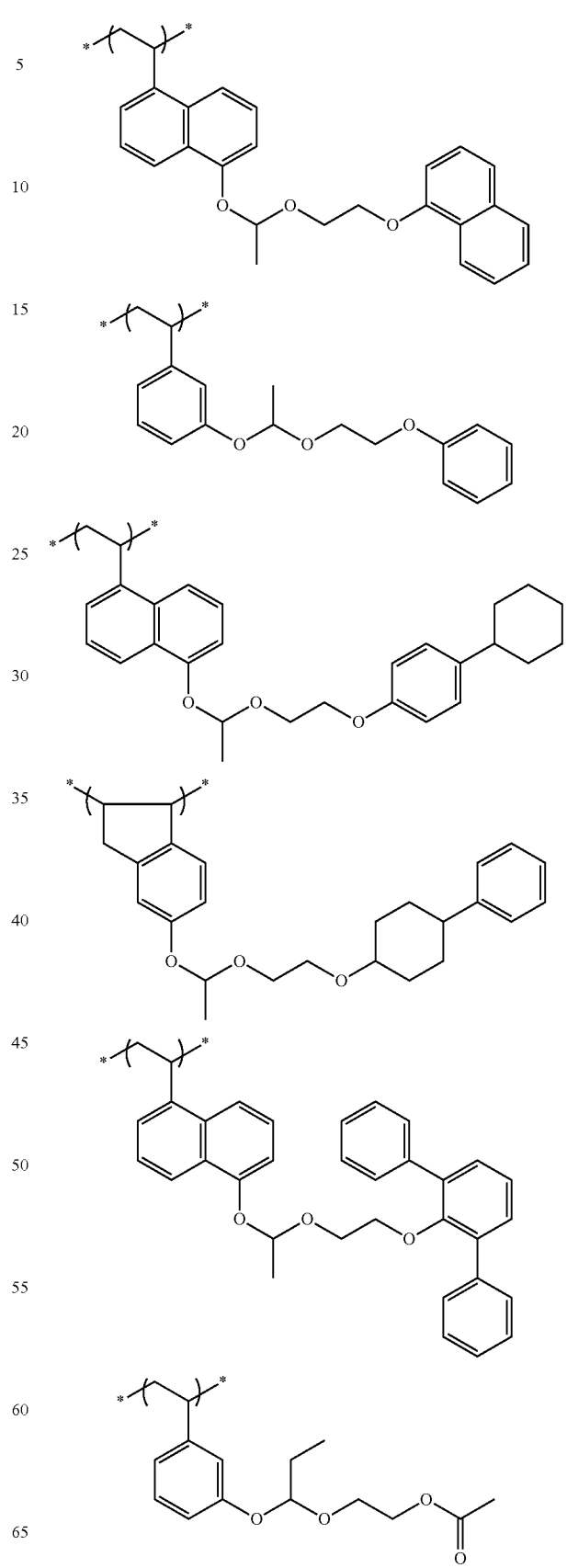

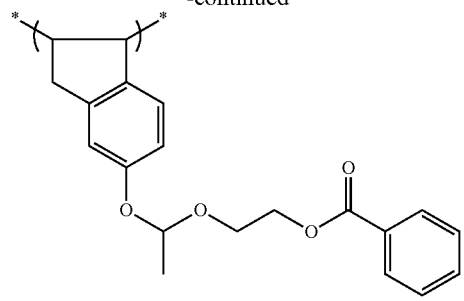
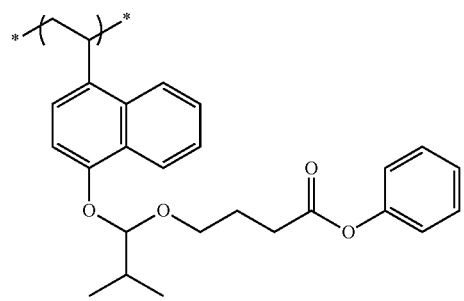
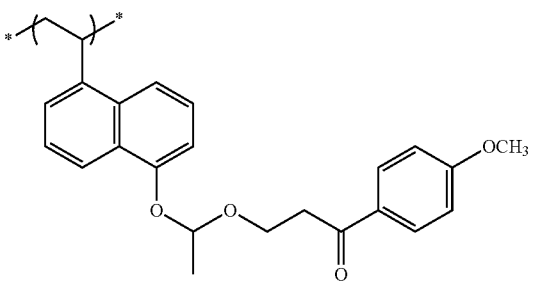
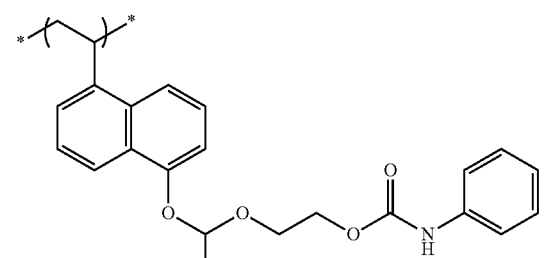
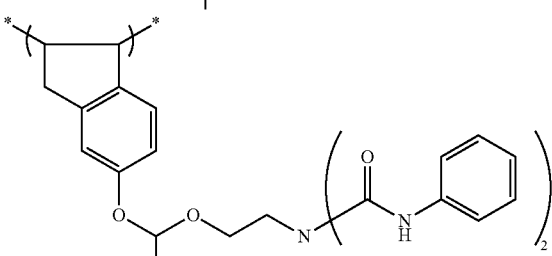
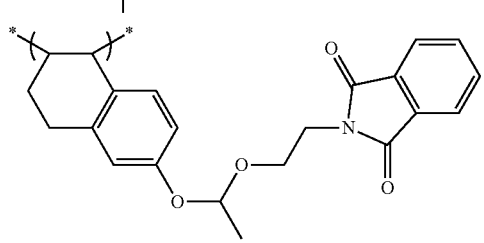

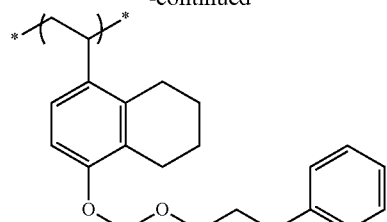
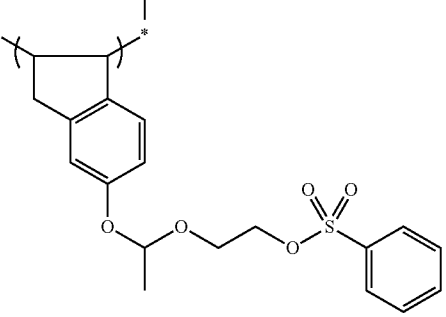

(b) The acid-decomposable resin may contain a repeating unit represented by the following formula (IB):

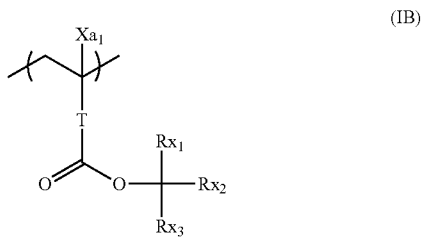

(IB)

In formula (IB), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents a linear or branched alkyl group or a monocyclic or polycyclic cycloalkyl group. At least two members of $Rx_1$ to $Rx_3$ may combine to form a monocyclic or polycyclic cycloalkyl group.

Examples of the divalent linking group as T include an alkylene group, a —COO—Rt)-group and a —(O—Rt)-group, wherein Rt represents an alkylene group or a cycloalkylene group.

T is preferably a single bond, a —(COO—Rt)-group. Here, Rt is preferably an alkylene group having a carbon number of 1 to 5, more preferably a —$CH_2$— group or a —$(CH_2)_3$— group.

The alkyl group as $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group as $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group which may formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described cycloalkyl group is preferred.

Specific examples of the repeating unit represented by formula (IB) are illustrated below, but the present invention is not limited thereto.

(In formulae, Rx represents H, $CH_3$, $CF_3$ or $CH_2OH$, and each of Rxa and Rxb represents an alkyl group having a carbon number of 1 to 4.)

1
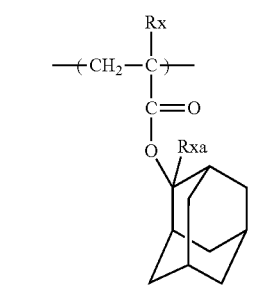

2
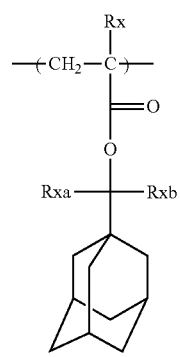

3
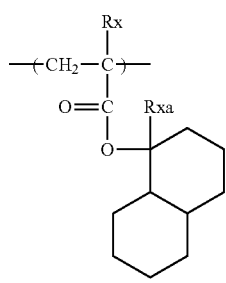

4
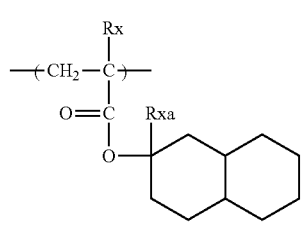

5
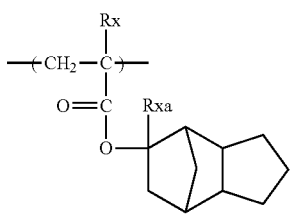

6
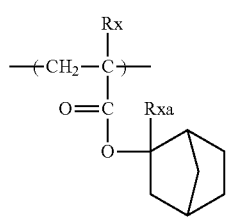

7
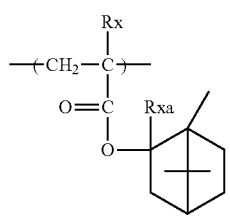

8
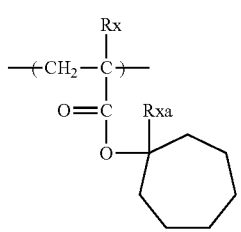

9
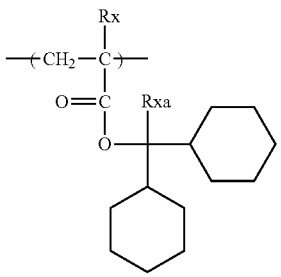

10
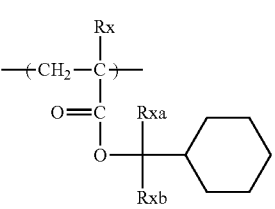

11
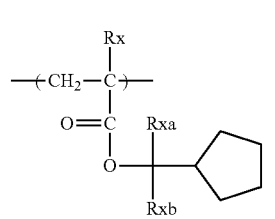

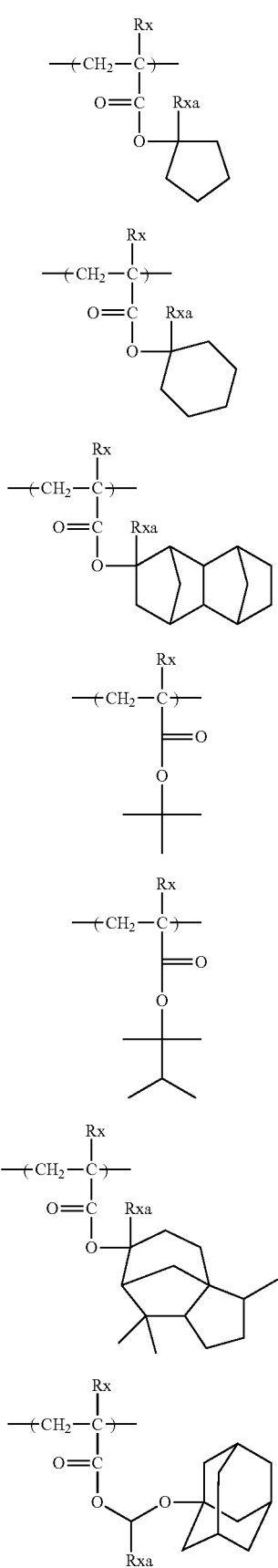
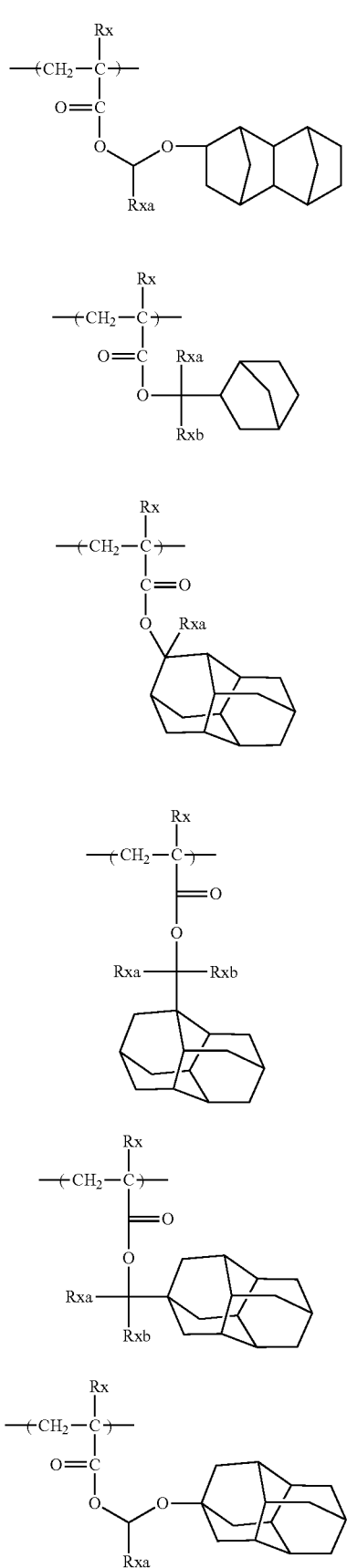

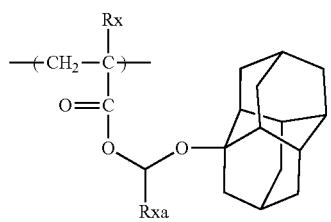

The content of the repeating unit having an acid-decomposable group is preferably from 3 to 95 mol %, more preferably from 5 to 90 mol %, still more preferably from 10 to 85 mol %, based on all repeating units constituting the acid-decomposable resin.

In the case of performing patterning with KrF excimer laser light, electron beam, X-ray or high-energy beam at a wavelength of 50 nm or less (e.g., EUV), particularly with KrF excimer laser light, by using the composition of the present invention, the acid-decomposable resin preferably contains a repeating unit having an aromatic group.

The acid-decomposable group may contain a repeating unit having an alkali-soluble group such as hydroxyl group, carboxy group and sulfonic acid group, together with the repeating unit represented by formula (IA) such as hydroxystyrene protected by a group capable of leaving by the action of an acid or the repeating unit represented by formula (IB) such as tertiary alkyl(meth)acrylate.

The acid-decomposable resin preferably contains, as the alkali-soluble group-containing repeating unit, a repeating unit represented by the following formula (IIIA) such as hydroxystyrene.

(c) The acid-decomposable resin is more preferably a resin containing a repeating unit represented by the following formula (IIIA) together with the repeating unit represented by formula (IA) or (IB).

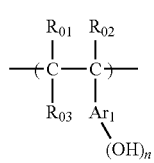 (IIIA)

In formula (IIIA), $R_{01}$, $R_{02}$, $R_{03}$, $Ar_1$ and n are the same as those in formula (IA).

Specific preferred examples of the repeating unit represented by formula (IIIA) are illustrated below, but the present invention is not limited thereto.

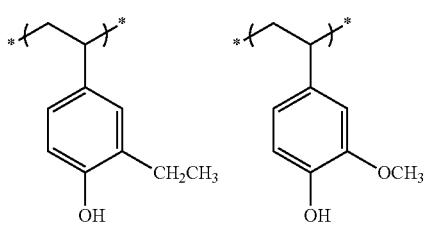

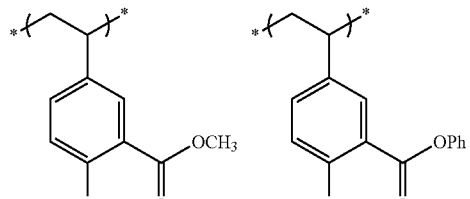

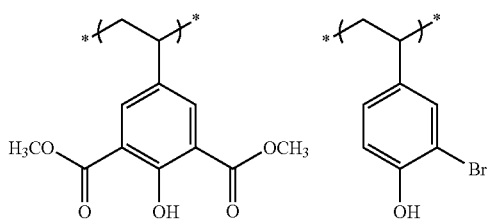

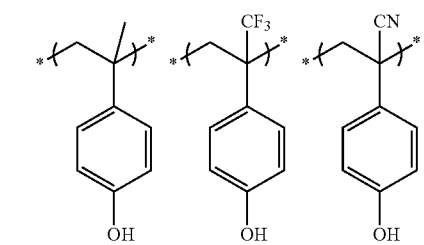

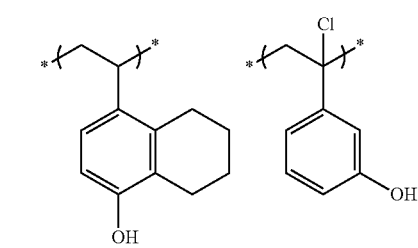

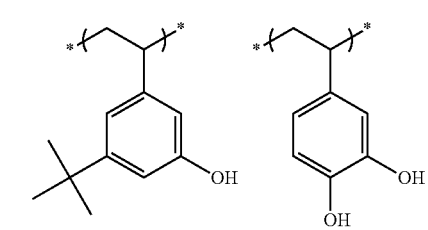

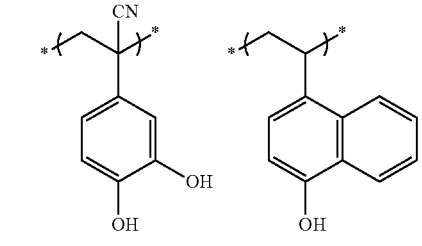

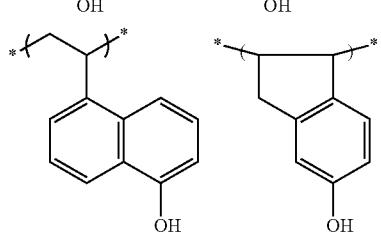

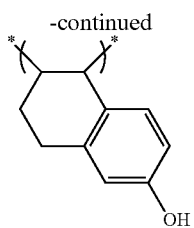

The content of the repeating unit having an alkali-soluble group is preferably from 1 to 99 mol %, more preferably from 3 to 95 mol %, still more preferably from 5 to 90 mol %, based on all repeating units constituting the acid-decomposable resin.

(d) The acid-decomposable resin may further contain a repeating unit stable to the action of an acid, in addition to the above-described repeating units. By further containing a repeating unit stable to the action of an acid, for example, control of the contrast or enhancement of the etching resistance can be expected. Such a repeating unit includes, for example, a repeating unit represented by the following formula (IV):

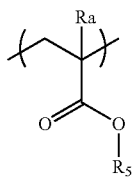

In formula (IV), Ra represents a hydrogen atom, an alkyl group or a cyano group.

$R_5$ represents a hydrocarbon group.

In formula (IV), the alkyl group as Ra may further have a substituent. Examples of the substituent include a halogen atom such as fluorine atom and chlorine atom, and a hydroxy group. Examples of the alkyl group of Ra include a methyl group, a chloromethyl group, a trifluoromethyl group and a hydroxymethyl group. Ra is preferably a hydrogen atom or a methyl group.

The hydrocarbon group of $R_5$ preferably contains a ring structure. In this case, specific examples include a monocyclic or polycyclic cycloalkyl group (preferably having a carbon number of 3 to 12, more preferably from 3 to 7), a monocyclic or polycyclic cycloalkenyl group (preferably having a carbon number of 3 to 12), an aryl group (preferably having a carbon number of 6 to 20, more preferably from 6 to 12), and an aralkyl group (preferably having a carbon number of 7 to 20, more preferably from 7 to 12).

The cycloalkyl group above includes a ring gathered hydrocarbon group (such as bicyclohexyl group) and a crosslinked cyclic hydrocarbon group. Examples of the crosslinked cyclic hydrocarbon group include a bicyclic hydrocarbon group, a tricyclic hydrocarbon group and a tetracyclic hydrocarbon group. The crosslinked cyclic hydrocarbon group also includes a condensed ring formed by condensing, for example, a plurality of 5- to 8-membered cycloalkane rings.

Preferred examples of the crosslinked cyclic hydrocarbon group include a norbornyl group, an adamantyl group, a bicyclooctanyl group and a tricyclo[5,2,1,0$^{2,6}$]decanyl group. Of these crosslinked cyclic hydrocarbon groups, a norbornyl group and an adamantyl group are more preferred.

Preferred examples of the aryl group include a phenyl group, a naphthyl group and a biphenyl group, and preferred examples of the aralkyl group include a phenylmethyl group, a phenylethyl group and a naphthylmethyl group.

Such a hydrocarbon group may further have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group.

The content of the repeating unit represented by formula (IV) is preferably from 0 to 40 mol %, more preferably from 0 to 20 mol %, still more preferably from 1 to 15 mol %, based on all repeating units in the acid-decomposable resin.

Specific examples of the repeating unit represented by formula (IV) are illustrated below, but the present invention is not limited thereto. In the formulae, Ra represents a hydrogen atom, an alkyl group or a cyano group.

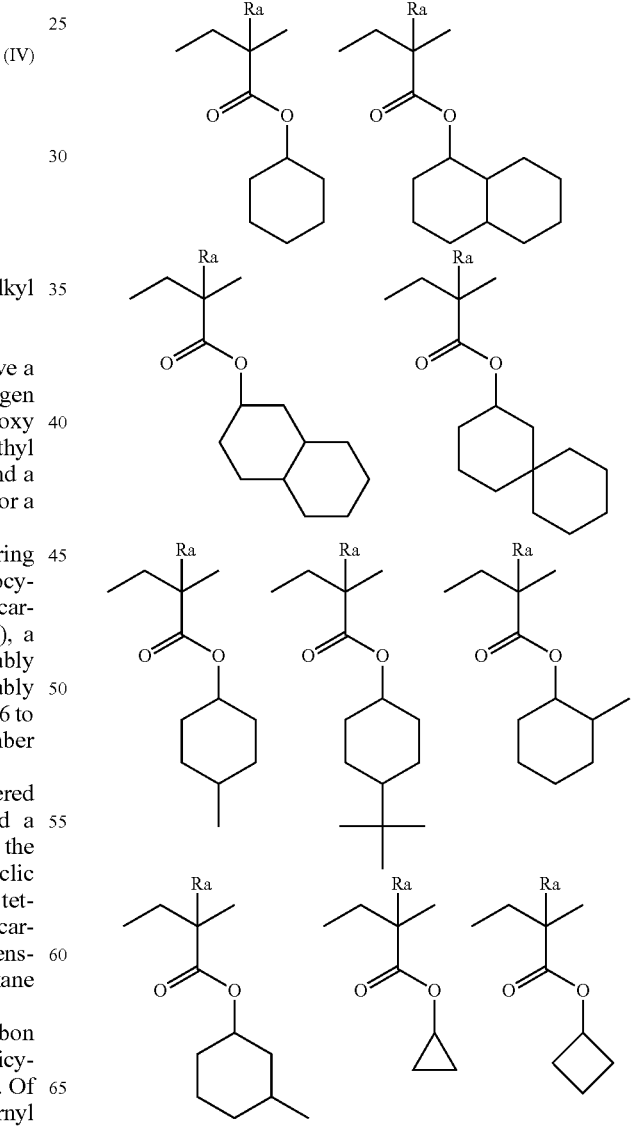

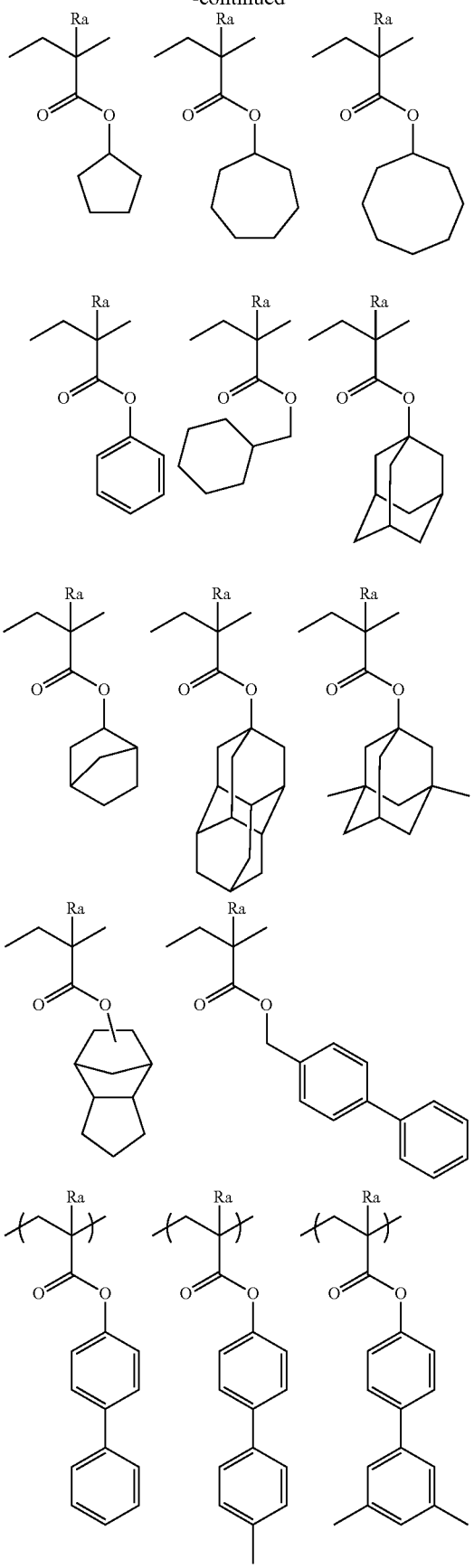
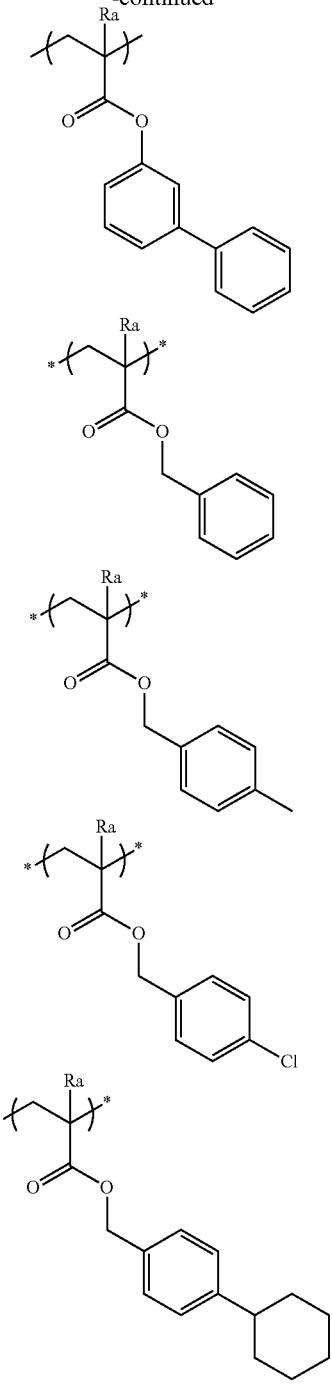

(e) The acid-decomposable resin preferably further contains a repeating unit having a development auxiliary group, that is, a group capable of decomposing by the action of an alkali developer to increase the solubility in an alkali developer. In this case, the development auxiliary group decomposes at the time of alkali development and the dissolution rate in the alkali developer increases.

The development auxiliary group is, for example, a group that decomposes with an alkali developer to produce a hydrophilic functional group. Examples of the hydrophilic functional group include an alkali-soluble group such as carboxy group and hydroxyl group.

Examples of the development auxiliary group include a lactone structure-containing group, a carboxylic acid ester group substituted with a polar group such as halogen atom, an acid anhydride structure-containing group, a cyclic amide structure-containing group, an acid amide group, a carboxylic acid thioester group, a carbonic acid ester group, a sulfuric acid ester group and a sulfonic acid ester group. A group having at least one partial structure of a lactone structure, a cyclic amide structure and a cyclic acid anhydride structure is preferred, and a lactone group is more preferred.

Incidentally, a carboxylic acid ester group not substituted with a polar group such as halogen atom (for example, an ester directly bonded to the main chain of a (meth)acrylate repeating unit and not substituted with a halogen atom) is low in the rate of decomposition reaction with an alkali developer and therefore, such a carboxylic acid ester group is not included in the development auxiliary group.

As for the lactone structure-containing group, a 5- to 7-membered ring lactone structure is preferred, and a structure where another ring structure is condensed to a 5- to 7-membered ring lactone structure in the form of forming a bicyclo or spiro structure is more preferred.

The repeating unit having a development auxiliary group is preferably a repeating unit having a lactone structure represented by any one of the following formulae (LC1-1) to (LC1-17). The lactone structure-containing group may be bonded directly to the main chain. Preferred lactone structures are (LC1-1), (LC1-4), (LC1-5), (LC1-6), (LC1-13), (LC1-14) and (LC1-17). By using a specific lactone structure, the line edge roughness and development defect can be more reduced.

LC1-1

LC1-2

LC1-3

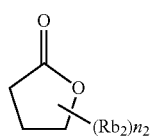

LC1-4

LC1-5

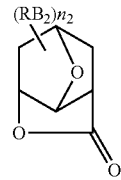

LC1-6

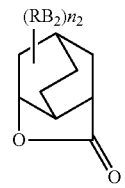

LC1-7

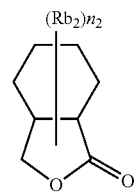

LC1-8

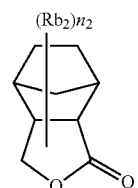

LC1-9

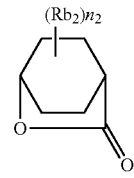

LC1-10

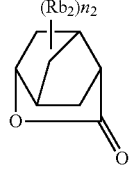

LC1-11

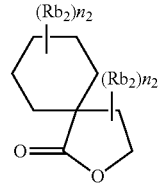

LC1-12

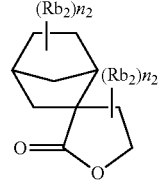

LC1-13

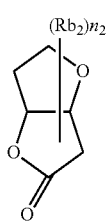

LC1-14

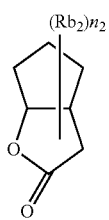

LC1-15

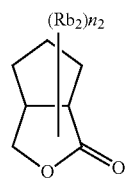

LC1-16

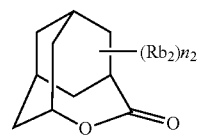

LC1-17

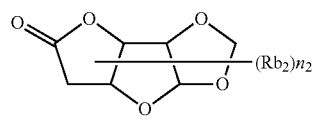

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group.

$n_2$ represents an integer of 0 to 4. When $n_2$ is an integer of 2 or more, each substituent ($Rb_2$) may be the same as or different from every other substituent ($Rb_2$). Also, in this case, the plurality of substituents ($Rb_2$) may combine with each other to form a ring.

The repeating unit having a lactone structure represented by any one of formulae (LC1-1) to (LC1-17) includes a repeating unit represented by the following formula (IIB):

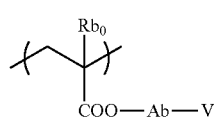

(IIB)

In formula (IIB), $Rb_0$ represents a hydrogen atom, a halogen atom or an alkyl group having a carbon number of 1 to 4.

Preferred examples of the substituent which the alkyl group of $Rb_0$ may have include a hydroxyl group and a halogen atom. This halogen atom includes a fluorine atom, a chlorine atom, a bromine atom and an iodine atom.

$Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a combination thereof. Ab is preferably a single bond or a linking group represented by -$Ab_1$-$CO_2$—. $Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group represented by any one of formulae (LC1-1) to (LC1-17).

The lactone structure-containing repeating unit usually has an optical isomer, but any optical isomer may be used. One optical isomer may be used alone or a mixture of a plurality of optical isomers may be used. In the case of mainly using one optical isomer, the optical purity thereof is preferably 90% ee or more, more preferably 95% ee or more.

Particularly preferred repeating units having a lactone group include the following repeating units. By selecting an optimal lactone group, the pattern profile and iso/dense bias can be more improved. In the formulae, each of Rx and R represents H, $CH_3$, $CH_2OH$ or $CF_3$.

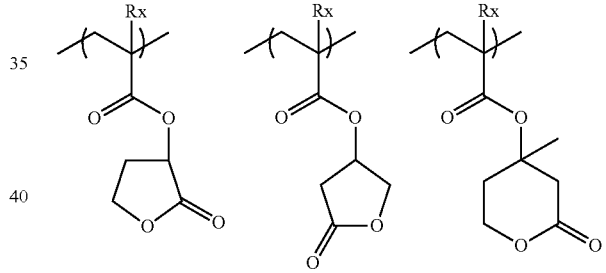

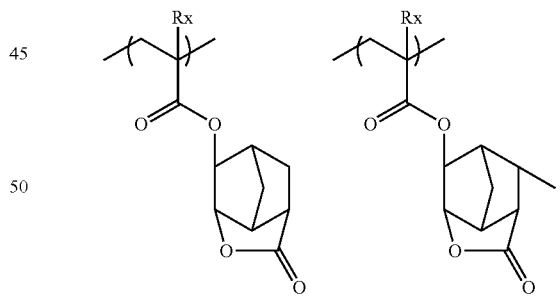

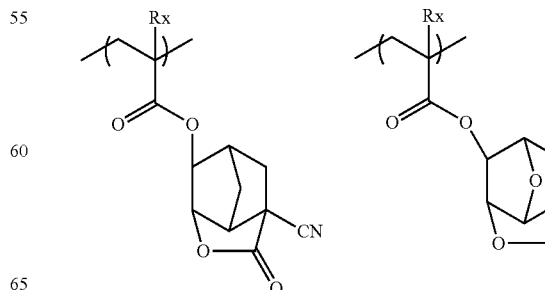

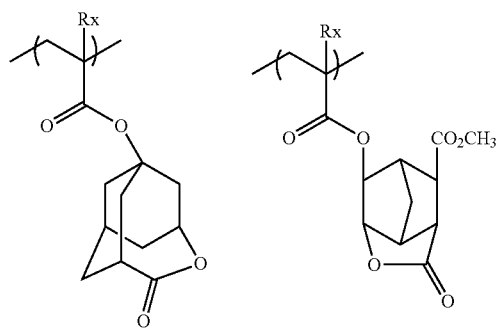
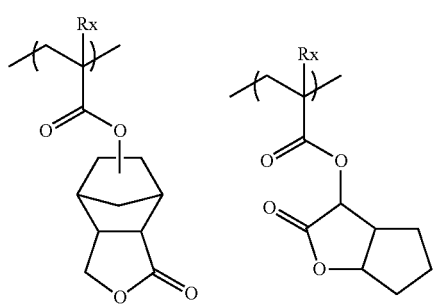
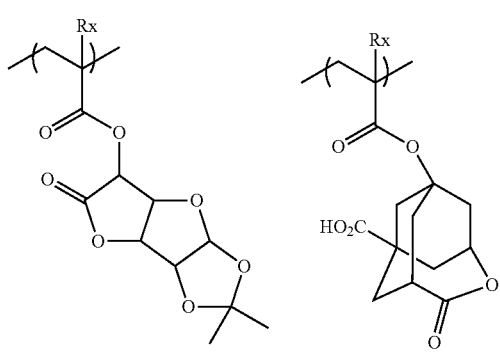
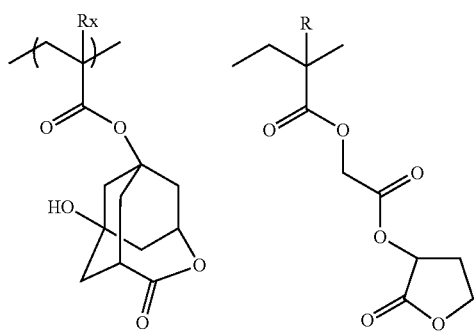
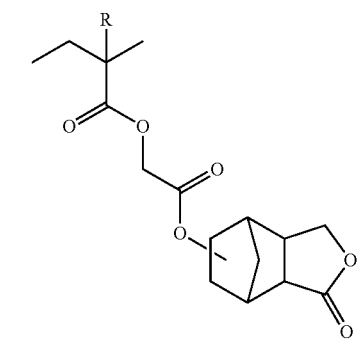
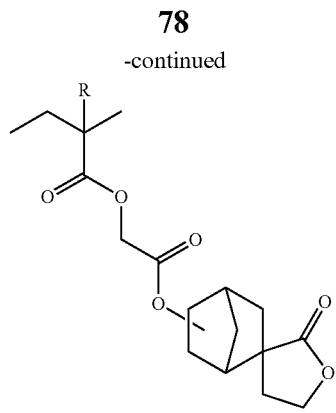
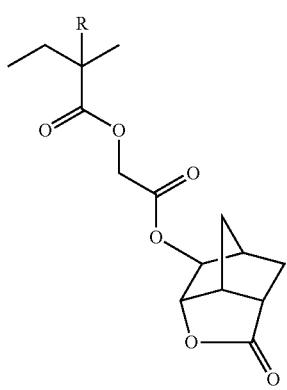
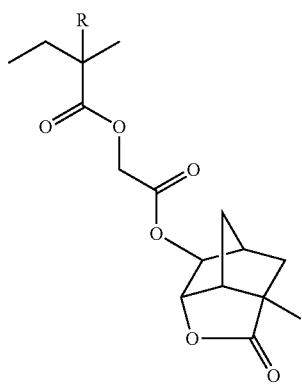
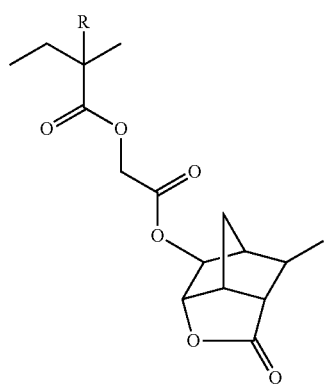

79
-continued
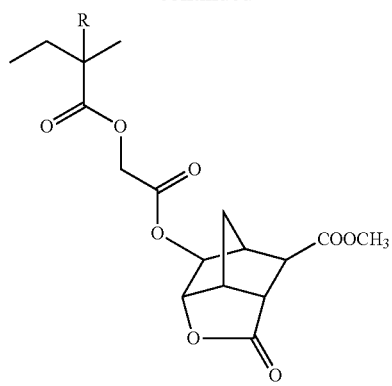
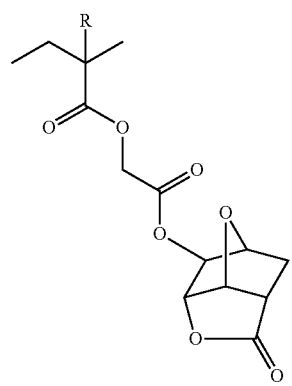
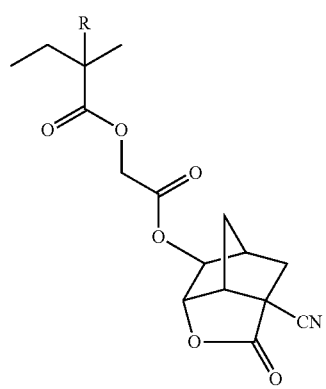
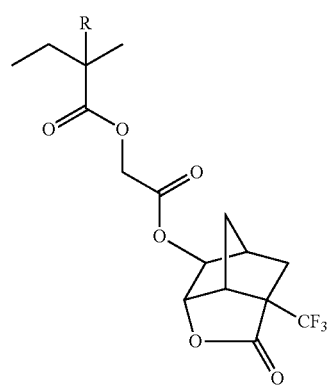
80
-continued
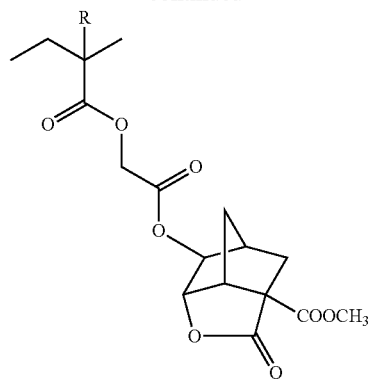
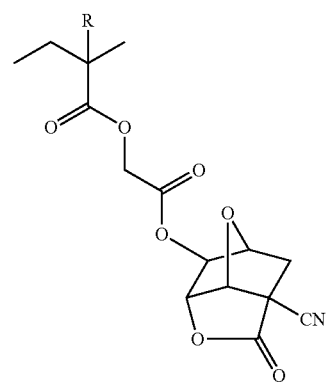
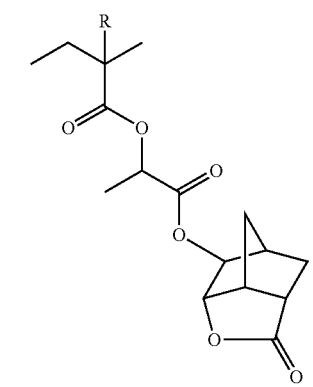
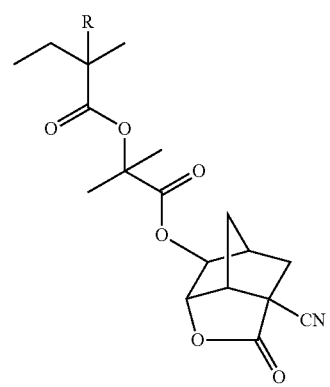

81
-continued
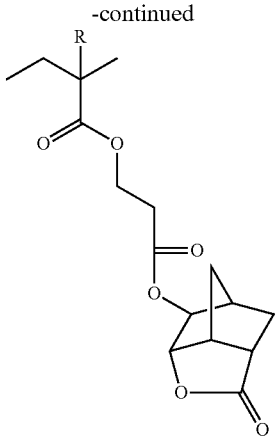
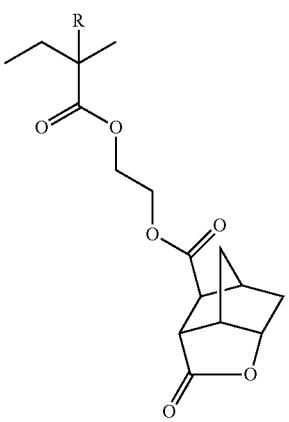
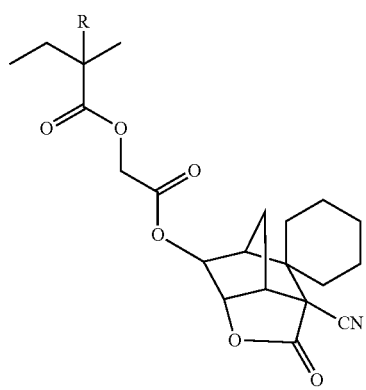
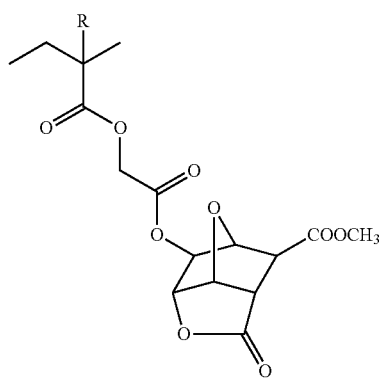
82
-continued
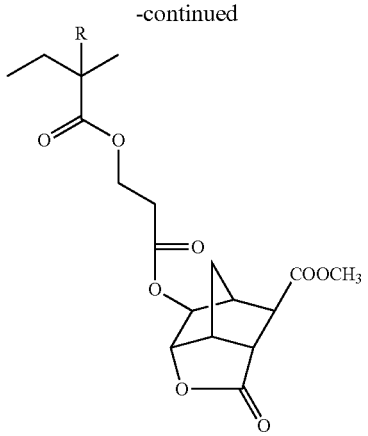
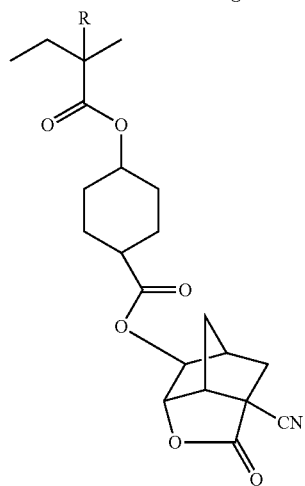
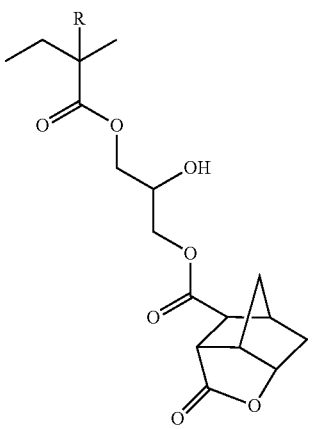
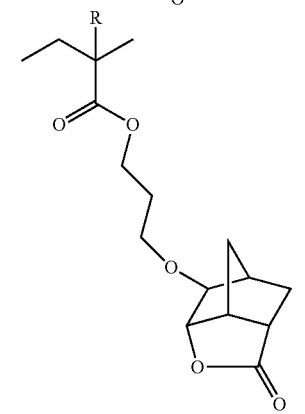

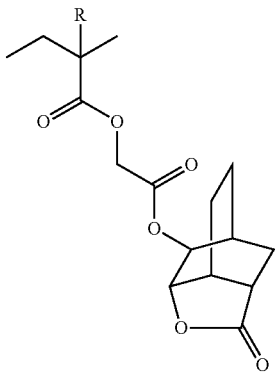

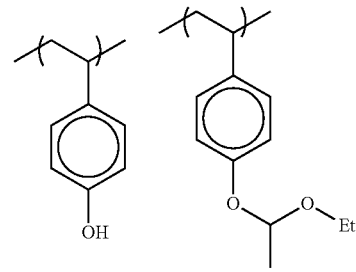

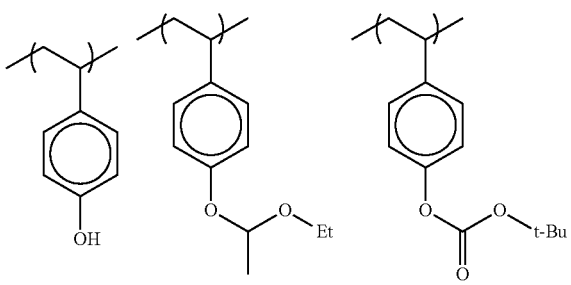

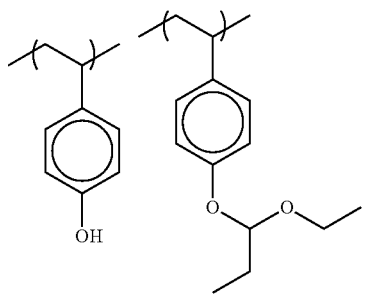

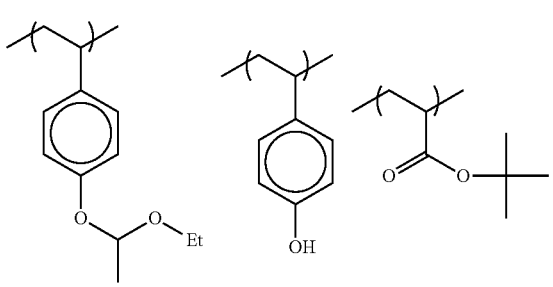

The repeating unit having a development auxiliary group is, for example, a repeating unit where a development auxiliary group is bonded to the side chain of the resin, such as repeating unit by an acrylic acid ester or a methacrylic acid ester. Alternatively, this repeating unit may be introduced into the terminal of the resin by using a development auxiliary group-containing polymerization initiator or chain transfer agent at the polymerization.

The content of the repeating unit having a development auxiliary group in the acid-decomposable resin is preferably from 1 to 40 mol %, more preferably from 3 to 30 mol %, still more preferably from 5 to 15 mol %, based on all repeating units.

The acid-decomposable resin may contain other repeating units. Other repeating units include, for example, a repeating unit derived from a compound having at least one addition-polymerizable unsaturated bond selected from (meth)acrylic acid esters, (meth)acrylamides, allyl compounds, vinyl ethers, vinyl esters, styrenes and crotonic acid esters. In addition, the repeating unit includes repeating units derived from maleic anhydride, maleimide, acrylonitrile, methacrylonitrile and maleylonitrile.

The content of other repeating units is generally 50 mol % or less, preferably 30 mol % or less, based on all repeating units.

The weight average molecular weight of the acid-decomposable resin is preferably 50,000 or less, more preferably from 1,000 to 50,000, still more preferably from 1,000 to 25,000, in terms of polystyrene by the GPC method (solvent: THF).

The polydispersity (Mw/Mn) of the acid-decomposable resin is preferably from 1.0 to 3.0, more preferably from 1.05 to 2.0, still more preferably from 1.1 to 1.7.

The amount of the acid-decomposable resin added is not particularly limited but is, in terms of the total amount, preferably from 20 to 99 mass %, more preferably from 30 to 98 mass %, based on the entire solid content of the actinic ray-sensitive or radiation-sensitive resin composition.

Also, two or more kinds of acid-decomposable resins may be used in combination.

Specific preferred examples of the acid-decomposable resin are illustrated below, but the present invention is not limited thereto.

R-5
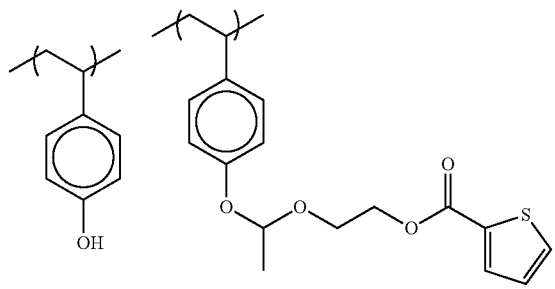
R-6
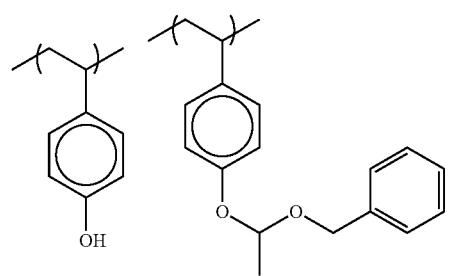
R-7
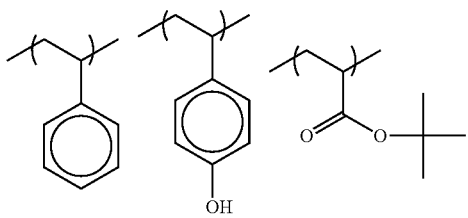
R-8
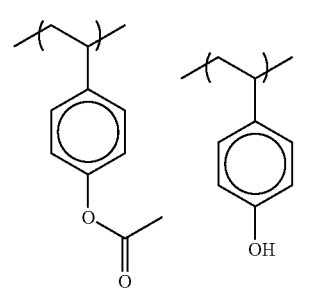
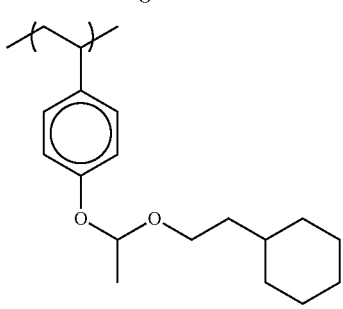
R-9
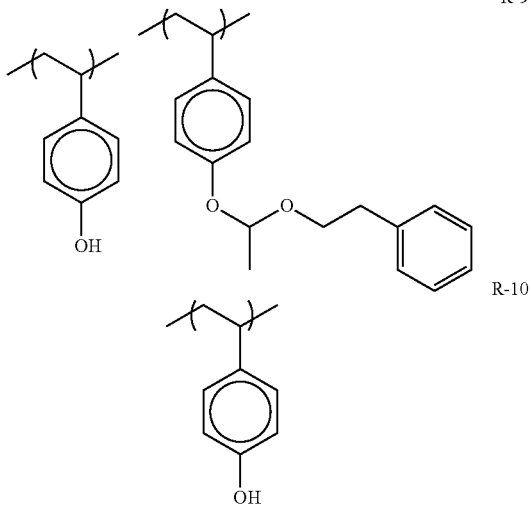
R-10
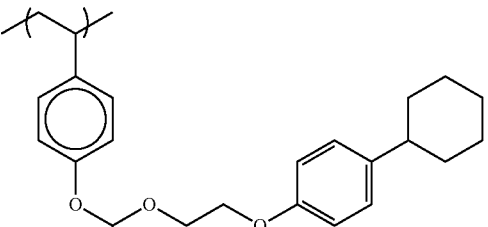
R-11
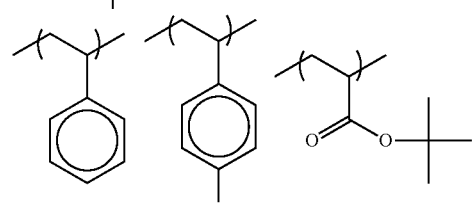
R-12
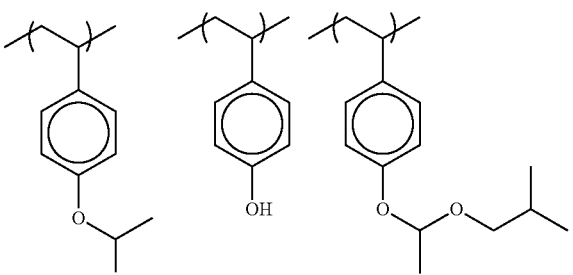
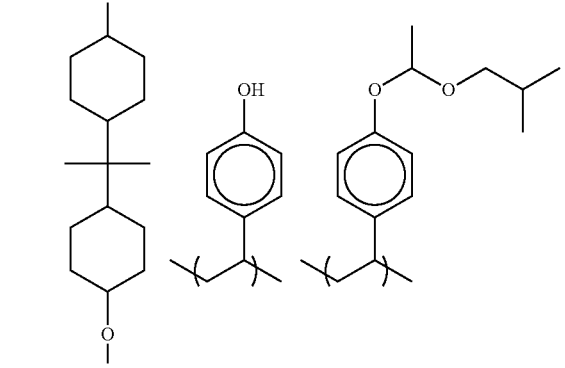

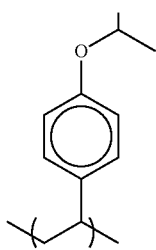
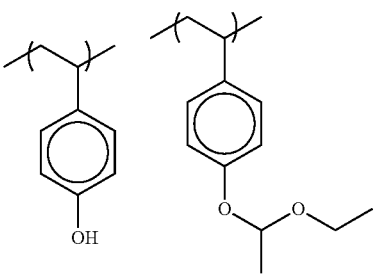

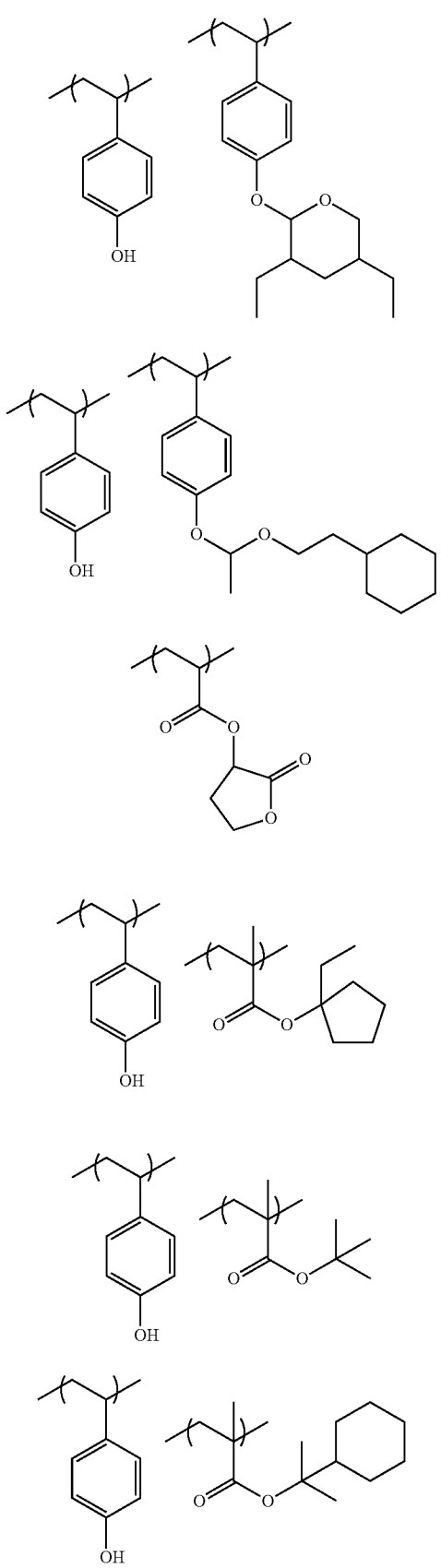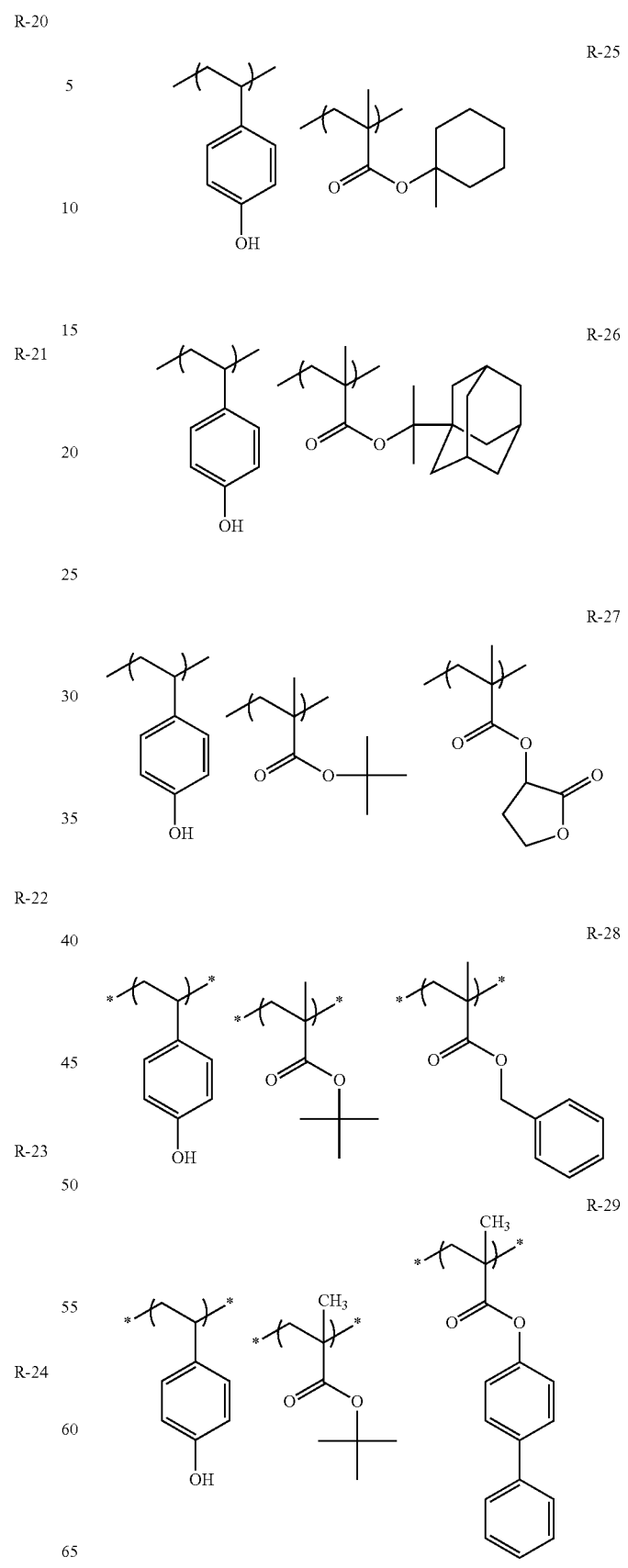

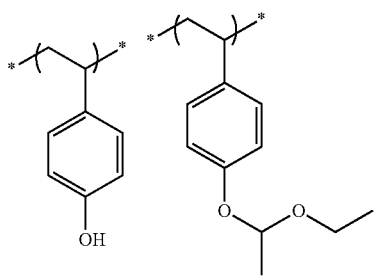

R-30

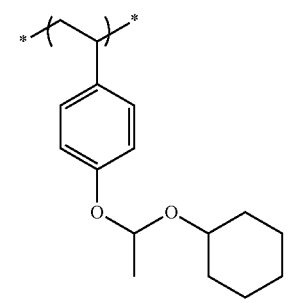

R-31

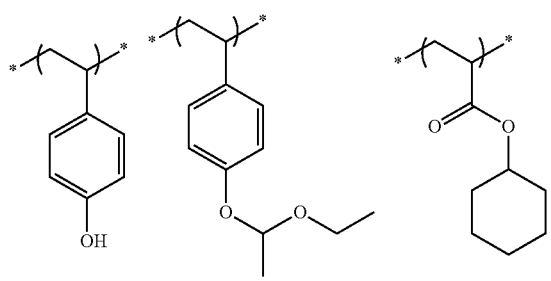

R-32

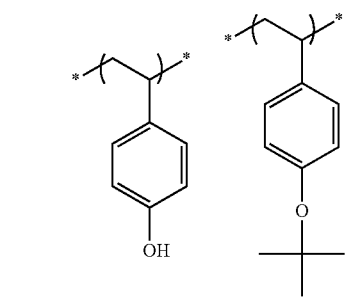

R-33

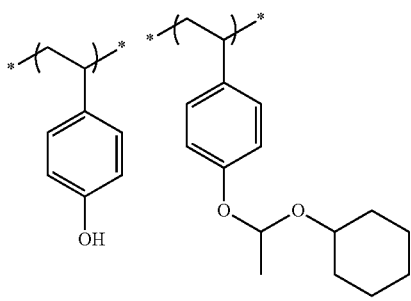

[3] (C) Compound Capable of Generating Acid Upon Irradiation with Actinic Ray or Radiation The actinic ray-sensitive or radiation-sensitive resin composition of the present invention contains a compound capable of generating an acid upon irradiation with an actinic ray or radiation (hereinafter, sometimes referred to as a "photoacid generator").

The photoacid generator which can be used may be appropriately selected from a photo-initiator for cationic photopolymerization, a photo-initiator for radical photopolymerization, a photo-decoloring agent for dyes, a photo-discoloring agent, a known compound that generates an acid upon irradiation with an actinic ray or radiation and is used for microresist or the like, and a mixture thereof. Examples thereof include an onium salt such as sulfonium salt and iodonium salt, and a diazodisulfone compound such as bis(alkylsulfonyl diazomethane), and a sulfonium salt and a diazodisulfone compound are preferred. The acid generated from the photoacid generator is preferably a sulfonic acid.

The photoacid generator includes, for example, [Ca] a compound capable of generating a fluorine atom-containing acid upon irradiation with an actinic ray or radiation (hereinafter, sometimes referred to as a "fluorine-based photoacid generator") and [Cb] a compound capable of generating a fluorine atom-free acid upon irradiation with an actinic ray or radiation (hereinafter, sometimes referred to as a "non-fluorine-based photoacid generator"). These are described in sequence below.

Incidentally, as for the photoacid generator, a combination of two or more kinds of fluorine-based photoacid generators may be used, a combination of two or more kinds of non-fluorine-based photoacid generators may be used, or a combination of one or more kinds of fluorine-based photoacid generators and one or more kinds of non-fluorine-based photoacid generators may be used.

[Ca] Fluorine-Based Photoacid Generator

The fluorine-based photoacid generator is a compound capable of generating a fluorine atom-containing acid upon irradiation with an actinic ray or radiation and is characterized in that the acid strength of the acid generated is high and the reactivity for deprotection of the acid-decomposable group in the acid-decomposable resin is high.

The fluorine-based photoacid generator is preferably an onium salt.

The cation of the onium salt is preferably a sulfonium cation or an iodonium cation.

The counter anion of the onium cation is preferably a sulfonate anion containing a fluorine atom. The counter anion is more preferably an alkylsulfonate anion substituted with a fluorine atom or an arylsulfonate anion substituted with a fluorine atom or an alkyl fluoride group, still more preferably an alkylsulfonate anion substituted with a fluorine atom.

The alkylsulfonate anion substituted with a fluorine atom is preferably a perfluoroalkylsulfonate anion having a carbon number of 1 to 8, more preferably a perfluoroalkylsulfonate anion having a carbon number of 2 to 6.

The aryl group of the arylsulfonate anion above is preferably a phenyl group.

The counter anion may have a substituent other than a fluorine atom or an alkyl fluoride group. Specific examples of the substituent include an alkyl group, a cycloalkyl group, an alkoxy group and an alkylthio group, but the substituent is not particularly limited.

Preferred examples of the fluorine-based photoacid generator include a compound represented by the following formula (ZI) and a compound represented by formula (ZII):

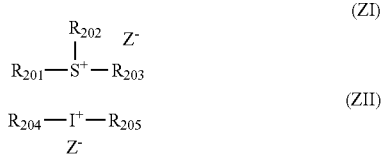

In formulae (ZI) and (ZII), each of $R_{201}$, $R_{202}$ and $R_{203}$ independently represents an organic group.

Each of $R_{204}$ and $R_{205}$ independently represents an aryl group, an alkyl group or a cycloalkyl group.

$Z^-$ represents a non-nucleophilic anion containing a fluorine atom.

The carbon number of the organic group as $R_{201}$, $R_{202}$ and $R_{203}$ is, for example, from 1 to 30, preferably from 1 to 20, and examples of the organic group include an aryl group (preferably having a carbon number of 6 to 15), a linear or branched alkyl group (preferably having a carbon number of 1 to 10), and a cycloalkyl group (preferably having a carbon number of 3 to 15).

Two members out of $R_{201}$ to $R_{203}$ may combine with each other through a single bond or a linking group to form a ring. In this case, examples of the linking group include an ether bond, a thioether bond, an ester bond, an amide bond, a carbonyl group, a methylene group and an ethylene group. Examples of the group formed by combining two members out of $R_{201}$ to $R_{203}$ include an alkylene group such as butylene group and pentylene group.

At least one of three members $R_{201}$, $R_{202}$ and $R_{203}$ is preferably an aryl group, and it is more preferred that these members all are an aryl group. Examples of the aryl group include a phenyl group and a naphthyl group. This aryl group also includes a heteroaryl group such as indole residue structure and pyrrole residue structure.

Each of the aryl group, alkyl group and cycloalkyl group as $R_{201}$, $R_{202}$ and $R_{203}$ may further have a substituent, and examples of the substituent include a nitro group, a halogen atom such as fluorine atom, a carboxy group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7).

Incidentally, two members selected from $R_{201}$, $R_{202}$ and $R_{203}$ may combine through a single bond or a linking group. Examples of the linking group include an alkylene group (preferably having a carbon number of 1 to 3), —O—, —S—, —CO— and —SO$_2$—.

The preferred structure when at least one of $R_{201}$, $R_{202}$ and $R_{203}$ is not an aryl group includes a cation structure such as compounds described in JP-A-2004-233661, paragraphs [0047] and [0048], compounds described in paragraphs [0040] to [0046] of JP-A-2003-35948, Compounds (I-1) to (I-70) illustrated in U.S. Patent Application Publication No. 2003/0224288A1, and compounds illustrated as formulae (IA-1) to (IA-54) and (IB-1) to (IB-24) in U.S. Patent Application Publication No. 2003/0077540A1.

In the case where at least one of $R_{201}$, $R_{202}$ and $R_{203}$ is not an aryl group, the following embodiments (1) and (2) are preferred.

(1) Embodiment where at Least One of $R_{201}$, $R_{202}$ and $R_{203}$ is a Group Represented by Ar—CO—X— and the Remaining Members are a Linear or Branched Alkyl Group or a Cycloalkyl Group Here, Ar represents an aryl group which may have a substituent. Specifically, Ar is the same aryl group as that described for $R_{201}$, $R_{202}$ and $R_{203}$. Ar is preferably a phenyl group which may have a substituent is preferred.

X represents a linear or branched alkylene group which may have a substituent. Specifically, X is preferably an alkylene group having a carbon number of 1 to 6, more preferably an alkylene group having a carbon number of 1 to 3

The carbon number of the above-described linear or branched alkyl group or cycloalkyl is preferably from 1 to 6. Such a group may further have a substituent. It is more preferred that these groups are combined with each other to form a ring (preferably a 5- to 7-membered ring).

(2) Embodiment where at Least One of $R_{201}$, $R_{202}$ and $R_{203}$ is an Aryl Group which May Have a Substituent and the Remaining Members are a Linear or Branched Alkyl Group or a Cycloalkyl Group Examples of the aryl group here include those described above for $R_{201}$, $R_{202}$ and $R_{203}$. The aryl group is preferably a phenyl group or a naphthyl group.

The aryl group preferably has any of a hydroxyl group, an alkoxy group and an alkyl group, as the substituent. The substituent is more preferably an alkoxy group having a carbon number of 1 to 12, still more preferably an alkoxy group having a carbon number of 1 to 6.

The carbon number of the linear or branched alkyl group or cycloalkyl group is preferably from 1 to 6. Such a group may further have a substituent. It is more preferred that these groups are combined with each other to faun a ring (preferably a 5- to 7-membered ring).

As described above, $Z^-$ is a non-nucleophilic anion containing a fluorine atom. Examples of this non-nucleophilic anion include those described above as the counter anion of the onium cation in the fluorine-based photoacid generator.

Incidentally, a compound having a plurality of structures represented by formula (ZI) may be used as the fluorine-based photoacid generator. For example, the acid generator may be a compound having a structure where at least one of $R_{201}$ to $R_{203}$ in the compound represented by formula (ZI) is bonded to at least one of $R_{201}$ to $R_{203}$ in another compound represented by formula (ZI).

The compound represented by formula (ZII) is described below.

Examples of the aryl group, alkyl group and cycloalkyl group of $R_{204}$ and $R_{205}$ in formula (ZII) are the same as those described for $R_{201}$ to $R_{203}$ in formula (Z1). Also, $Z^-$ has the same meaning as that in the compound represented by formula (ZI).

A compound having a plurality of structures represented by formula (ZII) may be used as the fluorine-based photoacid generator. For example, the fluorine-based photoacid generator may be a compound having a structure where at least one of $R_{204}$ and $R_{205}$ in a compound represented by formula (ZII) is bonded to at least one of $R_{204}$ and $R_{205}$ in another compound represented by formula (ZII).

Preferred examples of the fluorine-based photoacid generator are illustrated below, but the present invention is not limited thereto.

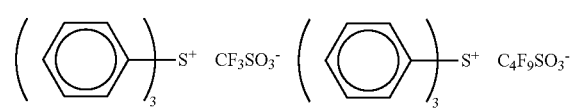
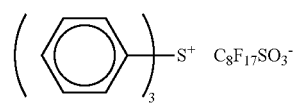
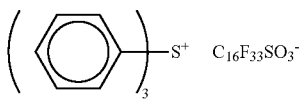
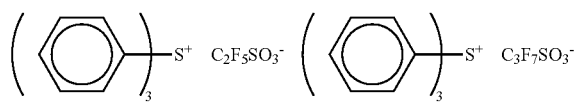
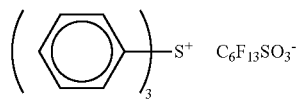
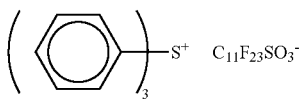
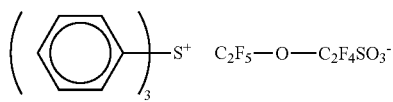
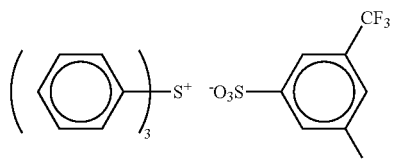
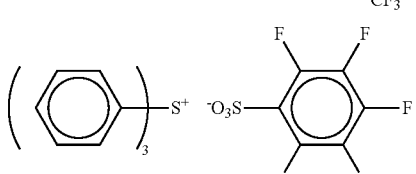
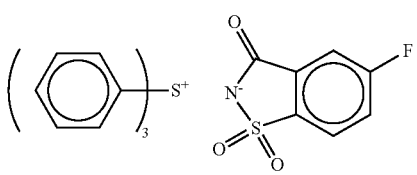
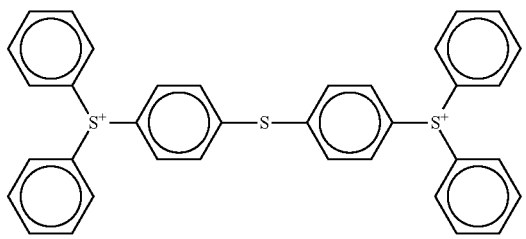
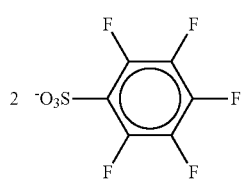
-continued
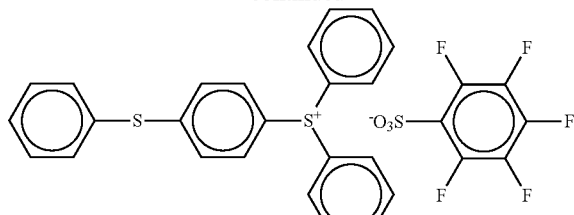
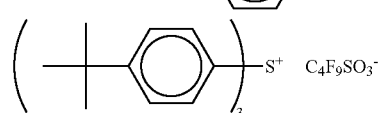
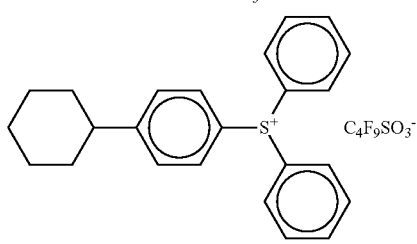
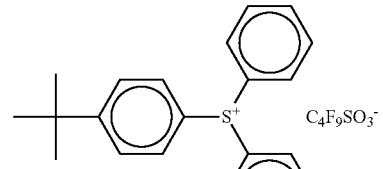
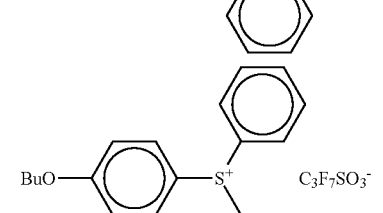
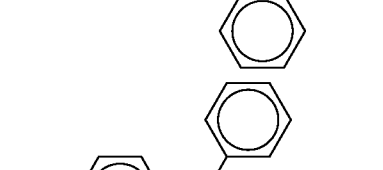
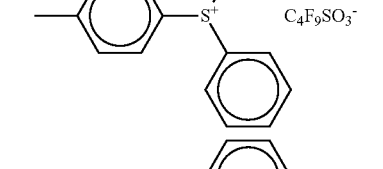
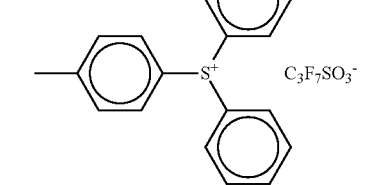
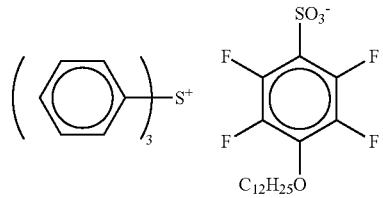

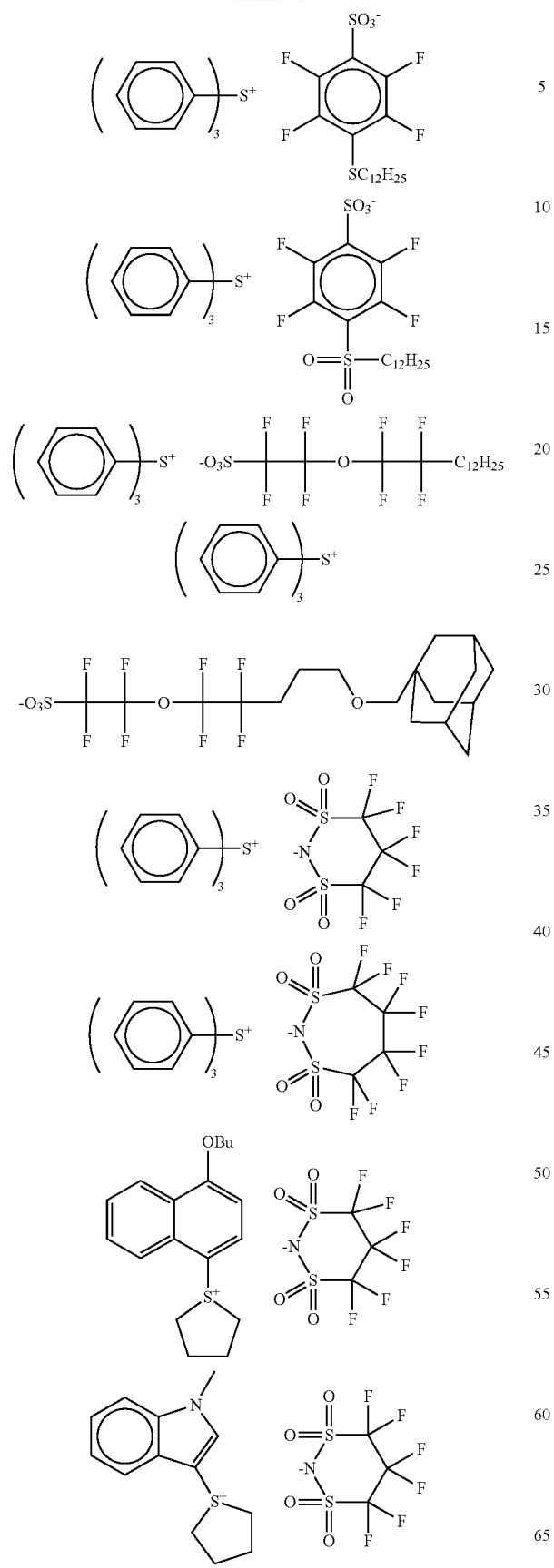
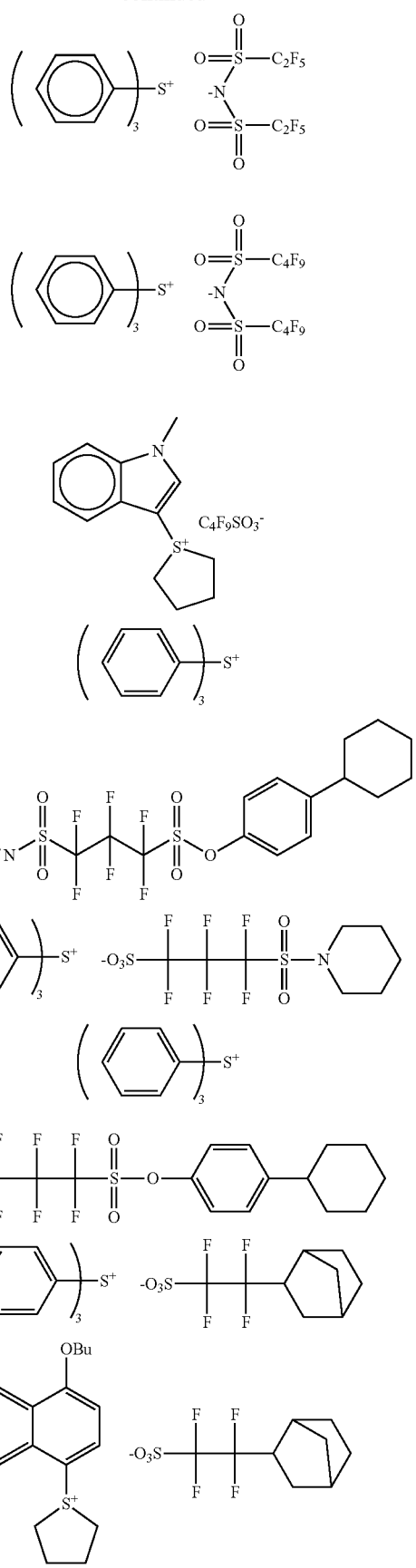

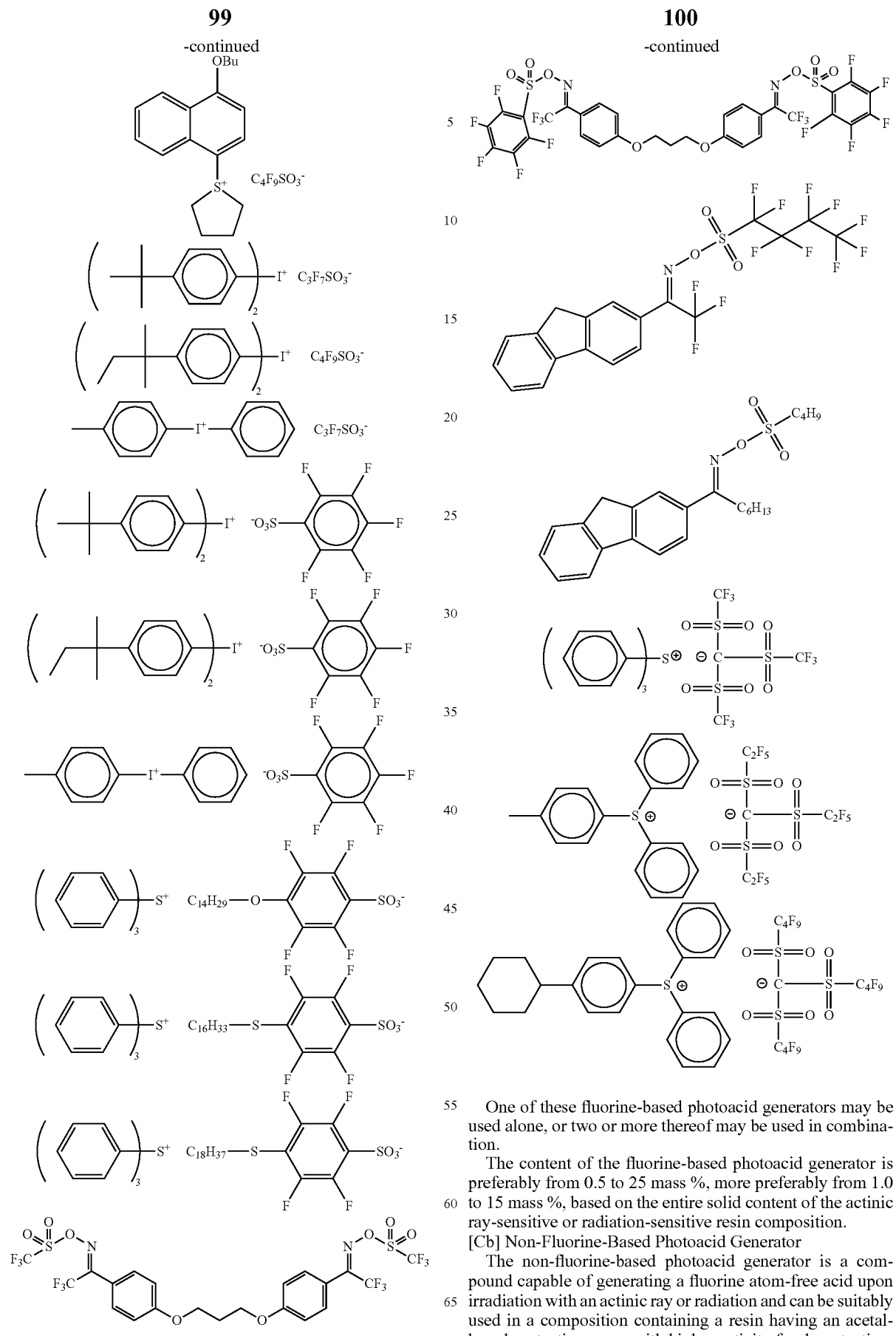

One of these fluorine-based photoacid generators may be used alone, or two or more thereof may be used in combination.

The content of the fluorine-based photoacid generator is preferably from 0.5 to 25 mass %, more preferably from 1.0 to 15 mass %, based on the entire solid content of the actinic ray-sensitive or radiation-sensitive resin composition.

[Cb] Non-Fluorine-Based Photoacid Generator

The non-fluorine-based photoacid generator is a compound capable of generating a fluorine atom-free acid upon irradiation with an actinic ray or radiation and can be suitably used in a composition containing a resin having an acetal-based protective group with high reactivity for deprotection.

The non-fluorine-based photoacid generator is preferably an onium salt or a diazodisulfone compound.

The onium cation of the onium salt is preferably a sulfonium cation or an iodonium cation. The counter anion of the onium cation is preferably a sulfonate anion. The counter anion is more preferably an alkylsulfonate anion or an arylsulfonate anion.

The alkylsulfonate anion is preferably an alkylsulfonate anion having a carbon number of 1 to 30, more preferably an alkylsulfonate anion having a carbon number of 1 to 20.

The aryl group of the arylsulfonate anion is preferably a phenyl group.

The counter anion may have a substituent (excluding a fluorine atom-containing group). Specific examples of the substituent include an alkyl group, a cycloalkyl group, an alkoxy group and an alkylthio group, but the substituent is not particularly limited. The substituent is preferably an alkyl group, more preferably an alkyl group having a carbon number of 1 to 4.

Preferred examples of the non-fluorine-based photoacid generator include a compound represented by the following formula (ZI'), a compound represented by the following formula (ZII'), and a compound represented by the following formula (ZIII'):

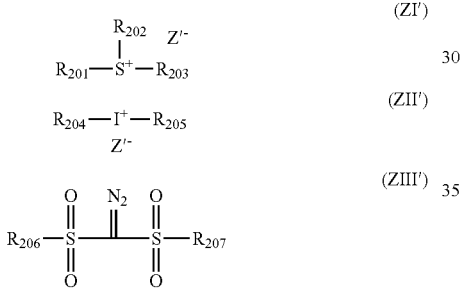

In formulae (ZI') and (ZII'), $R_{201}$ to $R_{205}$ are the same as $R_{201}$ to $R_{205}$ in formulae (ZI) and (ZII).

$Z'^-$ represents a non-nucleophilic anion containing no fluorine atom. Examples of this non-nucleophilic anion include those described above as the counter anion of the onium cation in the non-fluorine-based photoacid generator.

In formula (ZIII'), each of $R_{206}$ and $R_{207}$ represents an alkyl group, a cycloalkyl group or an aryl group. Such a group may further have a substituent (excluding a fluorine atom-containing group).

The alkyl group includes a linear or branched alkyl group having a carbon number of 1 to 16 (preferably from 1 to 10).

The cycloalkyl group includes a monocyclic or polycyclic cycloalkyl group having a carbon number of 6 to 20 (preferably from 6 to 10).

The aryl group includes an aryl group having a carbon number of 6 to 20 (preferably from 6 to 10).

Preferred examples of the non-fluorine-based photoacid generator are illustrated below, but the present invention is not limited thereto.

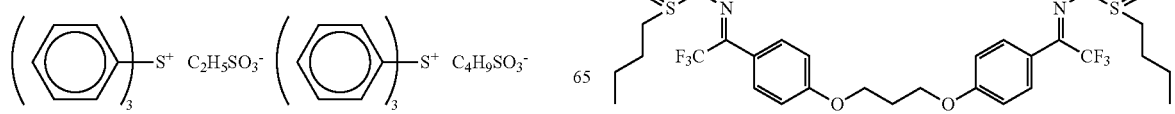

-continued

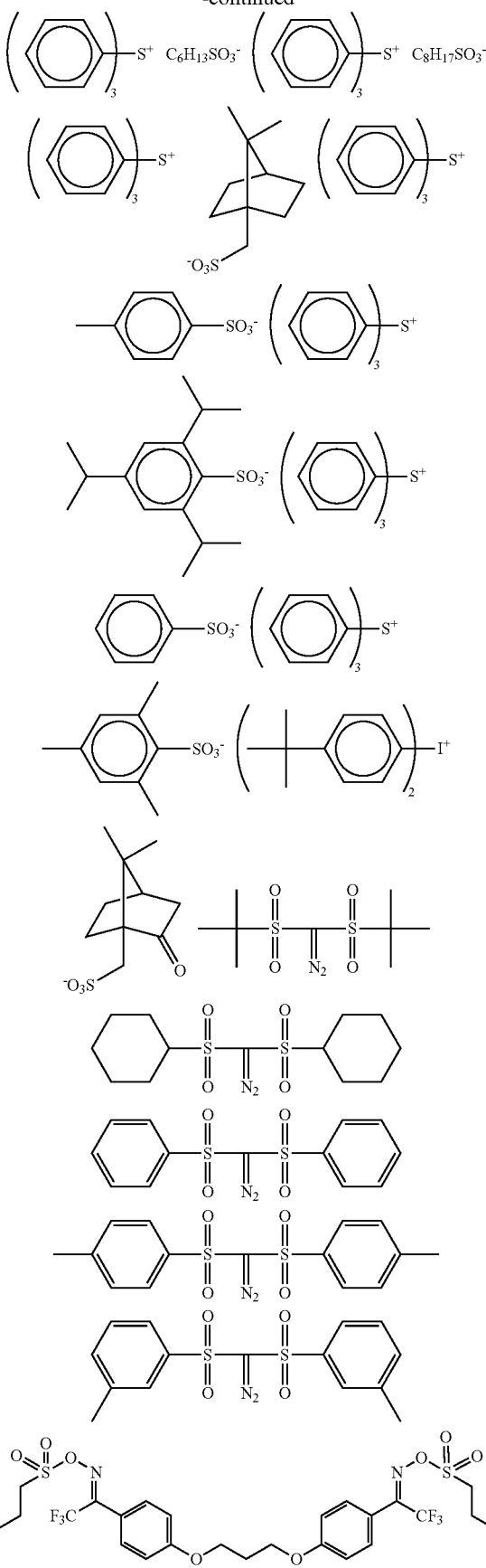

-continued

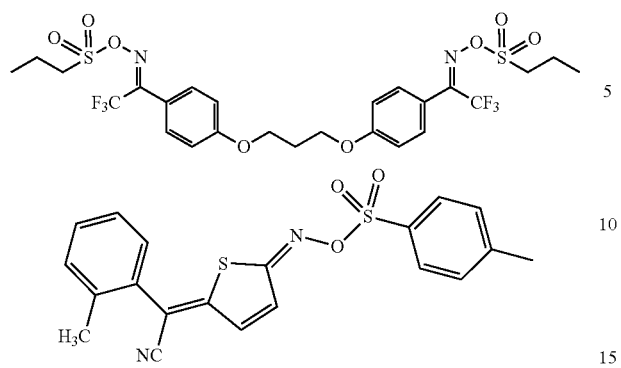

One of these non-fluorine-based photoacid generators may be used alone, or two or more thereof may be used in combination.

The content of the non-fluorine-based photoacid generator is preferably from 0.1 to 10.0 mass %, more preferably from 0.5 to 5.0 mass %, based on the entire solid content of the actinic ray-sensitive or radiation-sensitive resin composition.

As for the photoacid generator, one kind of a photoacid generator may be used alone, or two or more kinds of photoacid generators may be used in combination. In the case of using two or more kinds of photoacid generators in combination, compounds capable of generating two kinds of organic acids differing in the number of all atoms excluding hydrogen atom by 2 or more are preferably combined. In particular, it is preferred to combine the above-described fluorine-based photoacid generator and non-fluorine-based acid generator. In the case of this combination use, the mass ratio between the fluorine-based photoacid generator and the non-fluorine-based photoacid generator is generally from 1:9 to 9:1, preferably from 3:7 to 7:3.

Specific preferred examples of the photoacid generator are illustrated below, but the present invention is not limited thereto.

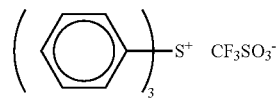 (z1)

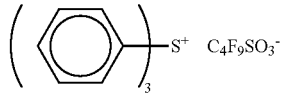 (z2)

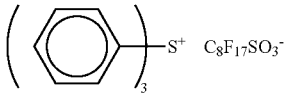 (z3)

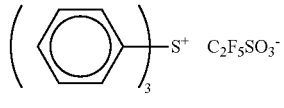 (z4)

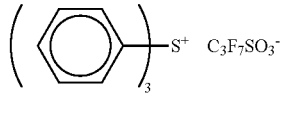 (z5)

-continued

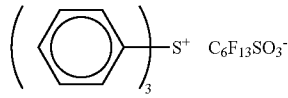 (z6)

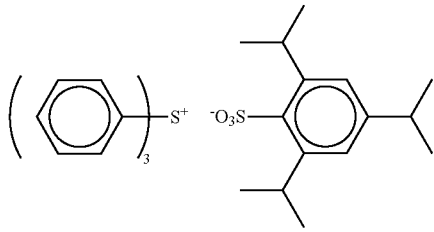 (z7)

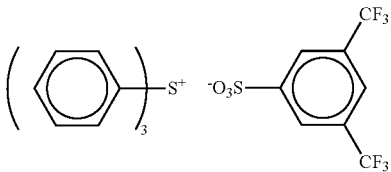 (z8)

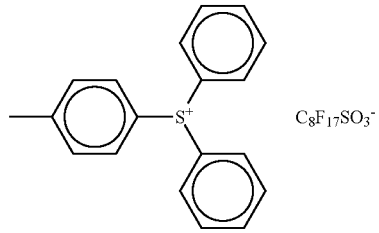 (z9)

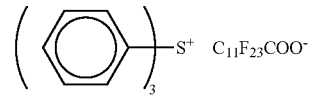 (z10)

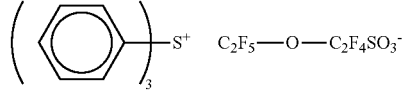 (z11)

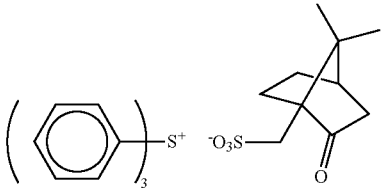 (z12)

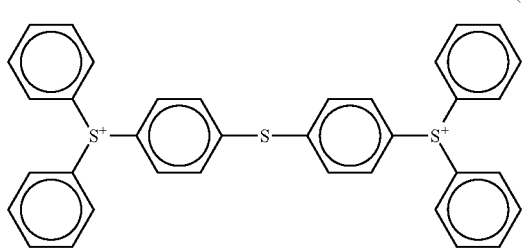 (z13)

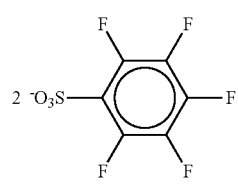

(z14)
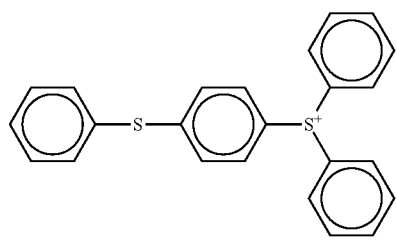
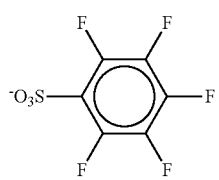
(z15)
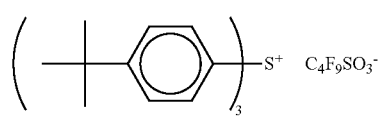
(z16)
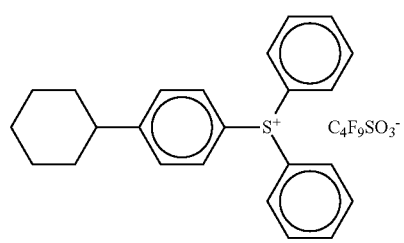
(z17)
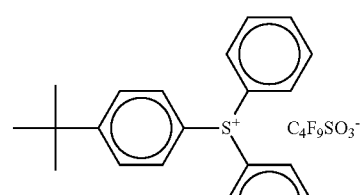
(z18)
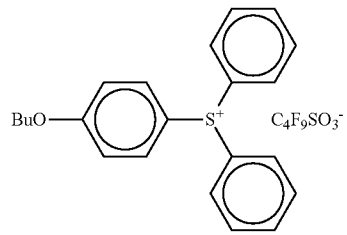
(z19)
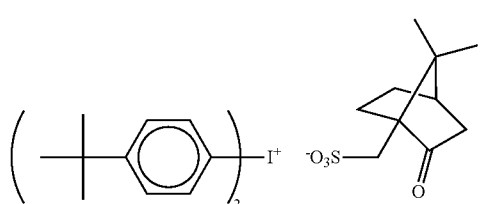
(z20)
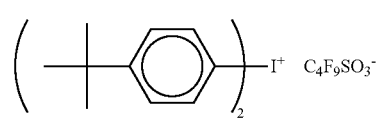
(z21)
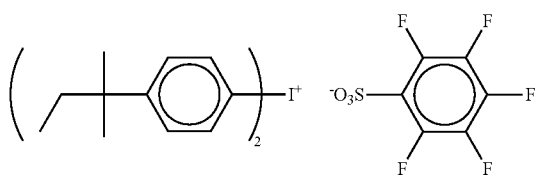
(z22)
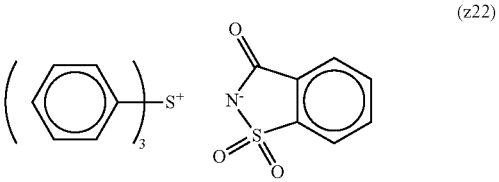
(z23)
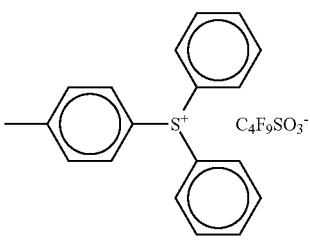
(z24)
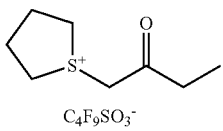
(z25)
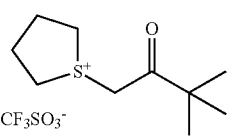
(z26)
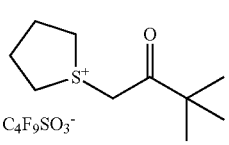
(z27)
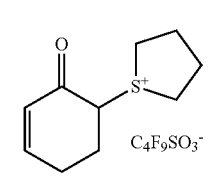
(z28)
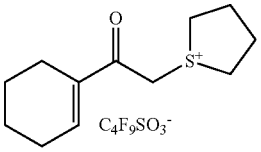
(z29)
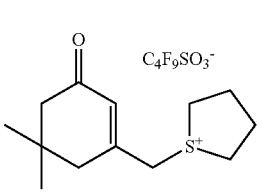

(z30) 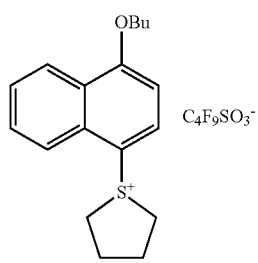
(z31) 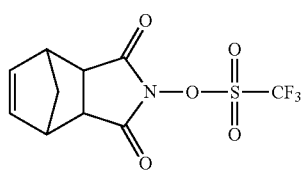
(z32) 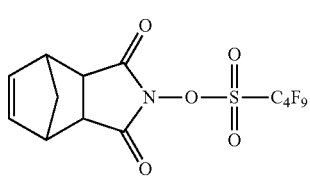
(z33) 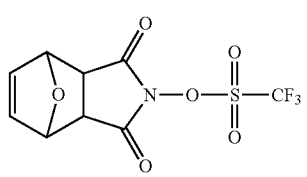
(z34) 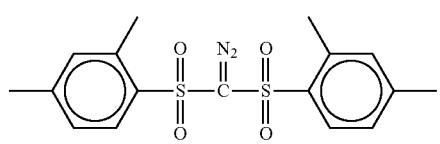
(z35) 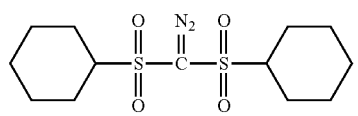
(z36) 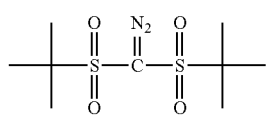
(z37) 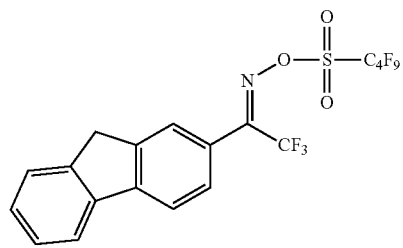
(z38) 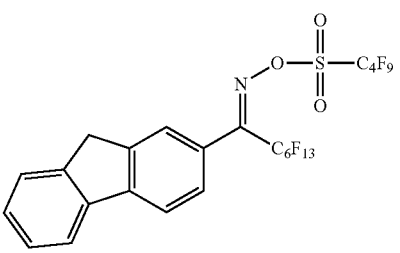
(z39) 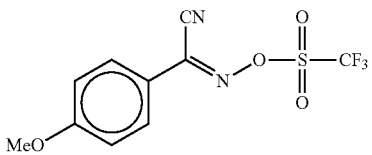
(z40) 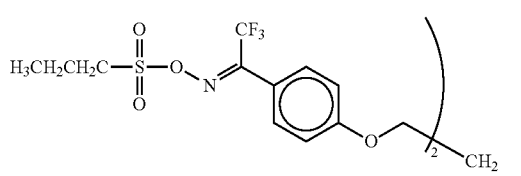
(z41) 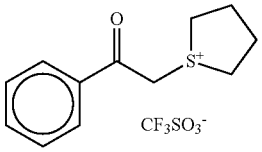
(z42) 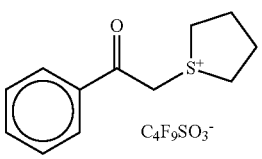
(z43) 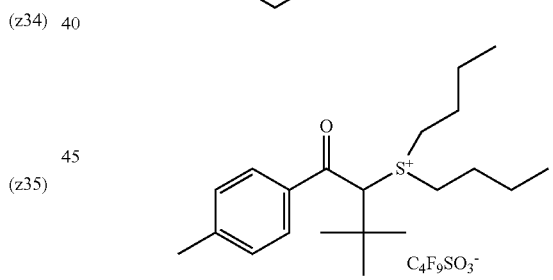
(z44) 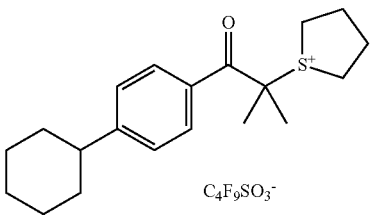
(z45) 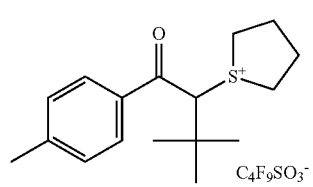

-continued
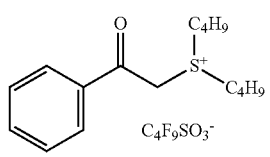 (z46)
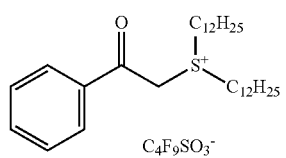 (z47)
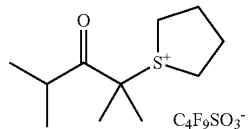 (z48)
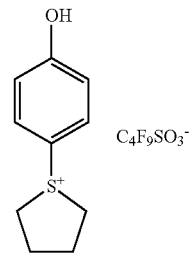 (z49)
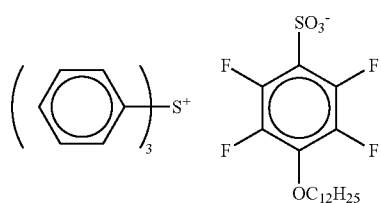 (z50)
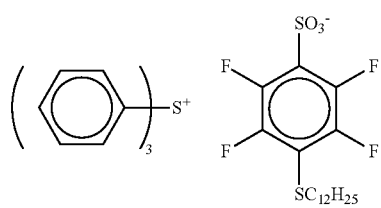 (z51)
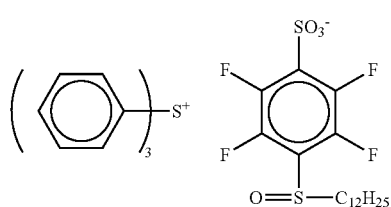 (z52)
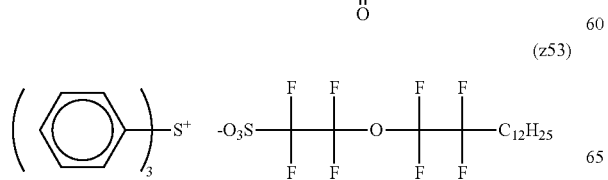 (z53)
-continued
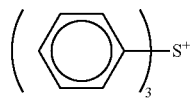 (z54)
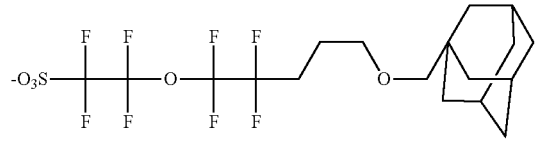 
(z55) 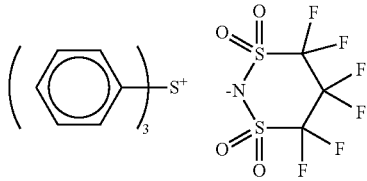
(z56) 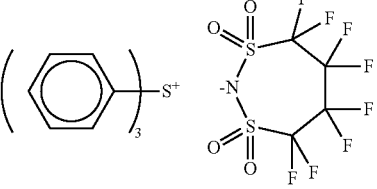
(z57) 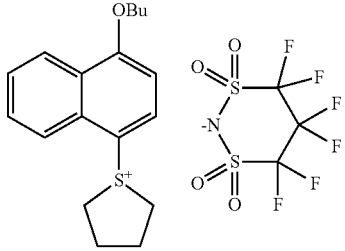
(z58) 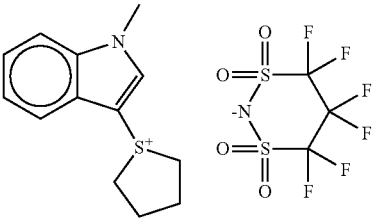
(z59) 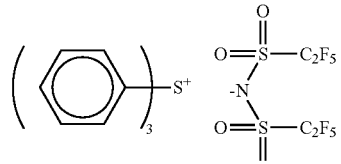
(z60) 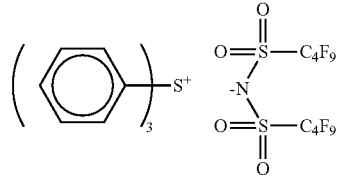

111
-continued
(z61)
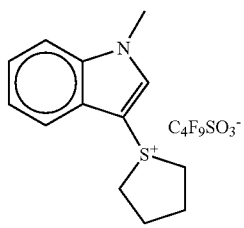
(z62)
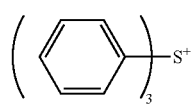
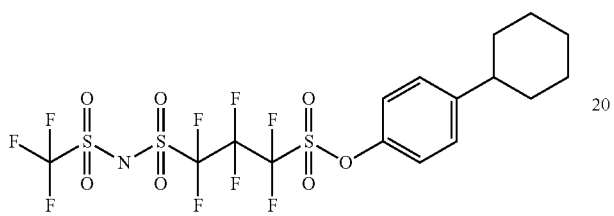
(z63)
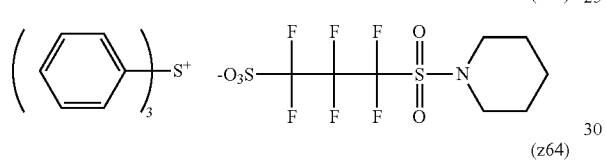
(z64)
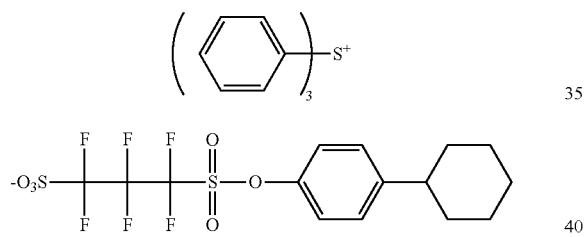
(z65)
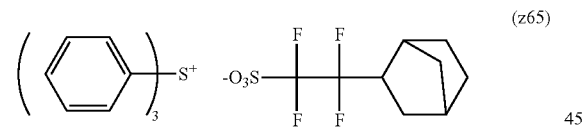
(z66)
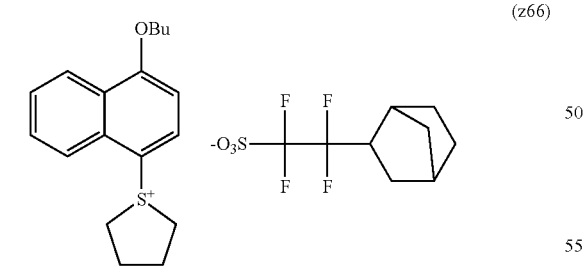
(z67)
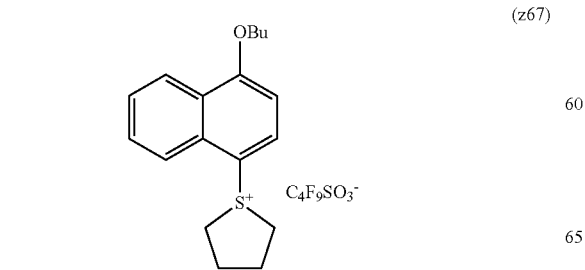
112
-continued
(z68)
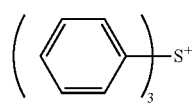
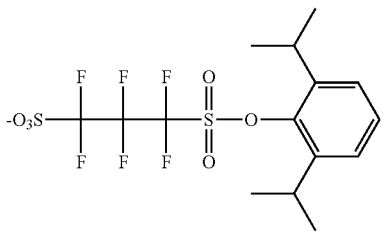
(z69)
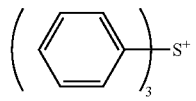
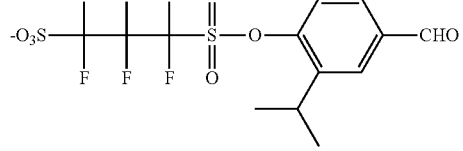
(z70)
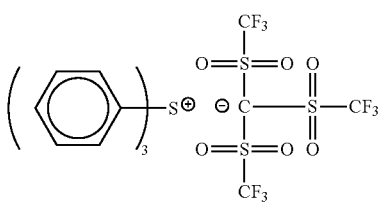
(z71)
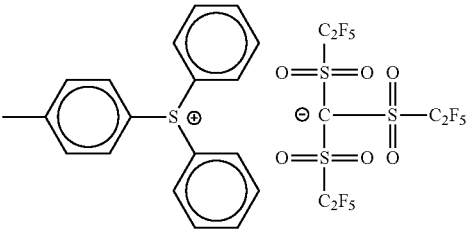
(z72)
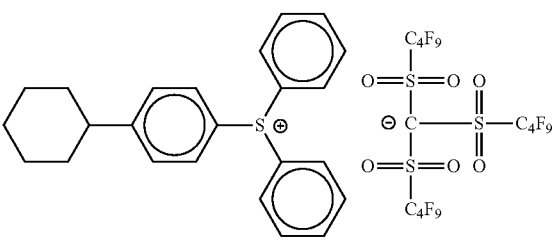

(z73) 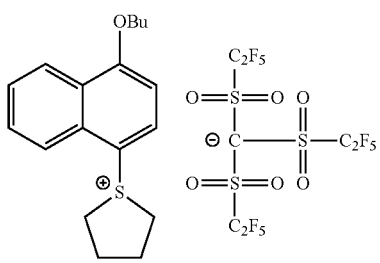
(z74) 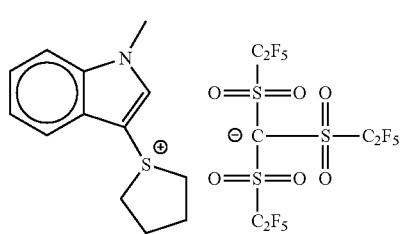
(z75) 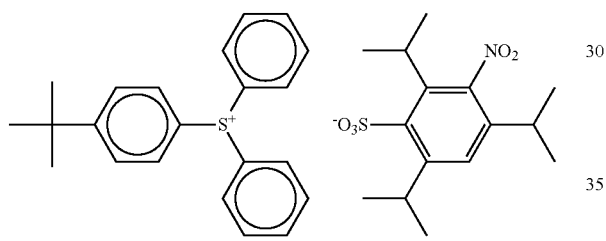
(z76) 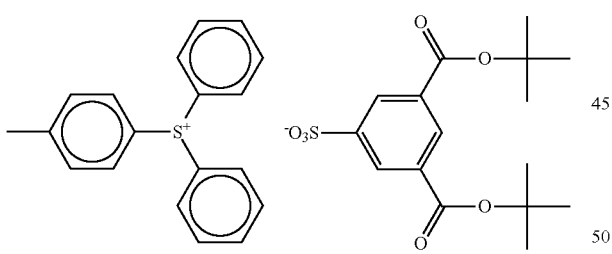
(z77) 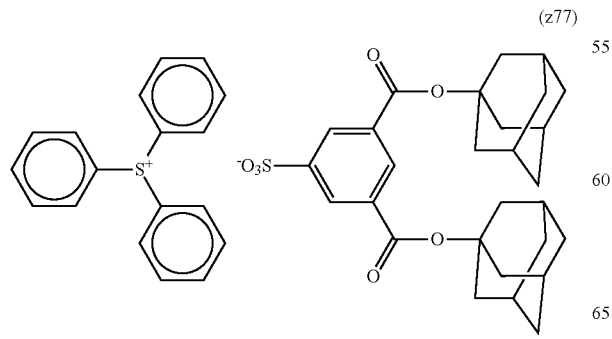
(z78) 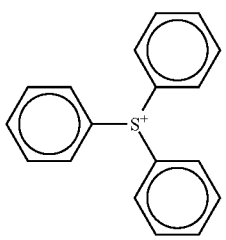
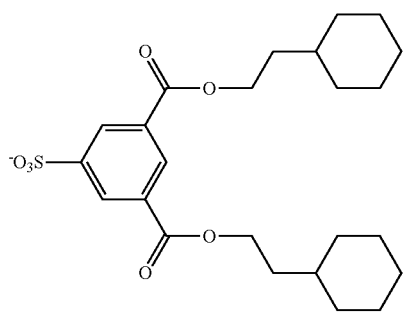
(z79) 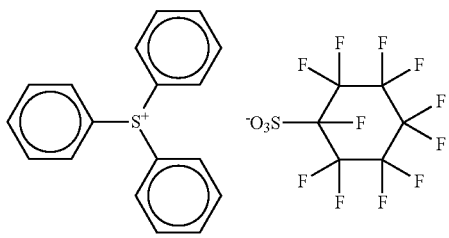
(z80) 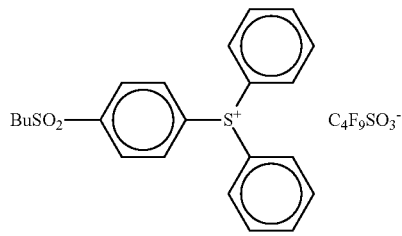
(z81) 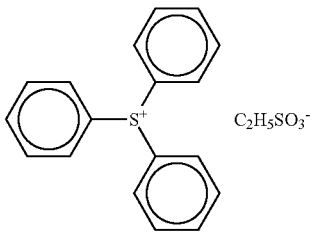
(z82) 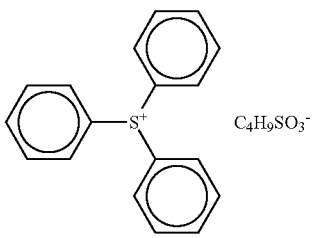

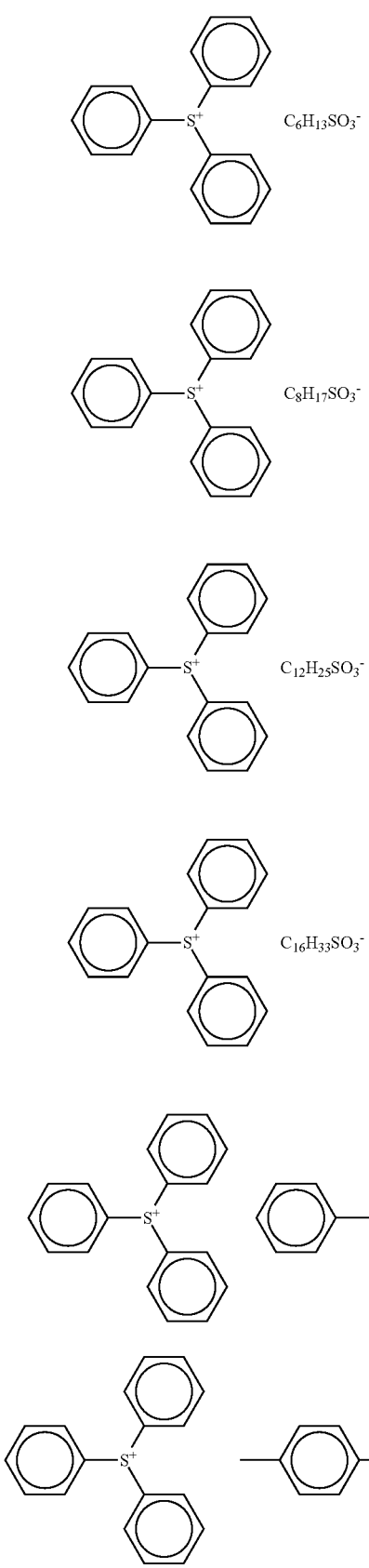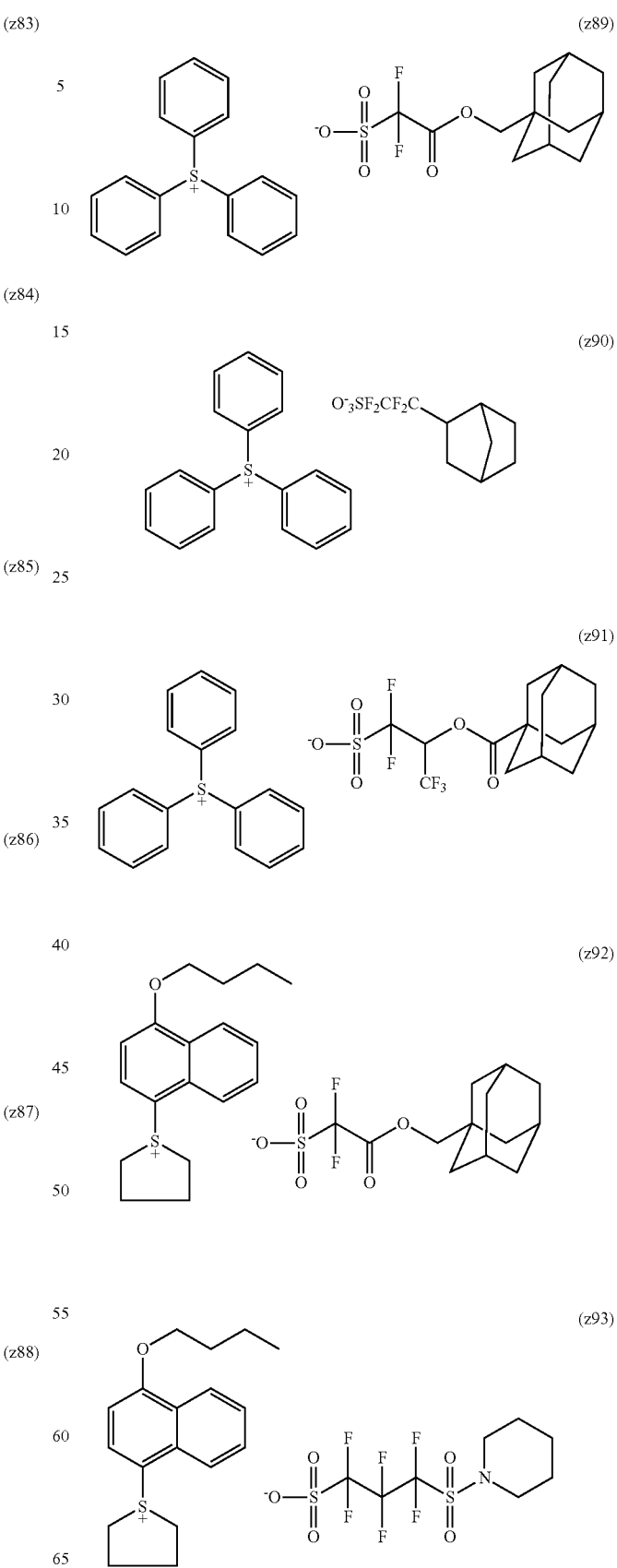

-continued
(z94) 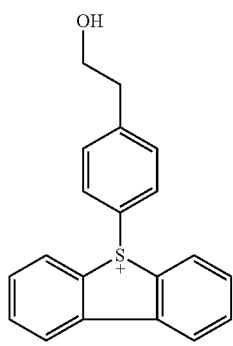 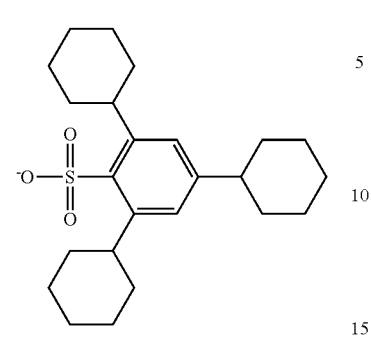
(z95) 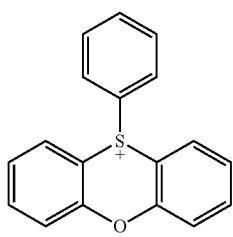 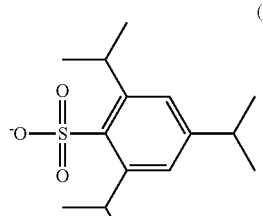
(z96) 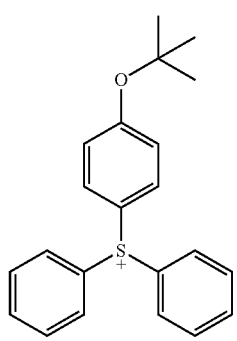 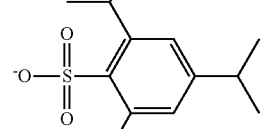
(z97) 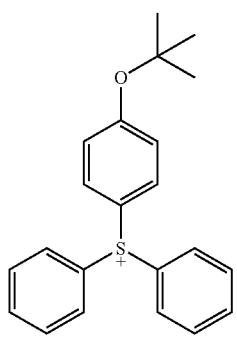 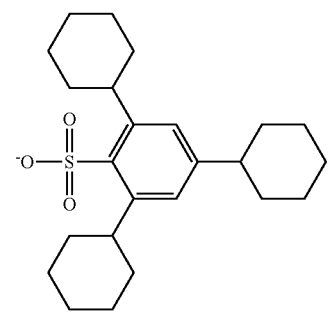
(z98) 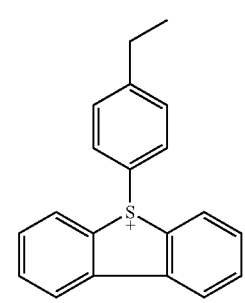 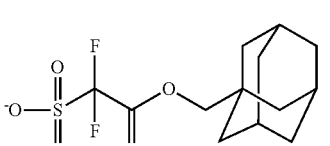
-continued
(z99) 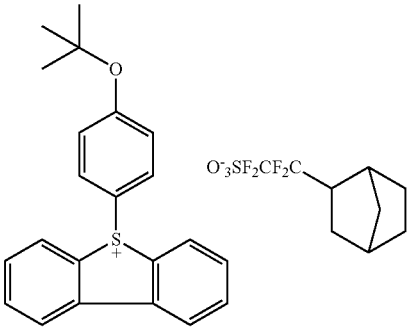 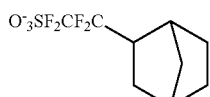
(z100) 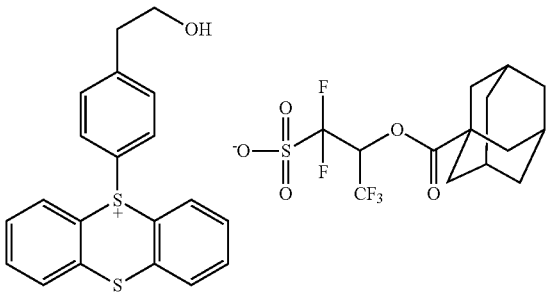 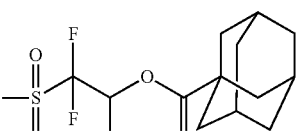
(z101) 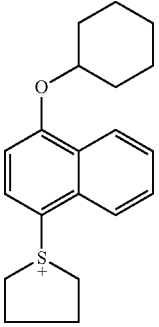 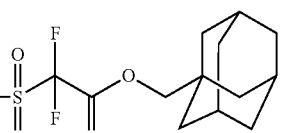
(z102) 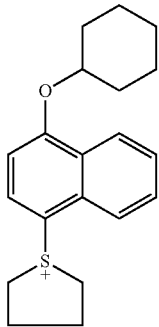 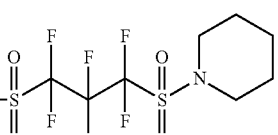
(z103) 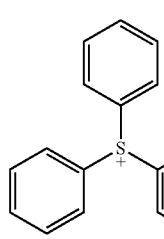 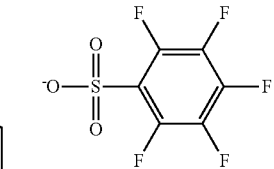

[4] Basic Compound

The actinic ray-sensitive or radiation-sensitive resin composition of the present invention preferably contains a basic compound.

The basic compound is preferably a nitrogen-containing organic basic compound. The usable compound is not particularly limited, but for example, compounds classified into the following (1) to (4) are preferably used, and an ammonium salt of (4) is more preferred.

(1) Compound Represented by the Following Formula (BS-1):

(BS-1)

In formula (BS-1), each R independently represents a hydrogen atom, an alkyl group (linear or branched), a cycloalkyl group (monocyclic or polycyclic), an aryl group or an aralkyl group, but it is not allowed that three R's all are a hydrogen atom.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be substituted for by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group and an alkyloxycarbonyl group.

In the compound represented by formula (BS-1), it is preferred that only one of three R's is a hydrogen atom or all R's are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(tert-butyl)aniline.

Also, one preferred embodiment is a compound where in formula (BS-1), at least one R is an alkyl group substituted with a hydroxyl group. Specific examples of the compound include triethanolamine and N,N-dihydroxyethylaniline.

The alkyl group as R may contain an oxygen atom in the alkyl chain to form an oxyalkylene chain. The oxyalkylene group is preferably —CH$_2$CH$_2$O—. Specific examples thereof include tris(methoxyethoxyethyl)amine and compounds illustrated in U.S. Pat. No. 6,040,112, column 3, line 60 et seq.

(2) Compound having a Nitrogen-Containing Heterocyclic Structure

The heterocyclic structure may or may not have aromaticity, may contain a plurality of nitrogen atoms, and may further contain a heteroatom other than nitrogen. Specific examples thereof include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine) and a compound having an antipyrine structure (e.g., antipyrine, hydroxyantipyrine).

A compound having two or more ring structures is also suitably used. Specific examples thereof include 1,5-diazabicyclo[4.3.0]nona-5-ene and 1,8-diazabicyclo[5.4.0]undeca-7-ene.

(3) Phenoxy Group-Containing Amine Compound

The phenoxy group-containing amine compound is a compound where the alkyl group of an amine compound has a phenoxy group at the terminal opposite the nitrogen atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one oxyalkylene chain between the phenoxy group and the nitrogen atom is more preferred. The number of oxyalkylene chains in one molecule is preferably from 3 to 9, more preferably from 4 to 6. Among oxyalkylene chains, —CH$_2$CH$_2$O— is preferred.

Specific examples thereof include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt

An ammonium salt is also appropriately used. The ammonium salt is preferably a hydroxide or a carboxylate. More specifically, a tetraalkylammonium hydroxide typified by tetrabutylammonium hydroxide is preferred.

Other examples of the basic compound which can be used include compounds synthesized in Examples of JP-A-2002-363146, compounds described in paragraph 0108 of JP-A-2007-298569, and basic compounds described in JP-A-2008-102383 and Japanese Patent No. 3,546,927.

One basic compound is used alone, or two or more kinds of basic compounds are used in combination.

The amount of the basic compound used is usually from 0.001 to 10 mass %, preferably from 0.01 to 5 mass %, based on the solid content of the actinic ray-sensitive or radiation-sensitive resin composition.

The molar ratio of photoacid generator/basic compound is preferably from 2.5 to 300. That is, the molar ratio is preferably 2.5 or more in view of sensitivity and dissolution contrast and preferably 300 or less from the standpoint of suppressing the reduction in dissolution contrast due to thickening of the pattern with aging after exposure until heat treatment. This molar ratio is more preferably from 5.0 to 200, still more preferably from 7.0 to 150.

[5] Surfactant

The actinic ray-sensitive or radiation-sensitive resin composition of the present invention preferably further contains a surfactant. The surfactant is preferably a fluorine-containing and/or silicon-containing surfactant.

Examples of the surfactant above include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

The amount of the surfactant used is preferably from 0.0001 to 2 mass %, more preferably from 0.001 to 1 mass %, based on the entire solid content of the actinic ray-sensitive or radiation-sensitive resin composition.

[6] Solvent

The actinic ray-sensitive or radiation-sensitive resin composition of the present invention is dissolved in a solvent capable of dissolving respective components described above and then coated on a support. Usually, the concentration is, in terms of the solid content concentration of all components of the composition, preferably from 2 to 30 mass %, more preferably from 3 to 25 mass %.

Preferred examples of the solvent which can be used here include ethylene dichloride, cyclohexanone, cyclopentanone, anisole, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME, another name: 1-methoxy-2-propanol), propylene glycol monomethyl ether acetate (PGMEA, another name: 1-methoxy-2-acetoxypropane), toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. One of these solvents may be used alone, or some of them may be mixed and used.

In particular, the solvent used in the actinic ray-sensitive or radiation-sensitive resin composition of the present invention is preferably a solvent containing an alkylene glycol monoalkyl ether carboxylate or an alkyl lactate. Specific preferred examples of the alkylene glycol monoalkyl ether carboxylate include propylene glycol monomethyl ether acetate, and specific preferred examples of the alkyl lactate include ethyl lactate.

Above all, the solvent for use in the actinic ray-sensitive or radiation-sensitive resin composition of the present invention is preferably a mixed solvent containing propylene glycol monomethyl ether acetate, more preferably a mixed solvent of propylene glycol monomethyl ether acetate and propylene glycol monomethyl ether, or a mixed solvent of propylene glycol monomethyl ether acetate and ethyl lactate.

Particularly, propylene glycol monomethyl ether acetate is preferably contained in a ratio of 50 mass % or more, more preferably 60 mass % or more, based on all solvents.

[7] Other Components

In addition, the actinic ray-sensitive or radiation-sensitive resin composition of the present invention may appropriately contain, for example, a compound capable of generating a carboxylic acid upon irradiation with an actinic ray or radiation, a carboxylic acid such as benzoic acid, a dye, a photo-base generator, an antioxidant (for example, a phenol-based antioxidant disclosed in paragraphs [0130] to [0133] of JP-A-2006-276688), and a compound capable of producing an acid upon irradiation with radiation to decrease the basicity or become neutral described in JP-A-2006-330098 and Japanese Patent No. 3,577,743.

[8] Pattern Forming Method

The actinic ray-sensitive or radiation-sensitive resin composition of the present invention is preferably coated on a substrate to form a thin film. The thickness of this coating film is preferably from 0.05 to 4.0 μm. The substrate may be selected from various substrates used in the production of a semiconductor.

The composition is coated on such a substrate (for example, silicon, silicon dioxide-coated silicon, chromium-coated quartz, silicon nitride) as used for the production of an integrated circuit device, an engineering mask, an imprint mold and the like by an appropriate coating method such as spinner and then dried to form a photosensitive film.

If desired, a commercially available inorganic or organic antireflection film may be used. Furthermore, an antireflection film may also be used by coating it as the underlying layer of the resist.

The actinic ray-sensitive or radiation-sensitive resin composition of the present invention has an excellent effect that even when the composition is coated directly on a substrate having a high-reflection surface without applying an antireflection film, generation of a standing wave is remarkably suppressed and a good pattern is obtained, but a good pattern can be formed also when an antireflection film is used. In use for implantation, an antireflection film can be used as an overlayer of the resist, if desired. The antireflection film is preferably an inorganic film such as titanium, titanium dioxide, titanium nitride, chromium oxide, carbon, amorphous silicon, silicon dioxide and silicon nitride.

Examples of the antireflection film include AQUATAR-II, AQUATAR-III, AQUATAR-VII and AQUATAR-VIII produced by AZ Electronic Materials K.K.

In the production or the like of a precision integrated circuit device, the step of forming a pattern on a resist film is performed by coating the actinic ray-sensitive or radiation-sensitive resin composition of the present invention on a substrate (for example, silicon, silicon nitride, SiON, a silicon/silicon dioxide-coated substrate, a glass substrate, an ITO substrate or a quartz/chromium oxide-coated substrate) to form a resist film, irradiating thereon an actinic ray or radiation such as KrF excimer laser light, electron beam and EUV light, and then subjecting the resist film to heating, development, rinsing and drying, whereby a good resist pattern can be formed.

In the case of applying the composition of the present invention to the production of an information recording medium (more specifically, production of a mold structure or a stamper used in producing an information recording medium), the exposure/lithography can be performed while rotating the substrate, that is, by controlling the substrate in the r-O direction. Details of this method and the production of a mold structure by this method are described, for example, in Japanese Patent No. 4,109,085 and JP-A-2008-162101.

The alkali developer which can be used in the development is an aqueous solution of an alkali (usually, from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of an alkali may also be used after adding thereto alcohols such as isopropyl alcohol and a surfactant such as nonionic surfactant, each in an appropriate amount.

Among these developers, a quaternary ammonium salt is preferred, and tetramethylammonium hydroxide and choline are more preferred.

The pH of the alkali developer is usually from 10 to 15.

Examples of the actinic ray or radiation as an exposure light source include infrared light, visible light, ultraviolet light, far ultraviolet light, X-ray and electron beam, but the radiation is preferably far ultraviolet light at a wavelength of 250 nm or less. Specific examples thereof include KrF excimer laser (248 nm), ArF excimer laser (193 nm), $F_2$ excimer laser (157 nm), X-ray, electron beam and EUV. The resist film is preferably exposed by the irradiation with KrF, electron beam, X-ray or EUV.

EXAMPLES

The present invention is described in greater detail below by referring to Examples, but the contents of the present invention should not be construed as being limited thereto.

Synthesis Example 1

Synthesis of Compound 1

9-Anthracenecarboxylic acid (5 g, 22.5 mmol) was added to 50 ml of acetone, and potassium carbonate (4.04 g, 29.2 mmol) was added thereto. Furthermore, α-bromo-γ-butyrolactone (4.5 g, 27.3 mmol) was added, and the mixture was stirred at room temperature for 2 hours. Thereafter, 60 ml of water was added to the reaction solution, and the organic layer was extracted with ethyl acetate. The solvent was removed by distillation under reduced pressure, and the obtained crystal was dissolved in 25 ml of acetone, and the solution was stirred at room temperature. Subsequently, 75 ml of methanol was obtained, and the mixture was stirred for 1 hours. The obtained crystal was filtered to obtain 2.5 g of objective Compound 1.

(Compound 1) $^1$H-NMR (300 MHz, CDCl$_3$) δ8.58 (s, 1H), 8.21 (d, 2H, J=9.0 Hz), 8.04 (d, 2H, J=8.4 Hz), 7.62-7.42 (m, 6H), 6.07 (t, 2H, J=9.0 Hz), 4.64-4.42 (m, 2H), 2.98-2.88 (m, 1H), 2.70-2.57 (m, 1H).

Synthesis Example 2

Synthesis of Compound 2

The compound was synthesized in the same manner as the method described in *Tetrahedron*, 60, 2004, 2673-2692 (synthesis method of Reference Compound 29) except for using 9-anthracenemethyl chloride in place of benzyl bromide.

Synthesis Example 3

Synthesis of Compound 3

The compound was synthesized in the same manner as in the synthesis of Compound 1 except for changing α-bromo-γ-butyrolactone to 3-bromo-dihydro-5,5-dimethylfuran-2 (3H)-one.

Synthesis Example 4

Synthesis of Compound 6

The compound was synthesized in the same manner as in the synthesis of Compound 2 except for changing α-bromo-γ-butyrolactone to 3-bromo-tetrahydropyran-2-one.

Synthesis Example 5

Synthesis of Compound 7

The compound was synthesized in the same manner as in the synthesis of Compound 2 except for changing 9-anthracenecarboxylic acid to 2-((anthracen-9-yl)methoxy)acetic acid.

Synthesis Example 6

Synthesis of Compound 8

The compound was synthesized in the same manner as in the synthesis of Compound 1 except for changing α-bromo-γ-butyrolactone to 3-bromooxetan-2-one.

Synthesis Example 7

Synthesis of Compound 9

The compound was synthesized in the same manner as in the synthesis of Compound 1 except for changing α-bromo-γ-butyrolactone to 3-bromooxepan-2-one.

Synthesis Example 8

Synthesis of Compound 16

The compound was synthesized by the method described in *J. Org. Chem.*, 1980, 45, 1497-1505.

(Compound 16) $^1$H-NMR (300 MHz, CDCl$_3$) δ8.41 (s, 1H), 8.27 (d, 2H, J=8.4 Hz), 8.03 (d, 2H, J=8.4 Hz), 7.61-7.42 (m, 6H), 4.74 (d, 2H, J=6.9 Hz), 1.97 (t, 1H, J=6.9 Hz).

Synthesis Example 9

Synthesis of Compound 14

Compound 16 (0.5 g, 2.25 mmol) was added to 30 ml of acetone, and potassium carbonate (0.40 g, 2.93 mmol) was added thereto. Furthermore, tert-butyl bromoacetate (1.1 g, 5.62 mmol) was added, and the mixture was stirred at room temperature for 2 hours. Thereafter, the reaction solution was added dropwise to a mixed solution containing 40 ml of methanol and 60 ml of water, and the obtained crystal was filtered to obtain 0.66 g of objective Compound 14.

(Compound 14) $^1$H-NMR (300 MHz, CDCl$_3$) δ8.42 (s, 1H), 838 (d, 2H, J=8.8 Hz), 8.01 (d, 2H, J=8.1 Hz), 7.60-7.42 (m, 6H), 4.93 (s, 2H), 3.25 (s, 2H), 1.57 (s, 9H).

Synthesis Example 10

Synthesis of Compound 4

The compound was synthesized in the same manner as in the synthesis of Compound 14 except for changing tert-butyl bromoacetate to α-bromo-γ-butyrolactone.

(Compound 4) ¹H-NMR (300 MHz, CDCl₃) δ8.43 (s, 1H), 8.40 (d, 2H, J=8.8 Hz), 8.02 (d, 2H, J=8.4 Hz), 7.61-7.47 (m, 6H), 5.11 (d, 2H, J=6.4 Hz), 4.47-4.31 (m, 2H), 3.70 (dd, 1H, J=8.4, 4.8 Hz), 2.65-2.59 (m, 1H), 2.11-2.05 (m, 1H).

Synthesis Example 11

Synthesis of Compound 5

The compound was synthesized in the same manner as in the synthesis of Compound 14 except for changing tert-butyl bromoacetate to 3-bromo-tetrahydropyran-2-one.

Synthesis Example 12

Synthesis of Compound 10

The compound was synthesized in the same manner as in the synthesis of Compound 14 except for changing tert-butyl bromoacetate to 2-cyclohexylpropan-2-yl 2-bromoacetate.

Synthesis Example 13

Synthesis of Compound 11

The compound was synthesized in the same manner as in the synthesis of Compound 14 except for changing tert-butyl bromoacetate to tert-butyl chloroformate.

Synthesis Example 14

Synthesis of Compound 12

The compound was synthesized in the same manner as in the synthesis of Compound 14 except for changing tert-butyl bromoacetate to methoxymethyl 2-bromoacetate.

Synthesis Example 15

Synthesis of Compound 13

The compound was synthesized in the same manner as in the synthesis of Compound 14 except for changing tert-butyl bromoacetate to 1-ethylcyclopentyl 2-bromoacetate.

Synthesis Example 16

Synthesis of Compound 15

The compound was synthesized in the same manner as in the synthesis of Compound 14 except for changing tert-butyl bromoacetate to bromoacetic acid.

Comparative compounds were synthesized in the same manner.

Structures of Compounds 1 to 16 and Comparative Compounds 1 to 4 are shown in Tables 1 and 2 below.

TABLE 1

| Compound | Structure of Compound |
|---|---|
| 1 |  |
| 2 |  |
| 3 |  |
| 4 |  |
| 5 |  |

TABLE 1-continued
| Compound | Structure of Compound |
|---|---|
| 6 | 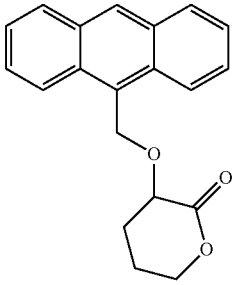 [SMILES: O=C1OCCCC1OCc1c2ccccc2cc2ccccc12] |
| 7 | 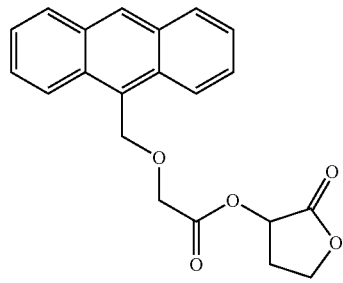 [SMILES: O=C(COCc1c2ccccc2cc2ccccc12)OC1CCOC1=O] |
| 8 | 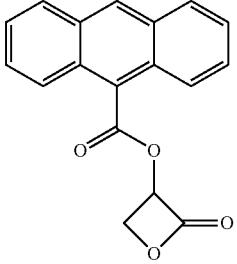 [SMILES: O=C(OC1COC1=O)c1c2ccccc2cc2ccccc12] |
| 9 | 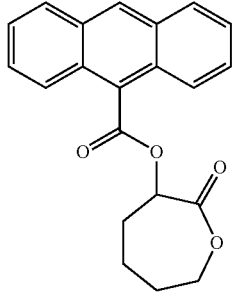 [SMILES: O=C(OC1CCCCOC1=O)c1c2ccccc2cc2ccccc12] |
| 10 | 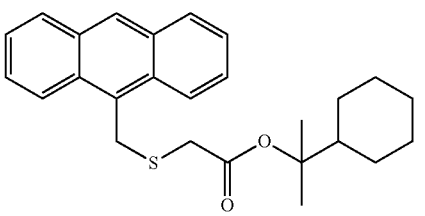 [SMILES: CC(C)(OC(=O)CSCc1c2ccccc2cc2ccccc12)C1CCCCC1] |
TABLE 1-continued
| Compound | Structure of Compound |
|---|---|
| 11 | 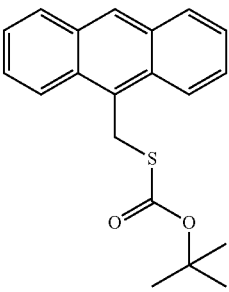 [SMILES: CC(C)(C)OC(=O)SCc1c2ccccc2cc2ccccc12] |
| 12 | 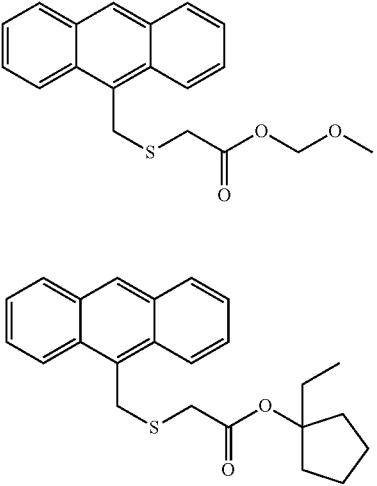 |
| 13 | 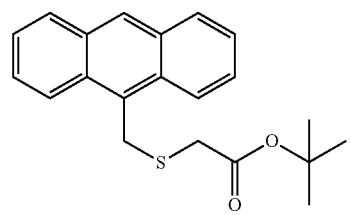 [SMILES: CC(C)(C)OC(=O)CSCc1c2ccccc2cc2ccccc12] |
| 14 | 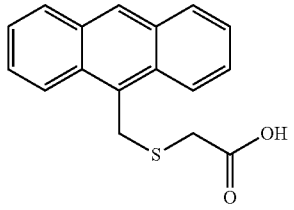 [SMILES: O=C(O)CSCc1c2ccccc2cc2ccccc12] |
| 15 | 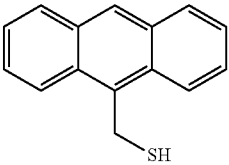 [SMILES: SCc1c2ccccc2cc2ccccc12] |
| 16 | |

TABLE 2

| Comparative Compound | Structure of Comparative Compound |
|---|---|
| 1 | (anthracene with -CH$_2$OH group) |
| 2 | (anthracene with -C(=O)OH group) |
| 3 | (anthracene with -CH$_2$-O-CH$_2$-C(=O)-O-C(CH$_3$)$_3$ group) |
| 4 | (anthracene with -C(=O)-O-C(CH$_3$)$_2$CH$_2$CH$_3$ group) |

Examples 1C to 37C and Comparative Examples 1C to 5C

Preparation of Resist

The components shown in Table 3 below were dissolved in a solvent, and the obtained solution was filtered through a polytetrafluoroethylene filter having a pore size of 0.1 μm to prepare a positive resist solution having a solid content concentration of 5.5 mass %. Here, the concentration (0.1 mass %) of the surfactant is the concentration based on the entire solid content.

[Evaluation of Resist]

The prepared positive resist solution was uniformly coated by a spin coater on a silicon substrate (diameter: 200 mm) treated with hexamethyldisilazane, and dried under heating on a hot plate at 120° C. for 90 seconds to form a 0.18 μm-thick resist film.

The obtained resist film was subjected to pattern exposure using a KrF excimer laser stepper (NA=0.7) and using a mask for line and space, and immediately after exposure, heated on a hot plate at 110° C. for 90 seconds. Thereafter, the resist film was developed using an aqueous 2.38 mass % tetramethylammonium hydroxide solution at 23° C. for 60 seconds, rinsed with pure water for 30 seconds, and dried to form a line pattern.

[Sensitivity and Dissolution Contrast (γ)]

The exposure dose with which a line-and-space pattern (L/S=1/1) having a line width of 0.18 μm is formed at a line width of 1:1 when the resist film formed on the silicon substrate is exposed, immediately heated on a hot plate at 110° C. for 90 seconds and then subjected to alkali development, water washing and drying to form a resist pattern, is defined as the optimal exposure amount, and the sensitivity was evaluated by the optimal exposure amount.

Also, the resist film was subjected to surface exposure by changing the exposure dose in steps of 0.5 mJ/cm$^2$ and further baked at 110° C. for 90 seconds. Thereafter, the dissolution rate at each exposure amount was measured using an aqueous 2.38 mass % tetramethylammonium hydroxide (TMAH) solution, whereby a sensitivity curve was obtained, In this sensitivity curve, the exposure amount when the dissolution rate of the resist was saturated is defined as the sensitivity. Furthermore, the dissolution contrast (γ value) was calculated from the gradient in the straight line part of the sensitivity curve. A larger γ value indicates higher dissolution contrast.

[Line Edge Roughness (LER)]

A 180-nm line pattern was formed with the irradiation dose showing the above-described sensitivity. Thereafter, at arbitrary 30 points contained in the range of 50 μm in the longitudinal direction of the pattern, the distance from the reference line where the edge should be present was measured by a scanning electron microscope (S-9220, manufactured by Hitachi Ltd.), and after determining the standard deviation of the distance, 3σ was computed.

[Pattern Profile and Standing Wave]

The exposure dose for reproducing a line-and-space mask pattern having a line width of 180 nm is defined as the optimal exposure dose, and the profile and the presence or absence of standing wave each at the optimal exposure dose were observed by a scanning microscope (SEM).

The cross-sectional profile of a 180 nm-wide resist pattern was observed by a cross-sectional SEM, and the sample was rated A when the side surface was a substantially sheer wall and the effect of standing wave was suppressed, with 2A for better one, rated B when the side surface was slightly tapered but the effect of standing wave was suppressed, and rated C when the side surface was waving and the effect of standing wave was recognized.

[Development Defect]

A 0.18-μm pattern was exposed at 78 portions in the wafer plane having a diameter of 200 mm with an exposure dose at which a 180-nm resist pattern is obtained using a mask pattern having a mask size of 180 nm and a pitch of 360 nm. The obtained wafer with pattern was measured for the number of development defects by KLA-2360 manufactured by KLA-Tencor Corporation. At this time, the inspection area was 205 cm$^2$ in total, the pixel size was 0.25 μM, the thresh hold was 30, and visible light was used for the inspection light. The value obtained by dividing the measured numerical value by the inspection area was evaluated as the number of defects (defects/cm$^2$).

These evaluation results are shown in Table 3.

TABLE 3

| Example | Compound of the Invention | Photoacid Generator | Resin | Basic Compound (0.02 g) | Surfactant (0.1 mass %) | Solvent (mass ratio) |
|---|---|---|---|---|---|---|
| 1C | 1 (0.5 g) | z23 (0.3 g) | R-2 (9.2 g) | C-1 | W-1 | A1/B1 (6/4) |
| 2C | 2 (0.5 g) | z23 (0.3 g) | R-28 (9.2 g) | C-1 | W-1 | A2/B2 (6/4) |
| 3C | 3 (0.5 g) | z23 (0.3 g) | R-4 (9.7 g) | C-1 | W-2 | A3/B1 (6/4) |
| 4C | 4 (0.5 g) | z23 (0.3 g) | R-28 (9.7 g) | C-1 | W-3 | A4/B1 (6/4) |
| 5C | 5 (0.5 g) | z23 (0.3 g) | R-14 (9.7 g) | C-1 | W-1 | A1/B2 (6/4) |
| 6C | 6 (0.5 g) | z1 (0.3 g) | R-2 (9.7 g) | C-1 | W-1 | A1/B1 (6/4) |
| 7C | 7 (0.5 g) | z23 (0.3 g) | R-28 (9.7 g) | C-4 | W-4 | A1/B2 (6/4) |
| 8C | 8 (0.5 g) | z16 (0.3 g) | R-31 (4.0 g) R-28 (5.7 g) | C-1 | W-4 | A1/B2 (6/4) |
| 9C | 9 (0.5 g) | z23 (0.3 g) | R-17 (9.7 g) | C-3 | W-1 | A1/B1 (6/4) |
| 10C | 10 (0.5 g) | z44 (0.3 g) | R-29 (9.7 g) | C-1 | W-1 | A1/B1 (6/4) |
| 11C | 11 (0.5 g) | z37 (0.3 g) | R-27 (9.7 g) | C-1 | W-2 | A1/B2 (6/4) |
| 12C | 12 (0.5 g) | z23 (0.3 g) | R-11 (5.0 g) R-31 (4.7 g) | C-1 | W-3 | A1/B1 (6/4) |
| 13C | 13 (0.5 g) | z67 (0.3 g) | R-29 (9.7 g) | C-1 | W-1 | A1/B2 (6/4) |
| 14C | 14 (0.5 g) | z23 (0.3 g) | R-28 (9.7 g) | C-1 | W-1 | A1/B1 (6/4) |
| 15C | 15 (0.5 g) | z23 (0.3 g) | R-23 (9.7 g) | C-1 | W-1 | A1/B1 (6/4) |
| 16C | 16 (0.5 g) | z23 (0.3 g) | R-28 (9.7 g) | C-1 | W-1 | A1/B2 (6/4) |
| 17C | 1 (0.5 g) | z83 (0.3 g) | R-1 (9.7 g) | C-2 | W-1 | A1/B1 (6/4) |
| 18C | 1 (0.5 g) | z82 (0.3 g) | R-30 (9.7 g) | C-2 | W-1 | A1/B1 (6/4) |
| 19C | 1 (0.5 g) | z14 (0.3 g) | R-31 (9.7 g) | C-2 | W-2 | A1/B1 (6/4) |
| 20C | 4 (0.5 g) | z12 (0.2 g) z35 (0.1 g) | R-32 (9.7 g) | C-2 | W-1 | A2/B1 (6/4) |
| 21C | 4 (0.5 g) | z35 (0.3 g) | R-19 (9.7 g) | C-2 | W-1 | A3/B1 (6/4) |
| 22C | 14 (0.5 g) | z87 (0.1 g)/ z83 (0.2 g) | R-20 (9.7 g) | C-2 | W-1 | A1/B2 (6/4) |
| 23C | 1 (1.0 g) | z94 (0.3 g) | R-10 (9.2 g) | C-2 | W-1 | A1 |
| 24C | 1 (0.5 g) | z95 (1.0 g) | R-8 (9.0 g) | C-2 | W-1 | A1/B1 (6/4) |
| 25C | 1 (0.5 g) | z7 (1.0 g) | R-1 (9.0 g) | C-1 | W-3 | A1/B2 (6/4) |
| 26C | 1 (0.5 g) | z87 (0.5 g)/ z83 (0.5 g) | R-30 (9.0 g) | C-4 | W-1 | A1/B1 (6/4) |
| 27C | 1 (0.5 g) | z87 (0.5 g)/ z35 (0.5 g) | R-30 (9.0 g) | C-1 | W-1 | A4/B1 (6/4) |
| 28C | 1 (0.5 g) | z82 (0.5 g)/ z35 (0.5 g) | R-31 (9.0 g) | C-5 | W-1 | A1/B1 (6/4) |
| 29C | 1 (0.5 g) | z55 (1.0 g) | R-6 (9.0 g) | C-1 | W-1 | A1/B2 (6/4) |
| 30C | 1 (0.5 g) | z103 (0.25 g)/ z36 (0.75 g) | R-32 (9.0 g) | C-6 | W-1 | A1/B2 (6/4) |
| 31C | 1 (0.5 g) | z5 (0.75 g)/ z36 (0.25 g) | R-28 (9.0 g) | C-6 | W-1 | A1/B2 (6/4) |
| 32C | 1 (0.5 g) | z5 (0.75 g)/ z88 (0.25 g) | R-29 (9.0 g) | C-6 | W-1 | A1/B2 (6/4) |
| 33C | 1 (0.5 g) | z35 (0.50 g)/ z83 (0.50 g) | R-31 (9.0 g) | C-6 (0.01 g)/ C-4 (0.01 g) | W-1 | A1/B2 (6/4) |
| 34C | 1 (0.5 g) | z40 (1.0 g) | R-33 (9.0 g) | C-6 | W-1 | A1/B2 (6/4) |
| 35C | 1 (0.5 g) | z12 (0.2 g) z35 (0.1 g) | R-32 (9.0 g) | C-7 | W-1 | A1/B2 (6/4) |
| 36C | 1 (0.5 g) | z12 (0.2 g) z35 (0.1 g) | R-32 (9.0 g) | C-7 (0.01 g)/ C-6 (0.01 g) | W-1 | A1/B2 (6/4) |
| 37C | 1 (0.5 g) | z12 (0.2 g) z35 (0.1 g) | R-32 (9.0 g) | C-7 (0.01 g)/ C-2 (0.01 g) | W-1 | A1/B2 (6/4) |
| Comparative Example 1C | none | z23 (0.3 g) | R-2 (9.7 g) | C-1 | W-1 | A1/B1 (6/4) |
| Comparative Example 2C | Comparative Compound 1 (0.5 g) | z23 (0.3 g) | R-2 (9.7 g) | C-1 | W-1 | A1/B1 (6/4) |
| Comparative Example 3C | Comparative Compound 2 (0.5 g) | z23 (0.3 g) | R-2 (9.7 g) | C-1 | W-1 | A1/B1 (6/4) |
| Comparative Example 4C | Comparative Compound 3 (0.5 g) | z23 (0.3 g) | R-2 (9.7 g) | C-1 | W-1 | A1/B1 (6/4) |
| Comparative Example 5C | Comparative Compound 4 (0.5 g) | z23 (0.3 g) | R-2 (9.7 g) | C-1 | W-1 | A1/B1 (6/4) |

| Example | Sensitivity (mJ/cm$^2$) | γ | LER (nm) | Pattern Profile | Standing Wave | Development Defect |
|---|---|---|---|---|---|---|
| 1C | 23.0 | 6.5 | 5.1 | rectangular | A | 30 |
| 2C | 23.2 | 6.5 | 5.2 | rectangular | A | 30 |
| 3C | 23.0 | 6.6 | 5.1 | rectangular | A | 30 |
| 4C | 23.0 | 6.5 | 5.0 | rectangular | 2A | 20 |
| 5C | 23.2 | 6.4 | 5.1 | rectangular | 2A | 20 |

TABLE 3-continued

|  | | | | | | |
|---|---|---|---|---|---|---|
| 6C | 23.1 | 6.4 | 5.3 | rectangular | A | 20 |
| 7C | 23.3 | 6.4 | 5.2 | rectangular | A | 30 |
| 8C | 23.2 | 6.3 | 5.3 | rectangular | A | 30 |
| 9C | 23.0 | 6.4 | 5.2 | rectangular | A | 32 |
| 10C | 23.2 | 6.4 | 5.3 | rectangular | A | 25 |
| 11C | 23.3 | 6.5 | 5.4 | rectangular | A | 25 |
| 12C | 23.2 | 6.5 | 5.2 | rectangular | A | 25 |
| 13C | 23.3 | 6.5 | 5.4 | rectangular | A | 24 |
| 14C | 23.3 | 6.5 | 5.4 | rectangular | A | 25 |
| 15C | 23.4 | 6.5 | 5.4 | taper | A | 20 |
| 16C | 21.5 | 6.2 | 5.1 | taper | A | 28 |
| 17C | 19.5 | 6.8 | 4.5 | rectangular | A | 29 |
| 18C | 19.8 | 6.7 | 4.4 | rectangular | A | 30 |
| 19C | 19.7 | 6.8 | 4.5 | rectangular | A | 30 |
| 20C | 19.6 | 6.9 | 4.5 | rectangular | 2A | 20 |
| 21C | 19.7 | 6.8 | 4.5 | rectangular | 2A | 20 |
| 22C | 19.3 | 6.1 | 4.7 | rectangular | A | 25 |
| 23C | 19.0 | 6.9 | 4.1 | rectangular | A | 20 |
| 24C | 19.0 | 6.9 | 4.1 | rectangular | A | 25 |
| 25C | 21.4 | 6.9 | 5.1 | rectangular | A | 25 |
| 26C | 21.5 | 6.9 | 5.1 | rectangular | A | 25 |
| 27C | 21.7 | 6.8 | 5.1 | rectangular | A | 25 |
| 28C | 20.8 | 6.9 | 5.2 | rectangular | A | 25 |
| 29C | 20.7 | 6.9 | 5.1 | rectangular | A | 26 |
| 30C | 20.7 | 6.8 | 5.1 | rectangular | A | 25 |
| 31C | 20.5 | 6.9 | 5.2 | rectangular | A | 27 |
| 32C | 20.5 | 6.8 | 5.2 | rectangular | A | 25 |
| 33C | 21.7 | 6.5 | 5.2 | rectangular | A | 26 |
| 34C | 19.0 | 6.9 | 4.6 | rectangular | A | 27 |
| 35C | 20.7 | 6.6 | 5.1 | rectangular | A | 25 |
| 36C | 21.3 | 6.5 | 5.2 | rectangular | A | 25 |
| 37C | 21.2 | 6.4 | 5.1 | rectangular | A | 25 |
| Comparative Example 1C | 25.6 | 5.6 | 6.5 | taper | C | 20 |
| Comparative Example 2C | 25.1 | 5.6 | 7.5 | taper | B | 150 |
| Comparative Example 3C | 25.3 | 5.2 | 7.2 | taper | B | 20 |
| Comparative Example 4C | 25.3 | 5.2 | 7.2 | taper | B | 110 |
| Comparative Example 5C | 25.3 | 5.2 | 7.2 | taper | B | 100 |

The resins are resins each having the molar ratio of repeating units, the weight average molecular weight and the polydispersity shown in Table 4 below and having the structure illustrated above.

TABLE 4

| Resin | Molar Ratio of Repeating Units (in order from the left) | Weight Average Molecular Weight (Mw) | Polydispersity |
|---|---|---|---|
| R-1 | 70/30 | 13000 | 1.8 |
| R-2 | 60/20/20 | 12000 | 1.7 |
| R-4 | 60/20/20 | 13000 | 1.6 |
| R-6 | 70/30 | 12000 | 1.5 |
| R-8 | 10/60/30 | 11000 | 1.5 |
| R-10 | 70/30 | 11000 | 1.6 |
| R-11 | 15/60/25 | 11000 | 1.6 |
| R-14 | 15/60/25 | 12000 | 1.5 |
| R-17 | 80/20 | 15000 | 1.8 |
| R-19 | 10/60/30 | 11000 | 1.5 |
| R-20 | 60/40 | 13000 | 1.6 |
| R-23 | 65/35 | 11000 | 1.6 |
| R-27 | 50/40/10 | 12000 | 1.8 |
| R-28 | 70/20/10 | 20000 | 1.45 |
| R-29 | 70/25/5 | 20000 | 1.45 |
| R-30 | 70/20/10 | 16000 | 1.6 |
| R-31 | 70/20/10 | 12000 | 1.6 |
| R-32 | 70/30 | 13000 | 1.5 |
| R-33 | 70/30 | 14000 | 1.5 |

The acid generators are those illustrated above.

(Basic Compound)
C-1: 2,4,5-Triphenylimidazole
C-2: Tetrabutylammonium hydroxide
C-3: 1,5-Diazabicyclo[4.3.0]-nona-5-ene
C-4: Tris(2-(hydroxyethoxy)ethyl)amine
C-5: Tris(2-(methoxymethoxy)ethyl)amine N-oxide
C-6: Dicyclohexylmethylamine
C-7: 2-(2-(2-(2-(2,6-dimethoxyphenoxy)ethoxy)ethoxy)ethoxy)-N,N-bis(2-methoxyethyl)ethaneamine
(Surfactant)
W-1: Megaface F176 (produced by Dainippon Ink & Chemicals, Inc.; fluorine-containing)
W-2: Megaface R08 (produced by Dainippon Ink & Chemicals, Inc.; fluorine- and silicon-containing)
W-3: Polysiloxane polymer KP-341 (produced by Shin-Etsu Chemical Co., Ltd.; silicon-containing)
W-4: Troysol S-366 (produced by Troy Chemical; fluorine-containing)
(Solvent)
A1: Propylene glycol monomethyl ether acetate (PGMEA)
A2: 2-Heptanone
A3: Cyclohexanone
A4: γ-Butyrolactone
B1: Propylene glycol monomethyl ether (PGME)
B2: Ethyl lactate As seen from the results in Table 3, the actinic ray-sensitive or radiation-sensitive resin composition of the present invention has excellent performance in terms of sensitivity, dissolution contrast, line edge roughness, pattern profile, standing wave and development defect.

INDUSTRIAL APPLICABILITY

According to the present invention, there can be provided an actinic ray-sensitive or radiation sensitive composition having high sensitivity, high dissolution contrast, good pattern profile and good line edge roughness performance and at the same time, being capable of reducing the standing wave and free from generation of a development defect; a film formed using the composition; and a pattern forming method using the same.

The entire disclosure of Japanese Patent Application No. 2009-272353 filed on Nov. 30, 2009, from which the benefit of foreign priority has been claimed in the present application, is incorporated herein by reference, as if fully set forth.

The invention claimed is:

1. An actinic ray-sensitive or radiation-sensitive resin composition comprising:
(A) a compound represented by the following formula (I),
(B) a resin which is alkali-insoluble or sparingly alkali-soluble and becomes easily alkali-soluble in the presence of an acid, and
(C) a compound capable of generating an acid upon irradiation with an actinic ray or radiation:

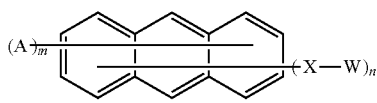

wherein A represents a monovalent substituent,
X represents a single bond or a divalent linking group,
W represents a lactone ring-containing group or a group represented by any one of formulae (V1) to (V4),
m represents an integer of 0 or more,
n represents an integer of 1 or more, and
when a plurality of A's, X's or W's are present, each A, X or W may be the same as or different from every other A, X or W,
provided that a plurality of compounds represented by formula (I) may be combined through at least any one of a single bond, A and W:

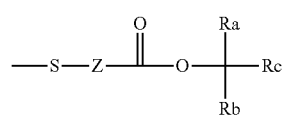

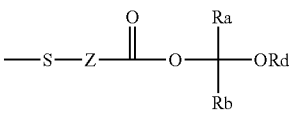

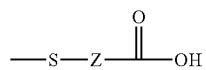

wherein Z represents a single bond or a divalent linking group, each of Ra, Rb and Rc independently represents a hydrogen atom, an alkyl group, a cycloalkyl group or an alkenyl group,
Rd represents an alkyl group, a cycloalkyl group or an alkenyl group, and
two groups out of Ra, Rb and Rc or two groups out of Ra, Rb and Rd may combine to form a ring structure comprising a carbon atom or may form a ring structure comprising a carbon atom and further containing a heteroatom, wherein:
the compound (A) and the resin (B) are not the same compound;
the resin (B) contains a repeating unit represented by the following formula (IA):

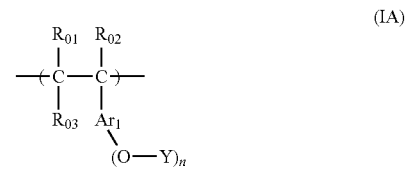

wherein each of $R_{01}$ and $R_{02}$ independently represents a hydrogen atom, an alkyl group, a cycloalkyl group, a halogen atom, a cyano group or an alkoxycarbonyl group,
$R_{03}$ represents a hydrogen atom, an alkyl group, a cycloalkyl group, a halogen atom, a cyano group or an alkoxycarbonyl group or combines with $Ar_1$ to form a ring structure,
$Ar_1$ represents an aromatic ring group,
each of n Ys independently represents a group capable of leaving by the action of an acid, provided that at least one Y represents a group capable of leaving by the action of an acid, and
n represents an integer of 1 to 4; and
the resin (B) further contains a repeating unit represented by the following formula (IIIA):

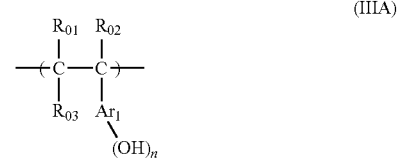

wherein each of $R_{01}$ and $R_{02}$ independently represents a hydrogen atom, an alkyl group, a cycloalkyl group, a halogen atom, a cyano group or an alkoxycarbonyl group,
$R_{03}$ represents a hydrogen atom, an alkyl group, a cycloalkyl group, a halogen atom, a cyano group or an alkoxycarbonyl group or combines with $Ar_1$ to form a ring structure,
$Ar_1$ represents an aromatic ring group, and
n represents an integer of 1 to 4.

2. The actinic ray-sensitive or radiation-sensitive resin composition according to claim 1, wherein the acid generated from the compound (C) is a sulfonic acid.

3. The actinic ray-sensitive or radiation-sensitive resin composition according to claim 1, wherein the compound (C) is a diazodisulfone compound or a sulfonium salt.

4. The actinic ray-sensitive or radiation-sensitive resin composition according to claim 1, wherein the resin (B) further contains a repeating unit represented by formula (IB):

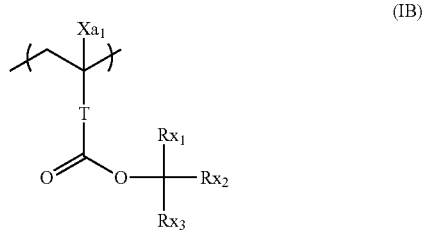

wherein $Xa_1$ represents a hydrogen atom, a methyl group, a trifluoromethyl group or a hydroxymethyl group, T represents a single bond or a divalent linking group, each of $Rx_1$ to $Rx_3$ independently represents a linear or branched alkyl group or a monocyclic or polycyclic cycloalkyl group, and at least two members of $Rx_1$ to $Rx_3$ may combine each other to form a monocyclic or polycyclic cycloalkyl group.

5. The actinic ray-sensitive or radiation-sensitive resin composition according to claim 1, wherein the resin (B) contains a hydroxystyrene-derived repeating unit as the repeating unit represented by formula (IIIA).

6. A film formed using the actinic ray-sensitive or radiation-sensitive resin composition according to claim 1.

7. A pattern forming method comprising:
forming a film by using the actinic ray-sensitive or radiation-sensitive resin composition according to claim 1,
exposing the film, and
developing the exposed film to form a pattern.

8. The actinic ray-sensitive or radiation-sensitive resin composition according to claim 1, wherein the group represented by —X—W is bonded to the benzene ring in the center of the anthracene ring.

9. The actinic ray-sensitive or radiation-sensitive resin composition according to claim 1, wherein the amount of the compound (A) added is from 0.1 to 30 mass % based on the entire solids content of the composition.

10. An actinic ray-sensitive or radiation-sensitive resin composition comprising:
(A) a compound represented by the following formula (I),
(B) a resin which is alkali-insoluble or sparingly alkali-soluble and becomes easily alkali-soluble in the presence of an acid, and
(C) a compound capable of generating an acid upon irradiation with an actinic ray or radiation:

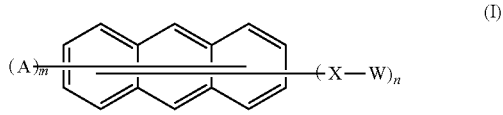

wherein A represents a monovalent substituent,
X represents a single bond or a divalent linking group,
W represents a lactone ring-containing group,
m represents an integer of 0 or more,
n represents an integer of 1 or more, and
when a plurality of A's, X's or W's are present, each A, X or W may be the same as or different from every other A, X or W,
provided that a plurality of compounds represented by formula (I) may be combined through at least any one of a single bond, A and W,
wherein the compound (A) and the resin (B) are not the same compound.

11. An actinic ray-sensitive or radiation-sensitive resin composition comprising:
(A) a compound represented by the following formula (I),
(B) a resin which is alkali-insoluble or sparingly alkali-soluble and becomes easily alkali-soluble in the presence of an acid, and
(C) a compound capable of generating an acid upon irradiation with an actinic ray or radiation:

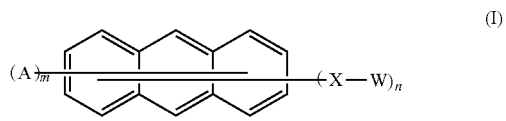

wherein A represents a monovalent substituent,
X represents —COO—,
W represents a lactone ring-containing group or a group represented by any one of formulae (V1) to (V4),
m represents an integer of 0 or more,
n represents an integer of 1 or more, and
when a plurality of A's, X's or W's are present, each A, X or W may be the same as or different from every other A, X or W,
provided that a plurality of compounds represented by formula (I) may be combined through at least any one of a single bond, A and W:

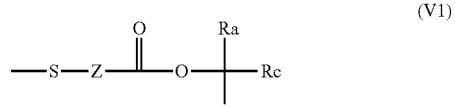

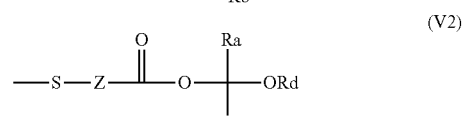

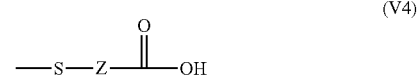

wherein Z represents a single bond or a divalent linking group,
each of Ra, Rb and Rc independently represents a hydrogen atom, an alkyl group, a cycloalkyl group or an alkenyl group,
Rd represents an alkyl group, a cycloalkyl group or an alkenyl group, and
two groups out of Ra, Rb and Rc or two groups out of Ra, Rb and Rd may combine to form a ring structure comprising a carbon atom or may form a ring structure comprising a carbon atom and further containing a heteroatom,
wherein the compound (A) and the resin (B) are not the same compound.

* * * * *